(12) United States Patent
Stark

(10) Patent No.: US 7,517,712 B2
(45) Date of Patent: Apr. 14, 2009

(54) WAFER-LEVEL HERMETIC MICRO-DEVICE PACKAGES

(75) Inventor: David H. Stark, Evergreen, CO (US)

(73) Assignee: Electronics Packaging Solutions, Inc., Evergreen, CO (US)

( * ) Notice: Subject to any disclaimer, the term of this patent is extended or adjusted under 35 U.S.C. 154(b) by 457 days.

(21) Appl. No.: 11/269,140

(22) Filed: Nov. 8, 2005

(65) Prior Publication Data

US 2006/0157274 A1    Jul. 20, 2006

Related U.S. Application Data

(63) Continuation of application No. 10/713,475, filed on Nov. 14, 2003, now Pat. No. 6,962,834, which is a continuation-in-part of application No. 10/133,049, filed on Apr. 26, 2002, now Pat. No. 6,723,379, which is a continuation-in-part of application No. 10/104,315, filed on Mar. 22, 2002, now Pat. No. 6,627,814.

(60) Provisional application No. 60/426,522, filed on Nov. 15, 2002, provisional application No. 60/442,941, filed on Jan. 27, 2003, provisional application No. 60/442,922, filed on Jan. 27, 2003.

(51) Int. Cl.
    *H01L 21/00*    (2006.01)
(52) U.S. Cl. .............................. 438/51; 438/55; 438/64; 257/E21.499
(58) Field of Classification Search .......... 257/E21.499, 257/E21.5, E21.502, E21.505
See application file for complete search history.

(56) References Cited

U.S. PATENT DOCUMENTS

| 49,167 | A | 8/1865 | Stetson |
| 988,308 | A | 4/1911 | Campbell |

(Continued)

OTHER PUBLICATIONS

Kazakob, N.F., Diffusion Bonding Materials, 1981, pp. 4-304, Pergamon Press USA.

(Continued)

*Primary Examiner*—Walter L Lindsay, Jr.
*Assistant Examiner*—Abdulfattah Mustapha
(74) *Attorney, Agent, or Firm*—Howison & Arnott, L.L.P.

(57) ABSTRACT

A method for manufacturing a hermetically sealed micro-device package encapsulating a micro-device. The package includes a transparent window allowing light to pass into and out of a cavity containing the micro-device. A first frame-attachment area is prepared on semiconductor substrate having a micro-device operably disposed thereupon, the first frame-attachment area having a plan that circumscribes the micro-device. A second frame-attachment area is prepared on a sheet of transparent material, the second frame-attachment area having a plan that circumscribes a window aperture portion of the sheet. A frame/spacer is positioned between the semiconductor substrate and the sheet, the frame/spacer including a continuous sidewall having a plan on one side substantially corresponding to, and substantially in register with, the plan of the first frame-attachment area, having a plan on the opposite side substantially corresponding to, and substantially in register with, the plan of the second frame-attachment area, and having a height that exceeds the height of the micro-device. Next the substrate, frame/spacer and window are bonded together to form a hermetically sealed package encapsulating the micro-device in a cavity below the window aperture portion of the transparent sheet.

20 Claims, 25 Drawing Sheets

U.S. PATENT DOCUMENTS

| | | |
|---|---|---|
| 1,004,257 A | 9/1911 | Higbee |
| 1,127,381 A | 2/1915 | Byrnes |
| 1,560,690 A | 11/1925 | Housekeeper |
| 2,011,557 A | 8/1935 | Anderegg |
| 2,119,009 A | 5/1938 | Elias |
| 2,177,001 A | 10/1939 | Owen |
| 2,206,558 A | 7/1940 | Bennet |
| 2,220,690 A | 11/1940 | Stupakoff |
| 2,730,987 A | 1/1956 | Nelson |
| 2,756,467 A | 7/1956 | Etling |
| 3,698,878 A | 10/1972 | Hale et al. |
| 3,778,127 A | 12/1973 | Langston |
| 3,778,244 A | 12/1973 | Nedelec |
| 3,808,115 A | 4/1974 | Manion |
| 3,828,960 A | 8/1974 | Walles |
| 3,865,567 A | 2/1975 | Klomp |
| 3,901,997 A | 8/1975 | Groth |
| 3,922,705 A | 11/1975 | Yerman |
| 3,940,898 A | 3/1976 | Kaufman |
| 3,971,178 A | 7/1976 | Mazzoni |
| 3,979,668 A | 9/1976 | Samulowitz |
| 3,990,201 A | 11/1976 | Falbel |
| 4,016,644 A | 4/1977 | Kurtz |
| 4,035,539 A | 7/1977 | Thibodeau |
| 4,047,351 A | 9/1977 | Derner |
| 4,060,660 A | 11/1977 | Carlson |
| 4,063,271 A | 12/1977 | Bean et al. |
| 4,089,143 A | 5/1978 | LaPietra |
| 4,132,218 A | 1/1979 | Bennett |
| 4,186,725 A | 2/1980 | Schwartz |
| 4,261,086 A | 4/1981 | Giachino et al. |
| 4,274,936 A | 6/1981 | Love |
| 4,303,732 A | 12/1981 | Torobin |
| 4,355,323 A | 10/1982 | Hendrikus |
| 4,357,187 A | 11/1982 | Stanley |
| 4,427,123 A | 1/1984 | Komeda et al. |
| 4,444,821 A | 4/1984 | Young |
| 4,486,482 A | 12/1984 | Kobayashi |
| 4,531,511 A | 7/1985 | Hochberg |
| 4,547,432 A | 10/1985 | Pitts |
| 4,649,085 A | 3/1987 | Landram |
| 4,683,154 A | 7/1987 | Benson |
| 4,687,687 A | 8/1987 | Terneu |
| 4,737,475 A | 4/1988 | Kramer |
| 4,780,164 A | 10/1988 | Ruckheim |
| 4,928,448 A | 5/1990 | Phillip |
| 5,005,557 A | 4/1991 | Bachli |
| 5,009,218 A | 4/1991 | Bachli |
| 5,014,466 A | 5/1991 | Winner |
| 5,017,252 A | 5/1991 | Aldrich |
| 5,032,439 A | 7/1991 | Glicksman |
| 5,085,926 A | 2/1992 | Iida |
| 5,086,729 A | 2/1992 | Katagiri |
| 5,107,649 A | 4/1992 | Benson |
| 5,115,299 A | 5/1992 | Wright |
| 5,115,612 A | 5/1992 | Newton et al. |
| 5,118,924 A | 6/1992 | Mehra et al. |
| 5,124,185 A | 6/1992 | Kerr |
| 5,157,893 A | 10/1992 | Benson et al. |
| 5,175,975 A | 1/1993 | Benson et al. |
| 5,227,206 A | 7/1993 | Bachli |
| 5,270,084 A | 12/1993 | Parker |
| 5,302,414 A | 4/1994 | Alkhimov et al. |
| 5,330,816 A | 7/1994 | Rusek |
| 5,378,527 A | 1/1995 | Nakanishi |
| 5,423,119 A | 6/1995 | Yang |
| 5,433,056 A | 7/1995 | Benson |
| 5,489,321 A | 2/1996 | Benson |
| 5,508,092 A | 4/1996 | Kimock |
| 5,582,866 A | 12/1996 | White |
| 5,610,431 A | 3/1997 | Martin |
| 5,625,222 A | 4/1997 | Yoneda et al. |
| 5,643,644 A | 7/1997 | Demars |
| 5,657,607 A | 8/1997 | Collins et al. |
| 5,719,979 A | 2/1998 | Furuyama |
| 5,778,629 A | 7/1998 | Howes |
| 5,789,857 A | 8/1998 | Ymaura |
| 5,846,638 A | 12/1998 | Meissner |
| 5,855,638 A | 1/1999 | Demars |
| 5,856,914 A | 1/1999 | O'Boyle |
| 5,891,536 A | 4/1999 | Collins |
| 5,897,927 A | 4/1999 | Tsai |
| 5,902,652 A | 5/1999 | Collins et al. |
| 5,920,463 A | 7/1999 | Thomas et al. |
| 5,937,611 A | 8/1999 | Howes |
| 5,945,721 A | 8/1999 | Nobuyoshi |
| 5,949,655 A | 9/1999 | Glenn |
| 5,950,398 A | 9/1999 | Hubbard |
| 5,982,010 A | 11/1999 | Namba et al. |
| 6,007,397 A | 12/1999 | Ju |
| 6,020,628 A | 2/2000 | Mravic et al. |
| 6,052,965 A | 4/2000 | Florentin |
| 6,054,195 A | 4/2000 | Collins |
| 6,071,575 A | 6/2000 | Collins |
| 6,083,578 A | 7/2000 | Collins |
| 6,101,783 A | 8/2000 | Howes |
| 6,114,804 A | 9/2000 | Kawase |
| 6,131,410 A | 10/2000 | Swierkowski |
| 6,139,913 A | 10/2000 | Van Steenkiste et al. |
| 6,141,925 A | 11/2000 | Halvorson, Jr. et al. |
| 6,168,040 B1 | 1/2001 | Sautner et al. |
| 6,191,359 B1 | 2/2001 | Sengupta et al. |
| 6,291,036 B1 | 9/2001 | Wang |
| 6,352,749 B1 | 3/2002 | Aggas |
| 6,365,242 B1 | 4/2002 | Veerasamy |
| 6,372,312 B1 | 4/2002 | Aggas |
| 6,383,580 B1 | 5/2002 | Aggas |
| 6,387,460 B1 | 5/2002 | Shukuri |
| 6,399,169 B1 | 6/2002 | Wang |
| 6,416,375 B1 | 7/2002 | Cho |
| 6,420,002 B1 | 7/2002 | Aggas |
| 6,436,492 B1 | 8/2002 | Landa et al. |
| 6,444,281 B1 | 9/2002 | Wang |
| 6,468,610 B1 | 10/2002 | Morimoto |
| 6,478,911 B1 | 11/2002 | Wang |
| 6,479,112 B1 | 11/2002 | Shukuri |
| 6,497,931 B1 | 12/2002 | Aggas |
| 6,503,583 B2 | 1/2003 | Nalepka et al. |
| 6,506,272 B1 | 1/2003 | Aggas |
| 6,521,988 B2 | 2/2003 | Hauser et al. |
| 6,537,121 B1 | 3/2003 | Baret |
| 6,538,312 B1 | 3/2003 | Peterson et al. |
| 6,541,083 B1 | 4/2003 | Landa et al. |
| 6,541,084 B2 | 4/2003 | Wang |
| 6,548,895 B1 | 4/2003 | Benavides et al. |
| 6,558,494 B1 | 5/2003 | Wang |
| 6,627,814 B1 | 9/2003 | Stark |
| 6,635,321 B2 | 10/2003 | Wang et al. |
| 6,637,644 B2 | 10/2003 | Bachli |
| 6,639,313 B1 | 10/2003 | Martin et al. |
| 6,641,689 B1 | 11/2003 | Aggas |
| 6,653,724 B1 | 11/2003 | Kim et al. |
| 6,656,768 B2 | 12/2003 | Thomas |
| 6,668,500 B1 | 12/2003 | Lamberts |
| 6,692,600 B2 | 2/2004 | Veerasamy |
| 6,696,849 B2 | 2/2004 | Ban et al. |
| 6,701,749 B2 | 3/2004 | Wang et al. |
| 6,723,379 B2 | 4/2004 | Stark |
| 6,736,638 B1 | 5/2004 | Lin et al. |
| 6,738,295 B2 | 5/2004 | Lin et al. |
| 6,759,590 B2 | 7/2004 | Stark |
| 6,763,638 B1 | 7/2004 | Berger, Jr. |
| 6,789,362 B1 | 9/2004 | Hessabi |
| 6,793,990 B1 | 9/2004 | Sakaguchi |

| | | |
|---|---|---|
| 6,860,075 B2 | 3/2005 | Bachli |
| 6,897,125 B2 | 5/2005 | Morrow et al. |
| 6,924,974 B2 | 8/2005 | Stark |
| 6,928,776 B2 | 8/2005 | Hornung |
| 6,946,171 B1 | 9/2005 | Aggas |
| 6,966,208 B1 | 11/2005 | Collins |
| 6,974,518 B2 | 12/2005 | Hornung |
| 7,045,181 B2 | 5/2006 | Yoshizawa |
| 7,081,178 B2 | 7/2006 | Collins |
| 7,103,343 B2 | 9/2006 | France |
| 7,114,306 B2 | 10/2006 | Minaai |
| 7,141,130 B2 | 11/2006 | Minaai |
| 7,238,546 B2 | 7/2007 | Stark |
| 2001/0020738 A1 | 9/2001 | Lizima et al. |
| 2002/0043046 A1 | 4/2002 | Cooper et al. |
| 2002/0113296 A1 | 8/2002 | Cho et al. |
| 2004/0104460 A1 | 6/2004 | Stark |
| 2004/0161530 A1 | 8/2004 | Stark |
| 2004/0187437 A1 | 9/2004 | Stark |
| 2004/0188124 A1 | 9/2004 | Stark |
| 2005/0067179 A1 | 3/2005 | Stark |
| 2005/0217319 A1 | 10/2005 | Yoshizawa |
| 2006/0187608 A1 | 8/2006 | Stark |
| 2006/0191215 A1 | 8/2006 | Stark |
| 2006/0207218 A1 | 9/2006 | Minaai et al. |

OTHER PUBLICATIONS

Dunkerton, TWI Knowledge Summary Diffusion Bonding, 2001, TWI World Centre for Materials Joining Technology, www.twi.co.uk, United Kingdom, 4 pages.

Doron Teomim, Avner Badihi, Gil Zilber; "An innovative approach to wafer-level MEMS packaging"; Solid State Technology (Magazine); Jan. 2002; Penwell (Publ.); Nashua, NH USA.

Carpenter Specialty Alloys: Controlled-Expansion Alloys (Catalog/Brochure); Dec. 1999; pp. 1-24 (esp. 5-8); Carpenter Technology Corporation (Publ.); Wyomissing, PA USA.

JPL Technology Reporting Office; "Hermetic Wafer Bonding By Use of Microwave Heating"; NASA Tech Brief, vol. 25, No. 5 from JPL New Technology Report NPO-20608 (NASA Contract No. NAS-7-918); May 1, 2001; Jet Propulsion Laboratory, California Institute of Technology (Publ.); Pasadena, CA, USA.

George S. Bradley, et al., Materials Handbook, 12th Edition; 1986; pp. 28-29; McGraw-Hill Book Company; New York.

R.C. Dykhuizen et al.; Gas Dynamic Principles of Cold Spray; Journal of Thermal Spray Technology; vol. 7(2); pp. 205-212; Jun. 1998.

Nicholas, M.G. & Lee, R. J.; Joining Dissimilar Materials, Metals and Materials, The Journal of the Institute of Metals, vol. 5, No. 6, Jun. 1989; UK.

Cerjak, H. (ed.); Mathematical Modelling of Weld Phenomena 5; Diffusion Bonding of Glass to Metal in an Electrostatic Field; M. Morsy et al.; pp. 945-959; London IOM Communications, 2001.

Ostyn, K. & Vinckier, A.; Joining of Different Materials Through Interfaces; Interfaces in Materials, Proceedings of the Colloquium; pp. 153-173; Brussels, Dec. 1988.

Arata et al. Pressure and Field Assisted Bonding of Glass to Aluminum; Transactions of JWRI is published by Welding Research Institute of Osaka University; vol. 13; No. 1; 1984; pp. 35-40.

Sadpysky et al.; Precision Welding of Glass to Kovar Without Melting; Svarochnoe Proizvodstvo; Feb. 1973; pp. 22; (In Russian, English translation provided).

Kazakov et al.; Equipment for Diffusion Welding of Rectangular Glass Plates to Kovar; Svarochnoe Proizvodstvo; Jun. 1977; p. 50; (In Russian, English translation provided).

PCT: International Search Report of PCT/US03/07553 (related application); International Publication No. WO 03/083938 A1; Jun. 16, 2003; 2 pgs.

PCT: International Search Report of PCT/US04/02272 (related application); International Publication No. WO 2004/069189; Jan. 27, 2004; 1 pg.

PCT: Written Opinion of the International Searching Authority of PCT/US04/02272 (related application); International Publication No. WO 2004/068189; Mar. 16, 2005; 3 pgs.

PCT: International Search Report of PCT/US05/13237 (related application); International Publication No. WO 2005/118291 A3; Oct. 24, 2006; 1 pg.

PCT: Written Opinion of the International Searching Authority of PCT/US05/13237 (related application); International Publication No. WO 2005/118291; Oct. 24, 2006; 5 pgs.

NTR Inventors Report by Henry W Jackson, John D Mai, Martin B Barmatz, Nasser K Budraa, William T Pike; NASA Case No. 0205 20608; Mar. 1997(?) (Best Available Copy); Including therein: (same authors) "Low Pressure and Low Temperature Hermetic Wafer Bonding Using Microwave Heating"; Jet Propulsion Laboratory, California Institute of Technology; Pasadena, CA, USA (Best Available Copy).

WAFER-LEVEL HERMETIC MICRO-DEVICE PACKAGES

CROSS-REFERENCE TO RELATED APPLICATIONS

This application is a Continuation of U.S. patent application Ser. No. 10/713,475 filed Nov. 14, 2003, now U.S. Pat. No. 6,962,834, which is a Continuation-In-Part of U.S. patent application Ser. No. 10/133,049 filed Apr. 26, 2002, now U.S. Pat. No. 6,723,379, which is a Continuation-In-Part of U.S. patent application Ser. No. 10/104,315 filed Mar. 22, 2002, now U.S. Pat. No. 6,627,814. U.S. Pat. No. 6,962,834 also claims benefit of U.S. Provisional Application 60/426,522, filed Nov. 15, 2002, from U.S. Provisional Application 60/442,922, filed Jan. 27, 2003, and from U.S. Provisional Application 60/442,941, filed Jan. 27, 2003. The following co-pending applications also claim the benefit of U.S. Pat. No. 6,962,834: U.S. patent application Ser. No. 10/766,493 filed Jan. 27, 2004 and U.S. patent application Ser. No. 11/140,593 filed May 27, 2005.

TECHNICAL FIELD OF THE INVENTION

The current invention relates to packages for photonic devices, optical devices, micro-mechanical devices, microelectromechanical systems (MEMS) devices or micro-optoelectromechanical systems (MOEMS) devices, and more particularly, to manufacturing hermetic packages having a transparent window at the wafer level or substrate level of device fabrication.

BACKGROUND OF THE INVENTION

Photonic, photovoltaic, optical and micro-mechanical devices are typically packaged such that the active elements (i.e., the emitters, receivers, micro-mirrors, etc.) are disposed within a sealed chamber to protect them from handling and other environmental hazards. In many cases, it is preferred that the chamber be hermetically sealed to prevent the influx, egress or exchange of gasses between the chamber and the environment. Of course, a window must be provided to allow light or other electromagnetic energy of the desired wavelength to enter and/or leave the package. In some cases, the window will be visibly transparent, e.g. if visible light is involved, but in other cases the window may be visibly opaque while still being "optically" transparent to electromagnetic energy of the desired wavelengths. In many cases, the window is given certain optical properties to enhance the performance of the device. For example, a glass window may be ground and polished to achieve certain curve or flatness specifications in order to disperse in a particular pattern and/or avoid distorting the light passing therethrough. In other cases, anti-reflective or anti-refractive coatings may be applied to the window to improve light transmission therethrough.

Hermetically sealed micro-device packages with windows have heretofore typically been produced using cover assemblies with metal frames and glass window panes. To achieve the required hermetic seal, the glass window pane (or other transparent window material) has heretofore been fused to its metallic frame by one of several methods. A first of these methods is heating it in a furnace at a temperature exceeding the window's glass transition temperature, $T_G$ and/or the window's softening temperature $T_S$ (typically at or above 900° C.). However, because the fusing temperature is above $T_G$ or $T_S$, the original surface finish of the glass pane is typically ruined, making it necessary to finish or re-finish (e.g., grinding and polishing) both surfaces of the window pane after fusing in order to obtain the necessary optical characteristics. This polishing of the window panes requires additional process steps during manufacture of the cover assemblies, which steps tend to be relatively time and labor intensive, thus adding significantly to the cost of the cover assembly, and hence to the cost of the overall package. In addition, the need to polish both sides of the glass after fusing requires the glass to project both above and below the attached frame. This restricts the design options for the cover assembly with respect to glass thickness, dimensions, etc., which can also result in increased material costs.

A second method to hermetically attach a transparent window to a frame is to solder the two items together using a separate preform made of a metal or metal-alloy solder material. The solder preform is placed between a pre-metallized window and a metal or metallized frame, and the soldering is performed in a furnace. During soldering, no significant pressure is applied, i.e., the parts are held together with only enough force to keep them in place. For this type of soldering, the most common solder preform material is eutectic gold-tin.

Eutectic gold-tin solder melts and solidifies at 280° C. Its CTE at 20° is 16 ppm/° C. These two characteristics cause three drawbacks to the reliability of the assembled window. First, the CTE of Mil-Spec Kovar from 280° C. to ambient is approximately 5.15+/−0.2 ppm/° C., while most window glasses intended for sealing to Kovar have higher average CTEs over the same temperature range. During cooling from the set point of 280° down to ambient, the glass is shrinking at a greater rate than the Kovar frame it is attached to. The cooled glass will be in tension, which is why it is prone to cracking. To avoid cracking, the glass should have an identical or slightly lower average CTE than the Kovar so as to be stress neutral or in slight compression after cooling. Using solders with lower liquidus/solidus temperatures puts the Kovar at a higher average CTE, more closely matching the average CTE of the glass. However, this worsens the second drawback of metal-allow solder seals.

The second drawback to soldering the glass to the Kovar frame is that the window assembly will delaminate at temperatures above the liquidus temperature of the employed solder. Using lower liquidus/solidus temperature solders, while reducing the CTE mismatch between the Kovar and glass, further limits the applications for the window assembly. Most lead-free solders have higher liquidus/solidus temperatures than the 183° C. of eutectic Sn/Pb. Surface-Mount Technology (SMT) reflow ovens are profiled to heat Printed-Wiring Board (PWB) assemblies 15-20 degrees above the solder's liquidus/solidus temperature. Thus, the SMT reflow-soldering attachment to a PWB of a MOEMS device whose window was manufactured using lower melting-point solder preforms might have the unfortunate effect of reflowing the window assembly's solder, causing window delamination.

The third drawback is that the solder, which is the intermediate layer between the glass and the Kovar frame, has a CTE up to three times greater than the two materials it is joining. An intermediate joining material would ideally have a compensating CTE in-between the two materials it's bonding.

A third method to hermetically attach a glass window to a frame is to solder the two items together using a solder-glass material. Solder-glasses are special glasses with a particularly low softening point. They are used to join glass to other glasses, ceramics, or metals without thermally damaging the materials to be joined. Soldering is carried out in the viscosity range h where h is the range from $10^4$ to $10^6$ dPa s (poise) for the solder-glass; this corresponds generally to a temperature range T (for the glass solder or solder-glass) within the range from 350° C. to 700° C.

Once a cover assembly with a hermetically sealed window is prepared, it is typically seam welded to the device base (i.e., substrate) in order to produce the finished hermetically sealed package. Seam welding uses a precisely applied AC current to produce localized temperatures of about 1,100° C. at the frame/base junction, thereby welding the metallic cover assembly to the package base and forming a hermetic seal. To prevent distortion of the glass windowpane or package, the metal frame of the cover assembly should be fabricated from metal or metal alloy having a CTE (i.e., coefficient of thermal expansion) that is similar to that of the transparent window material and to the CTE of the package base.

While the methods described above have heretofore produced useable window assemblies for hermetically sealed micro-device packages, the relatively high cost of these window assemblies is a significant obstacle to their widespread application. A need therefore exists, for package and component designs and assembly methods that reduce the labor costs associated with producing each package.

A need still further exists for package and component designs and assembly methods that will minimize the manufacturing cycle time required to produce a completed package.

A need still further exists for package and component designs and assembly methods that reduce the number of process steps required for the production of each package. It will be appreciated that reducing the number of process steps will reduce the overhead/floor space required in the production facility, the amount of capital equipment necessary for manufacturing, and handling costs associated with transferring the work pieces between various steps in the process. A reduction in the cost of labor may also result. Such reductions would, of course, further reduce the cost of producing these hermetic packages.

A need still further exists for package and component designs and assembly methods that will reduce the overall materials costs associated with each package, either by reducing the initial material cost, by reducing the amount of wastage or loss during production, or both.

SUMMARY OF THE INVENTION

The present invention disclosed and claimed herein comprises, in one aspect thereof, a method for manufacturing a hermetically sealed micro-device package encapsulating a micro-device. The package includes a transparent window allowing light to pass into and out of a cavity containing the micro-device. A first frame-attachment area is prepared on semiconductor substrate having a micro-device operably disposed thereupon, the first frame-attachment area having a plan that circumscribes the micro-device. A second frame-attachment area is prepared on a sheet of transparent material, the second frame-attachment area having a plan that circumscribes a window aperture portion of the sheet. Next, a frame/spacer is positioned between the semiconductor substrate and the sheet, the frame/spacer including a continuous sidewall having a plan on one side substantially corresponding to, and substantially in register with, the plan of the first frame-attachment area, having a plan on the opposite side substantially corresponding to, and substantially in register with, the plan of the second frame-attachment area, and having a height that exceeds the height of the micro-device. Next the substrate, frame/spacer and window are bonded together to form a hermetically sealed package encapsulating the micro-device in a cavity below the window aperture portion of the window sheet.

The present invention disclosed and claimed herein comprises, in another aspect thereof, a hermetically sealed micro-device package encapsulating a micro-device. The package includes a transparent window allowing light to pass into and out of a cavity containing the micro-device. The micro-device package comprises a semiconductor substrate, a sheet of transparent material and a frame/spacer. The semiconductor substrate has a micro-device operably disposed thereupon, and also a first frame-attachment area is formed thereupon having a plan that circumscribes the micro-device. The sheet of transparent material has a window aperture portion defined thereupon, and also has a second frame-attachment area formed thereupon having a plan that circumscribes the window aperture portion. The frame/spacer is positioned between, and hermetically bonded to, the semiconductor substrate and the transparent sheet. The frame/spacer includes a continuous sidewall having a plan on one side substantially corresponding to, and substantially in register with, the plan of the first frame-attachment area, a plan on the opposite side substantially corresponding to, and substantially in register with, the plan of the second frame-attachment area, and a height that exceeds the height of the micro-device.

The present invention disclosed and claimed herein comprises, in yet another aspect thereof, a method for manufacturing multiple hermetically sealed micro-device packages simultaneously. Each package will encapsulate a micro-device and include a transparent window aperture allowing light to pass into and out of a cavity containing the micro-device. On a unitary semiconductor substrate having a plurality of micro-devices operably disposed thereupon, a first frame-attachment area is prepared having a plan that circumscribes each of the micro-devices. On a unitary sheet of transparent material, a second frame-attachment area is prepared having a plan that circumscribes a plurality of transparent window aperture portions of the sheet. A frame/spacer including a plurality of sidewalls is positioned between the semiconductor substrate and the transparent sheet. The sidewalls of the frame/spacer collectively have a plan on one side that substantially corresponds to, and is substantially in register with, the plan of the first frame-attachment area, they have a plan on the opposite side that substantially corresponds to, and is substantially in register with, the plan of the second frame-attachment area, and they have a height that exceeds the height of the micro-devices. The semiconductor substrate, frame/spacer and transparent sheet are then bonded together to form a multi-package assembly having a plurality of hermetically sealed cavities separated from one another by the frame/spacer sidewalls. Each of the cavities contains one of the micro-devices positioned below one of the window aperture portions of the sheet. The multi-package assembly is divided into individual packages by parting completely through the substrate, frame/spacer sidewall and transparent sheet at locations between adjacent cavities. Each individual package thereby encapsulates one of the micro-devices in a hermetically sealed cavity and includes a transparent window aperture allowing light to pass into and out of the cavity.

BRIEF DESCRIPTION OF THE DRAWINGS

FIG. 4a showing a sheet having both sides contoured;

FIG. 4b showing a sheet having one side contoured;

FIG. 12a shows the initial transparent sheet;

FIG. 12b shows the transparent sheet after initial metallization;

FIG. 12c shows the transparent sheet after deposition of the integral frame/heat spreader;

FIG. 13a shows a partial cross-section of the sheet of FIG. 12a;

FIG. 13b shows a partial cross-section of the sheet of FIG. 12b;

FIG. 13c shows a partial cross-section of the sheet of FIG. 12c;

FIG. 15a illustrates an exploded view of a the multi-unit assembly;

FIG. 15b is bottom view of the frame of FIG. 15a;

FIG. 17a shows the transparent sheet in its original state;

FIG. 17b illustrates the sheet after deposition of the multi-aperture frame/heat spreader;

FIG. 18a illustrates the configuration of the sheet;

FIG. 18b illustrates the configuration of the frame;

FIG. 18c illustrates the joined sheet and frame;

FIG. 20c illustrates an exploded view of a "sandwiched" window assembly before bonding;

FIG. 20d illustrates the completed assembly of FIG. 20c after bonding;

FIG. 20e illustrates an empty fixture and clamps;

FIG. 20f illustrates the fixture of FIG. 20e with a window assembly positioned therein for bonding;

FIG. 20g illustrates an alternative fixture designed to produce more axial pressure on the window assembly;

FIG. 21a shows a wafer-level hermetic micro-device packages having reverse-side electrical connections;

FIG. 21b shows a wafer-level hermetic micro-device package having same-side electrical connections;

FIG. 25a is a top view of a portion of a double frame member prior to singulation;

FIG. 25b is an end view of the double frame member of FIG. 25a;

FIG. 25c is a top view of a portion of a single frame member from the perimeter of the frame, or after device singulation; and FIG. 25d is an end view of the single frame member of FIG. 25c;

DETAILED DESCRIPTION OF THE INVENTION AND BEST MODE

Figure 1:
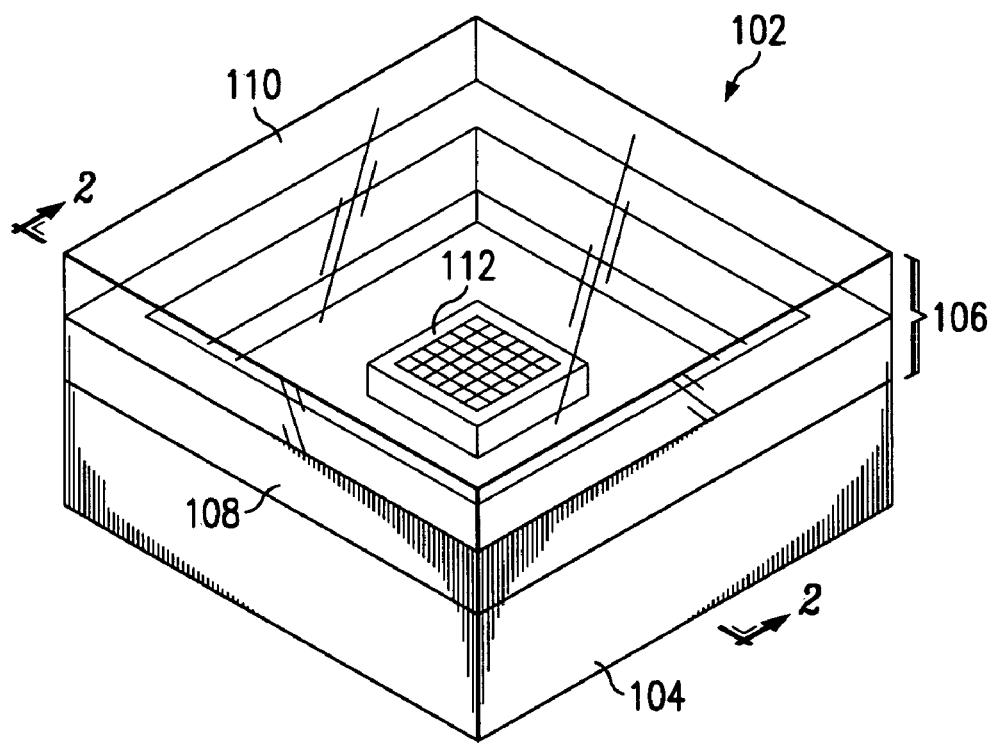
FIG. 1 is a perspective view of a hermetically sealed micro-device package.
Figure 2:
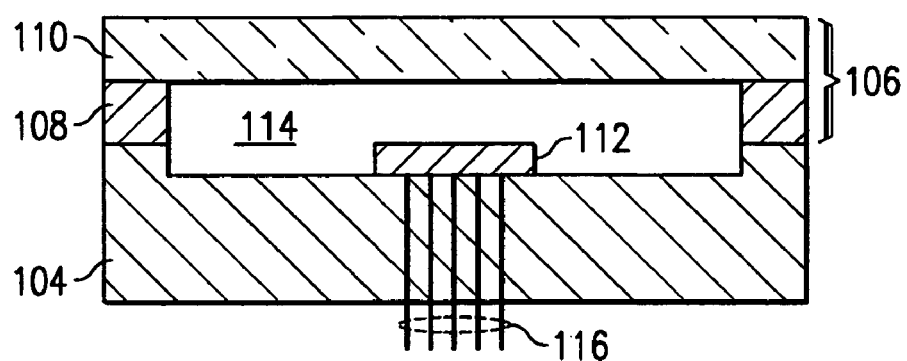
FIG. 2 is a cross-sectional view of the micro-device package of FIG. 1.

Referring now to FIGS. 1 and 2, there is illustrated a typical hermetically sealed micro-device package for housing one or more micro-devices. For purposes of this application, the term "micro-device" includes photonic devices, photovoltaic devices, optical devices (i.e., including reflective, refractive and diffractive type devices), electro-optical and electro-optics devices (EO devices), light emitting devices (LEDs), liquid crystal displays (LCDs), liquid crystal on silicon (LCOS) technologies, which includes direct drive image light amplifiers (D-ILA), opto-mechanical devices, micro-opto-electromechanical systems (i.e., MOEMS) devices and micro-electromechanical systems (i.e., MEMS) devices. The package 102 comprises a base or substrate 104 that is hermetically sealed to a cover assembly 106 comprising a frame 108 and a transparent window 110. A micro-device 112 mounted on the base 104 is encapsulated within a cavity 114 when the cover assembly 106 is joined to the base 104. One or more electrical leads 116 may pass through the base 104 to carry power, ground, and signals to and from the micro-device 112 inside the package 102. It will be appreciated that the electrical leads 116 must also be hermetically sealed to maintain the integrity of the package 102. The window 110 is formed of an optically or electro-magnetically transparent material. For purposes of this application, the term "transparent" refers to materials that allow the transmission of electromagnetic radiation having predetermined wavelengths, including, but not limited to, visible light, infrared light, ultraviolet light, microwaves, radio waves, or x-rays. The frame 108 is formed from a material, typically a metal alloy, which preferably has a CTE close to that of both the window 110 and the package base 104.

Figure 3:
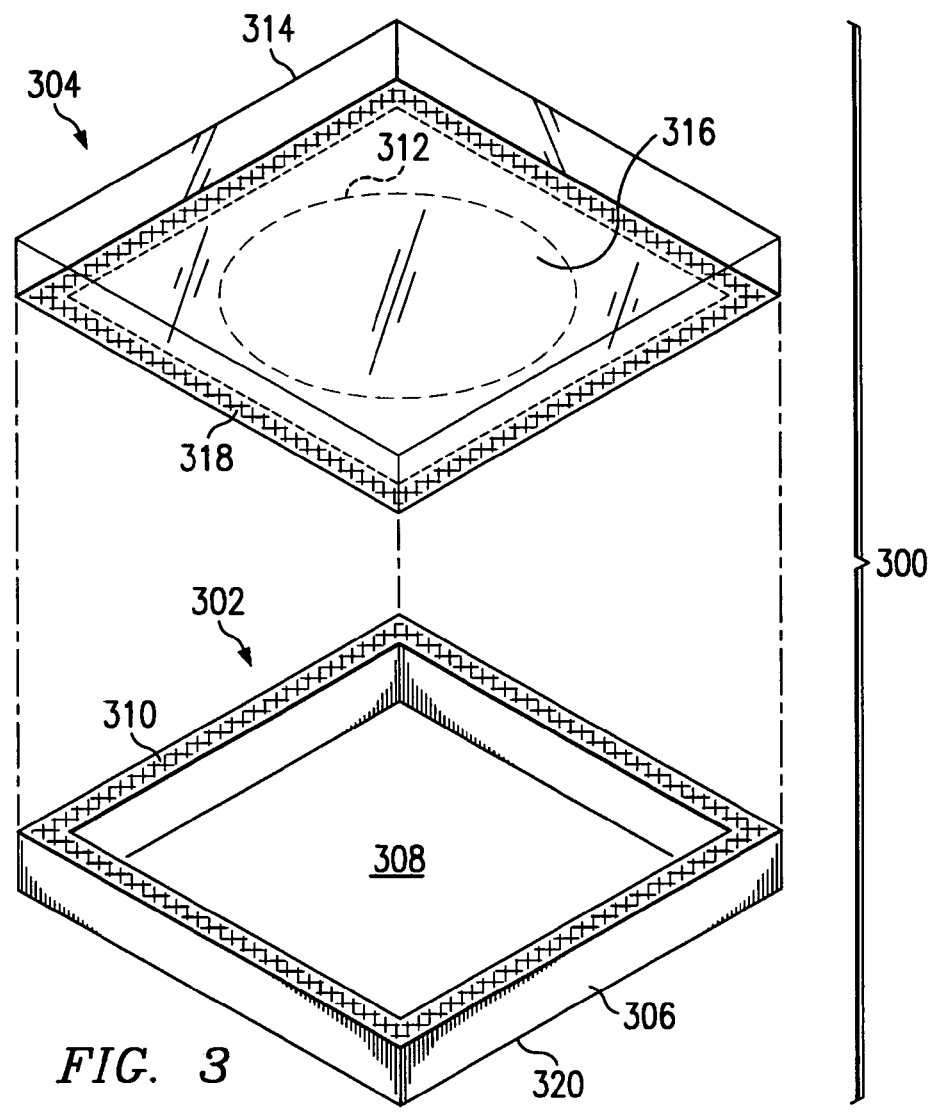
FIG. 3 is an exploded view of a cover assembly manufactured in accordance with one embodiment of the current invention.

Referring now to FIG. 3, there is illustrated an exploded view of a cover assembly manufactured in accordance with one embodiment of the current invention. The cover assembly 300 includes a frame 302 and a sheet 304 of a transparent material. The frame 302 has a continuous sidewall 306 that defines a frame aperture 308 passing therethrough. The frame sidewall 306 includes a frame seal-ring area 310 (denoted by crosshatching) circumscribing the frame aperture 308. Since the frame 302 will eventually be welded to the package base 104 (from FIGS. 1 and 2,) it is usually formed of a weldable metal or alloy, preferably one having a CTE very close to that of the micro-device package base 104. In some embodiments, however, the cover assembly frame 304 may be formed of a non-metallic material such as ceramic or alumina. Regardless of whether the frame 302 is formed of a metallic or non-metallic material, the surface of the frame seal-ring area 310 is preferably metallic (e.g., metal plated if not solid metal) to facilitate the hermetic sealing of the sheet 304 to the frame. In a preferred embodiment, the frame is primarily formed of an alloy having a nominal chemical composition of 54% iron (Fe), 29% nickel (Ni) and 17% cobalt (Co). Such alloys are also known by the designation ASTM F-15 alloy and by the trade name Kovar Alloy. As used in this application, the term "Kovar Alloy" will be understood to mean the alloy having the chemical composition just described. In embodiments where a Kovar Alloy frame 302 is used, it is preferred that the surface of the frame seal-ring area 310 have a surface layer of gold (Au) overlying a layer of nickel (Ni), or a layer of nickel without the overlaying gold. The frame 302 also includes a base seal area 320 that is adapted for eventual joining, typically by welding, to the package base 104. The base seal area 320 frequently includes a layer of nickel overlaid by a layer of gold to facilitate seam welding to the package base. Although the gold over nickel surface layers are only required along the base seal-ring area 320, it will be appreciated that in many cases, for example, where solution bath plating is used to apply the surface materials, the gold over nickel layers may be applied to the entire surface of the frame 302. The sheet 304 can be any type of transparent material, for example, soft glass (e.g., soda-lime glass), hard glass (e.g. borosilicate glass), crystalline materials such as quartz and sapphire, or polymeric materials such as polycarbonate plastic. In addition to optically transparent materials, the sheet 304 may be visibly opaque but transparent to non-visible wavelengths of energy. As previously discussed, it is preferred that the material of the sheet 304 have a CTE that is similar to that of the frame 304 and of the package base 104 to which the cover assembly will eventually be attached. For many semiconductor photonic, photovoltaic, MEMS or MOEMS applications, a borosilicate glass is well suited for the material of the sheet 304. Examples of suitable glasses include Corning 7052, 7050, 7055, 7056, 7058, 7062, Kimble (Owens Corning) EN-1, and Kimble K650 and K704. Other suitable glasses include Abrisa soda-lime glass, Schott 8245 and Ohara Corporation S-LAM60.

The sheet 304 has a window portion 312 defined thereupon, i.e., this is the portion of the sheet 302 which must remain transparent to allow for the proper functioning of the encapsulated, i.e., packaged, micro-device 112. The window portion 312 of the sheet has top and bottom surfaces 314 and 316, respectively, that are optically finished in the preferred embodiment. The sheet 304 is preferably obtained with the top and bottom surfaces 314 and 316 of the window portion 312 in ready to use form, however, if necessary the material may be ground and polished or otherwise shaped to the desired surface contour and finish as a preliminary step of the manufacturing process. While in many cases the window portion 312 will have top and bottom surfaces of 314 and 316 that are optically flat and parallel to one another, it will be appreciated that in other embodiments at least one of the finished surfaces of the window portion will be contoured. A sheet seal-ring area 318 (denoted with cross-hatching) circumscribes the window portion 312 of the sheet 304, and provides a suitable surface for joining to the front seal-ring area 310.

Figure 4A:
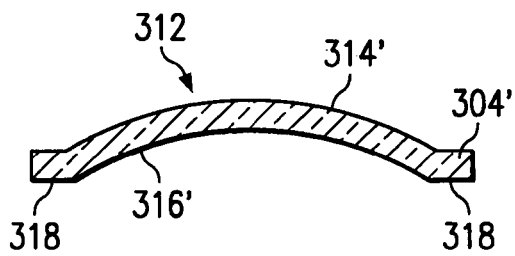
FIGS. 4a and 4b show transparent sheets having contoured sides, specifically.
Figure 4B:
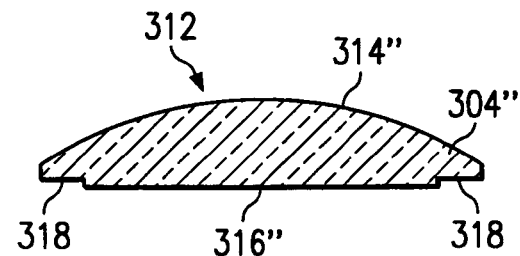

Referring now to FIGS. 4a and 4b, there are illustrated transparent sheets having contoured sides. In FIG. 4a, transparent sheet 304' has both a curved top side 314' and a curved bottom side 316' producing a window portion 312 having a curved contour with a constant thickness. In FIG. 4b, sheet 304" has a top side 314" that is curved and a bottom side 316" that is flat, thereby resulting in a window portion 312 having a plano-convex lens arrangement. It will be appreciated that in similar fashion (not illustrated) the finished surfaces 314 and 316 of the window portion 312 can have the configuration of a refractive lens including a plano-convex lens as previously illustrated, a double convex lens, a plano-concave lens or a double concave lens. Other surface contours may give the finished surfaces of the window portion 312 the configuration of a Fresnel lens or of a diffraction grating, i.e., "a diffractive lens."

In many applications, it is desirable that window portion 312 of the sheet 304 have enhanced optical or physical properties. To achieve these properties, surface treatments or coatings may be applied to the sheet 304 prior to or during the assembly process. For example, the sheet 304 may be treated with siliconoxynitride (SiOn) to provide a harder surface on the window material. Whether or not treated with SiOn, the sheet 304 may be coated with a scratch resistant/abrasion resistant material such as amorphous diamond-like carbon (DLC) such as that sold by Diamonex, Inc., under the name Diamond Shield®. Other coatings which may be applied in addition to, or instead of, the SiOn or diamond-like carbon include, but are not limited to, optical coatings, anti-reflective coatings, refractive coatings, achromatic coatings, optical filters, solar energy filters or reflectors, electromagnetic interference (EMI) and radio frequency (RF) filters of the type known for use on lenses, windows and other optical elements. It will be appreciated that the optical coatings and/or surface treatments can be applied either on the top surface 314 or the bottom surface 316, or in combination on both surfaces, of the window portion 312. It will be further appreciated, that the optical coatings and treatments just described are not illustrated in the figures due to their transparent nature.

In some applications, a visible aperture is formed around the window portion 312 of the sheet 304 by first depositing a layer of non-transparent material, e.g., chromium (Cr), sometimes coating the material over the entire surface of the sheet and then etching the non-transparent material from the desired aperture area. This procedure provides a sharply defined border to the window portion 312 that is desirable in some applications. This operation may be performed prior to or after the application of other treatments depending on the compatibility and processing economics.

The next step of the process of manufacturing the cover assembly 300 is to prepare the sheet seal-ring area 318 for metallization. The sheet seal-ring area 318 circumscribes the window portion 312 of the sheet 304, and for single aperture covers is typically disposed about the perimeter of the bottom surface 316. It will be appreciated, however, that in some embodiments the sheet seal-ring area 318 can be located in the interior portion of a sheet, for example where the sheet will be diced to form multiple cover assemblies (i.e., as described later herein). The sheet seal-ring area 318 generally has a configuration that closely matches the configuration of the frame seal-ring area 310 to which it will eventually be joined. Preparing the sheet seal-ring area 318 may involve a thorough cleaning to remove any greases, oils or other contaminants from the surface, and/or it may involve roughening the seal-ring area by chemical etching, laser ablating, mechanical grinding or sandblasting this area. This roughening increases the surface area of the sheet seal-ring, thereby providing increased adhesion for the subsequently deposited metallization materials, if the sheet seal-ring is to be metallized prior to joining to the frame seal-ring area 310 or to other substrates or device package bases.

Figure 5:
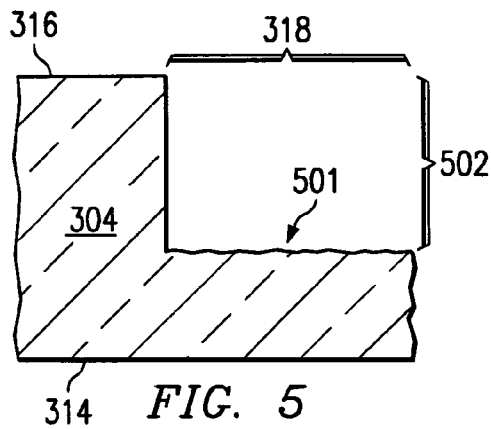
FIG. 5 shows an enlarged view of the sheet seal-ring area prior to metallization.

Referring now to FIG. 5, there is illustrated a portion of the sheet 304 which has been placed bottom side up to better illustrate the preparation of the sheet seal-ring area 318. In this example the seal-ring area 318 has been given a roughened surface 501 to improve adhesion of the metallic layers to be applied. Chemical etching to roughen glass and similar transparent materials is well known. Alternatively, laser ablating, conventional mechanical grinding or sandblasting may be used. A grinding wheel with 325 grit is believed suitable for most glass materials, while a diamond grinding wheel may be used for sapphire and other hardened materials. The depth 502 to which the roughened surface 501 of the sheet seal-ring area 318 penetrates the sheet 304 is dependent on at least two factors: first, the desired mounting height of the bottom surface 316 of the window relative to the package bottom and/or the micro-device 112 mounted inside the package; and second, the required thickness of the frame 306 including all of the deposited metal layers (described below). It is believed that etching or grinding the sheet seal-ring area 318 to a depth of 502 within the range from about 0 inches to about 0.05 inches will provide a satisfactory adhesion for the metallized layers as well as providing an easily detectable "lip" for locating the sheet 304 in the proper position against the frame 306 during subsequent joining operations.

It will be appreciated that it may be necessary or desirable to protect the finished surfaces 314 and/or 316 in the window portion 312 of the sheet (e.g., the portions that will be optically active in the finished cover assembly) from damage during the roughening process. If so, the surfaces 314 and/or 316 may be covered with semiconductor-grade "tacky tape" or other known masking materials prior to roughening. The mask material must, of course, be removed in areas where the etching/grinding will take place. Sandblasting is probably the most economical method of selectively removing strips of tape or masking material in the regions that will be roughened. If sandblasting is used, it could simultaneously perform the tape removal operation and the roughening of the underlying sheet.

Figure 6:
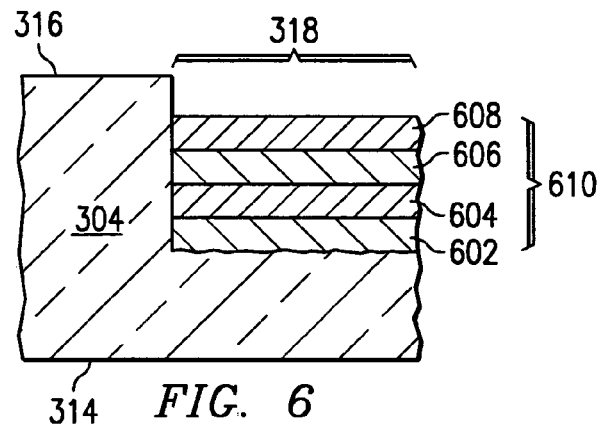
FIG. 6 shows an enlarged view of the sheet seal-ring area after metallization.

Referring now to FIG. 6, there is illustrated a view of the seal-ring area 318 of the sheet 304 after metallization. The next step of the manufacturing process may be to apply one or more metallic layers to the prepared sheet seal-ring area 318. The current invention contemplates several options for accomplishing this metallization. A first option is to apply metal layers to the sheet seal-ring area 318 using conventional chemical vapor deposition (CVD) technology. CVD technology includes atmospheric pressure chemical vapor deposition (APCVD), low pressure chemical vapor deposition (LPCVD), plasma assisted (enhanced) chemical vapor deposition (PACVD, PECVD), photochemical vapor deposition (PCVD), laser chemical vapor deposition (LCVD), metal-organic chemical vapor deposition (MOCVD) and chemical beam epitaxy (CBE). A second option for metallizing the roughened seal-ring area 318 is using physical vapor deposition (PVD) technology. PVD technology includes sputtering, ion plasma assist, thermal evaporation, vacuum evaporation, and molecular beam epitaxy (MBE). A third option for metallizing the roughened sheet seal-ring area 318 is using solution bath plating technology (SBP). Solution bath plating includes electroplating, electroless plating and electrolytic plating technology. While solution bath plating cannot be used for depositing the initial metal layer onto a nonmetallic surface such as glass or plastic, it can be used for depositing subsequent layers of metal or metal alloy to the initial layer. Further, it is envisioned that in many cases, solution bath plating will be the most cost effective metal deposition technique. Since the use of chemical vapor deposition, physical vapor deposition and solution bath plating to deposit metals and metal alloys is well known, these techniques will not be further described herein.

A fourth option for metallizing the sheet seal-ring area 318 of the sheet 304 is so-called cold-gas dynamic spray technology, also known as "cold-spray". This technology involves the spraying of powdered metals, alloys, or mixtures of metal and alloys onto an article using a jet of high velocity gas to form continuous metallic coating at temperatures well below the fusing temperatures of the powdered material. Details of the cold-gas dynamic spray deposition technology are disclosed in U.S. Pat. No. 5,302,414 to Alkhimov et al. It has been determined that aluminum provides good results when applied to glass using the cold-gas dynamic spray deposition. The aluminum layer adheres extremely well to the glass and may create a chemical bond in the form of aluminum silicate. However, other materials may also be applied as a first layer using cold-spray, including tin, zinc, silver and gold. Since the cold-gas dynamic spray technology can be used at low temperatures (e.g., near room temperature), it is suitable for metallizing materials having a relatively low melting point, such as polycarbonates or other plastics, as well as for metallizing conventional materials such as glass, alumina, and ceramics.

For the initial metallic layer deposited on the sheet 304, it is believed that any of chromium, nickel, aluminum, tin, tin-bismuth alloy, gold, gold-tin alloy can be used, this list being given in what is believed to be the order of increasing adhesion to glass. Other materials might also be appropriate. Any of these materials can be applied to the sheet seal-ring area 318 using any of the CVD or PVD technologies (e.g., sputtering) previously described. After the initial layer 602 is deposited onto the sheet seal-ring area 318 of the nonmetallic sheet 304, additional metal layers, e.g., second layer 604, third layer 606 and fourth layer 608 (as applicable) can be added by any of the deposition methods previously described, including solution bath plating. It is believed that the application of the following rules will result in satisfactory thicknesses for the various metal layers. Rule No. 1: the minimum thickness, except for the aluminum or tin-based metals or alloys that will be bonded to the gold-plated Kovar alloy frame: 0.002 microns. Rule 2: the minimum thickness for aluminum or tin-based metals or alloys deposited onto the sheet or as the final layer, which will be bonded to the gold-plated Kovar alloy frame: 0.8 microns. Rule 3: the maximum thickness for aluminum or tin-based metals or alloys deposited onto the sheet or as the final layer, which will be bonded to the gold-plated Kovar alloy frame: 63.5 microns. Rule 4: the maximum thickness for metals, other than chromium, deposited onto the sheet as the first layer and which will have other metals or alloys deposited on top of them: 25 microns. Rule 5: the maximum thickness for metals, other than chromium, deposited onto other metals or alloys as intermediate layers: 6.35 microns. Rule 6: the minimum thickness for metals or alloys deposited onto the sheet or as the final layer, which will act as the solder for attachment to the gold-plated Kovar alloy frame: 7.62 microns. Rule 7: the maximum thickness for metals or alloys deposited onto the sheet or as the final layer, which will act as the solder for attachment to the gold-plated Kovar alloy frame: 101.6 microns. Rule 8: the maximum thickness for chromium: 0.25 microns. Rule 9: the minimum thickness for gold-tin solder, applied via inkjet or supplied as a solder preform: 6 microns. Rule 10: the maximum thickness for gold-tin solder, applied via inkjet or supplied as a solder preform: 101.6 microns. Rule 11: The minimum thickness for immersion zinc; 0.889 microns. Note that the above rules apply to metals deposited using all deposition methods other than cold-gas dynamic spray deposition.

For cold spray applications, the following rules apply: Rule 1: the minimum practical thickness for any metal layer: 2.54 microns. Rule 2: the maximum practical thickness for the first layer, and all additional layers, but not including the final Kovar alloy layer: 127 microns. Rule 3: the maximum practical thickness for the final Kovar alloy layer: 12,700 microns, i.e., 0.5 inches.

By way of example, not to be considered limiting, the following metal combinations are believed suitable for seal-ring area 318 when bonding the prepared sheet 304 to a Kovar alloy-nickel-gold frame 302 (i.e., Kovar alloy core plated first with nickel and then with gold) using thermal compression (TC) bonding, or sonic, ultrasonic or thermosonic bonding.

The assembly sequence can also be to first bond the frame/spacer and window sheet together to form a hermetically sealed window unit, and later, to bond this window unit to the substrate. A third assembly sequence can also be to first bond the frame/spacer and substrate together and later, to bond this substrate/frame/spacer unit to the window. In some instances, an intermediate material, also referred to as an interlayer material, may be employed between the substrate and the frame/spacer and/or between the frame/spacer and the window sheet. It will be understood that, while the examples described herein are believed suitable for metallizing the seal-ring surface of a sheet or lens prior to bonding in applications where metallization is used, in some other embodiments employing diffusion bonding (i.e., thermal compression bonding), metallization of the seal-ring area on the sheet or lens may be omitted altogether when joining the sheet/lens to the frame or another substrate of the device package base.

EXAMPLE 1

| Layers | Metal | Deposition | Min. (microns) | Max. (microns) |
| --- | --- | --- | --- | --- |
| 1 | Al | CVD, PVD | 0.7 | 63.5 |

EXAMPLE 2

| Layers | Metal | Deposition | Min. (microns) | Max. (microns) |
| --- | --- | --- | --- | --- |
| 1 | Al | CVD, PVD | 0.002 | 25 |
| 2 | Cu | CVD, PVD, SBP | 0.002 | 6.35 |
| 3 | Ni | CVD, PVD, SBP | 0.002 | 6.35 |
| 4 | Sn or SnBi | CVD, PVD, SBP | 0.7 | 63.5 |

EXAMPLE 3

| Layers | Metal | Deposition | Min. (microns) | Max. (microns) |
| --- | --- | --- | --- | --- |
| 1 | Al | CVD, PVD | 0.002 | 25 |
| 2 | Zn | CVD, PVD, SBP | 0.002 | 6.35 |
| 3 | Ni | CVD, PVD, SBP | 0.002 | 6.35 |
| 4 | Sn or Sn—Bi | CVD, PVD, SBP | 0.7 | 63.5 |

EXAMPLE 4

| Layers | Metal | Deposition | Min. (microns) | Max. (microns) |
|---|---|---|---|---|
| 1 | Al | CVD, PVD | 0.002 | 25 |
| 2 | Zn | CVD, PVD, SBP | 0.002 | 6.35 |
| 3 | Sn or Sn—Bi | CVD, PVD, SBP | 0.7 | 63.5 |

EXAMPLE 5

| Layers | Metal | Deposition | Min. (microns) | Max. (microns) |
|---|---|---|---|---|
| 1 | Sn (de-stressed) | CVD, PVD | 0.002 | 25 |
| 2 | Cu | CVD, PVD, SBP | 0.002 | 6.35 |
| 3 | Ni | CVD, PVD, SBP | 0.002 | 6.35 |
| 4 | Sn or Sn—Bi | CVD, PVD, SBP | 0.7 | 63.5 |

EXAMPLE 6

| Layers | Metal | Deposition | Min. (microns) | Max. (microns) |
|---|---|---|---|---|
| 1 | Sn—Bi | CVD, PVD | 0.7 | 63.5 |

EXAMPLE 7

| Layers | Metal | Deposition | Min. (microns) | Max. (microns) |
|---|---|---|---|---|
| 1 | Cr | CVD, PVD | 0.002 | 0.15 |
| 2 | Ni | CVD, PVD, SBP | 0.002 | 6.35 |
| 3 | Sn or Sn—Bi | CVD, PVD, SBP | 0.7 | 63.5 |

EXAMPLE 8

| Layers | Metal | Deposition | Min. (microns) | Max. (microns) |
|---|---|---|---|---|
| 1 | Cr | CVD, PVD | 0.002 | 0.15 |
| 2 | Ni | CVD, PVD, SBP | 0.002 | 6.35 |
| 3 | Al | CVD, PVD, SBP | 0.7 | 63.5 |

EXAMPLE 9

| Layers | Metal | Deposition | Min. (microns) | Max. (microns) |
|---|---|---|---|---|
| 1 | Cr | CVD, PVD | 0.002 | 0.15 |
| 2 | Ni | CVD, PVD, SBP | 0.002 | 6.35 |
| 3 | Zn | CVD, PVD, SBP | 0.002 | 6.35 |
| 4 | Al | CVD, PVD, SBP | 0.7 | 63.5 |

EXAMPLE 10

| Layers | Metal | Deposition | Min. (microns) | Max. (microns) |
|---|---|---|---|---|
| 1 | Ni | CVD, PVD | 0.002 | 152.4 |
| 2 | Sn or Sn—Bi | CVD, PVD, SBP | 0.7 | 63.5 |

EXAMPLE 11

| Layers | Metal | Deposition | Min. (microns) | Max. (microns) |
|---|---|---|---|---|
| 1 | Ni | CVD, PVD | 0.002 | 152.4 |
| 2 | Al | CVD, PVD, SBP | 0.7 | 63.5 |

EXAMPLE 12

| Layers | Metal | Deposition | Min. (microns) | Max. (microns) |
|---|---|---|---|---|
| 1 | Ni | CVD, PVD | 0.002 | 152.4 |
| 2 | Zn | CVD, PVD, SBP | 0.002 | 6.35 |
| 3 | Al | CVD, PVD, SBP | 0.7 | 63.5 |

EXAMPLE 13

| Layers | Metal | Deposition | Min. (microns) | Max. (microns) |
|---|---|---|---|---|
| 1 | Sn | CVD, PVD | 0.7 | 63.5 |

EXAMPLE 14

| Layers | Metal | Deposition | Min. (microns) | Max. (microns) |
|---|---|---|---|---|
| 1 | Cr | CVD, PVD | 0.002 | 0.15 |

EXAMPLE 15

| Layers | Metal | Deposition | Min. (microns) | Max. (microns) |
|---|---|---|---|---|
| 1 | Ni | CVD, PVD | 0.002 | 152.4 |

EXAMPLE 16

| Layers | Metal | Deposition | Min. (microns) | Max. (microns) |
|---|---|---|---|---|
| 1 | Sn—Bi | CVD, PVD | 0.7 | 63.5 |

By way of further example, not to be considered limiting, the following metal combinations and thicknesses are preferred for seal-ring area 318 when bonding the prepared sheet 304 to a Kovar alloy-nickel-gold frame 302 using thermal compression (TC) bonding, or sonic, ultrasonic or thermosonic bonding.

EXAMPLE 17

| Layers | Metal | Deposition | Min. (microns) | Max. (microns) |
|---|---|---|---|---|
| 1 | Al | CVD, PVD | 1 | 50.8 |

EXAMPLE 18

| Layers | Metal | Deposition | Min. (microns) | Max. (microns) |
|---|---|---|---|---|
| 1 | Al | CVD, PVD | 0.1 | 2.54 |
| 2 | Cu | CVD, PVD, SBP | 0.25 | 2.54 |
| 3 | Ni | CVD, PVD, SBP | 1 | 5.08 |
| 4 | Sn or SnBi | CVD, PVD, SBP | 1 | 50.8 |

EXAMPLE 19

| Layers | Metal | Deposition | Min. (microns) | Max. (microns) |
|---|---|---|---|---|
| 1 | Al | CVD, PVD | 0.1 | 2.54 |
| 2 | Zn | CVD, PVD, SBP | 0.3175 | 5.08 |
| 3 | Ni | CVD, PVD, SBP | 1 | 5.08 |
| 4 | Sn or Sn—Bi | CVD, PVD, SBP | 1 | 50.8 |

EXAMPLE 20

| Layers | Metal | Deposition | Min. (microns) | Max. (microns) |
|---|---|---|---|---|
| 1 | Al | CVD, PVD | 0.1 | 2.54 |
| 2 | Zn | CVD, PVD, SBP | 0.3175 | 5.08 |
| 3 | Sn or Sn—Bi | CVD, PVD, SBP | 1 | 50.8 |

EXAMPLE 21

| Layers | Metal | Deposition | Min. (microns) | Max. (microns) |
|---|---|---|---|---|
| 1 | Sn (de-stressed) | CVD, PVD | 0.1 | 2.54 |
| 2 | Cu | CVD, PVD, SBP | 0.25 | 2.54 |
| 3 | Ni | CVD, PVD, SBP | 1 | 5.08 |
| 4 | Sn or Sn—Bi | CVD, PVD, SBP | 1 | 50.8 |

EXAMPLE 22

| Layers | Metal | Deposition | Min. (microns) | Max. (microns) |
|---|---|---|---|---|
| 1 | Sn—Bi | CVD, PVD | 1 | 50.8 |

EXAMPLE 23

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Sn or Sn—Bi | CVD, PVD, SBP | 1 | 50.8 |

EXAMPLE 24

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Al | CVD, PVD, SBP | 1 | 50.8 |

EXAMPLE 25

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Zn | CVD, PVD, SBP | 0.3175 | 5.08 |
| 4 | Al | CVD, PVD, SBP | 1 | 50.8 |

EXAMPLE 26

| Layers | Metal | Deposition | Min. (microns) | Max. (microns) |
|---|---|---|---|---|
| 1 | Ni | CVD, PVD | 0.1 | 5.08 |
| 2 | Sn or Sn—Bi | CVD, PVD, SBP | 1 | 50.8 |

EXAMPLE 27

| Layers | Metal | Deposition | Min. (microns) | Max. (microns) |
|---|---|---|---|---|
| 1 | Ni | CVD, PVD | 0.1 | 5.08 |
| 2 | Al | CVD, PVD, SBP | 1 | 50.8 |

EXAMPLE 28

| Layers | Metal | Deposition | Min. (microns) | Max. (microns) |
|---|---|---|---|---|
| 1 | Ni | CVD, PVD | 0.1 | 5.08 |
| 2 | Zn | CVD, PVD, SBP | 0.3175 | 5.08 |
| 3 | Al | CVD, PVD, SBP | 1 | 50.8 |

EXAMPLE 29

| Layers | Metal | Deposition | Min. (microns) | Max. (microns) |
|---|---|---|---|---|
| 1 | Sn | CVD, PVD | 1 | 50.8 |

EXAMPLE 30

| Layers | Metal | Deposition | Min. (microns) | Max. (microns) |
|---|---|---|---|---|
| 1 | Cr | CVD, PVD | 0.05 | 0.12 |

EXAMPLE 31

| Layers | Metal | Deposition | Min. (microns) | Max. (microns) |
|---|---|---|---|---|
| 1 | Ni | CVD, PVD | 0.1 | 50.8 |

EXAMPLE 32

| Layers | Metal | Deposition | Min. (microns) | Max. (microns) |
|---|---|---|---|---|
| 1 | Sn—Bi | CVD, PVD | 1 | 50.8 |

As indicated above, the previous examples are believed suitable for application of, among other processes, thermal compression bonding. TC bonding is a process of diffusion bonding in which two prepared surfaces are brought into intimate contact, and plastic deformation is induced by the combined effect of pressure and temperature, which in turn results in atom movement causing the development of a crystal lattice bridging the gap between facing surfaces and resulting in bonding. TC bonding can take place at significantly lower temperatures than many other forms of bonding such as braze soldering.

Figure 7:
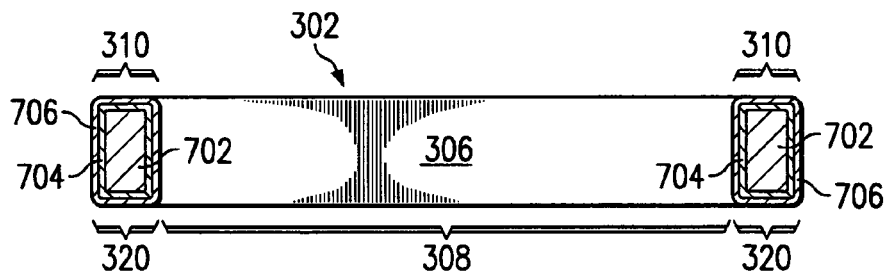
FIG. 7 shows a cross-sectional view through a pre-fabricated frame.

Referring now to FIG. 7, there is illustrated a cross-sectional view of the prefabricated frame 302 suitable for use in this embodiment. The illustrated frame 302 includes a Kovar alloy core 702, or a core of different metal or alloy, overlaid with a first metallic layer 704 of nickel that, in turn, is overlaid by an outer layer 706 of gold. The use of Kovar alloy for the core 702 of the frame 302 may be preferred where hard glass, e.g., Corning 7056 or 7058, is used for the sheet 304 and where Kovar alloy or a similar material is used for the package base 104, since these materials have a CTE for the temperature range 30° C. to 300° C. that is within the range from about $5.0 \cdot 10^{-6}/°$ K to about $5.6 \cdot 10^{-6}/°$ K (e.g. from about 5.0 to about 5.6 ppm/° K).

Referring still to FIG. 7, another step of the manufacturing process is the preparation of a prefabricated frame 302 for joining to the sheet 304. As previously described, the frame 302 includes a continuous sidewall 306 that defines an aperture 308 therethrough. The sidewall 306 includes a frame seal-ring area 310 on its upper surface and a base seal-ring area 320 on its lower surface. The frame seal-ring area 310 is generally dimensioned to conform to the sheet seal-ring area 318 of the transparent sheet 304, while the base seal-ring area 320 is generally dimensioned to conform against the corresponding seal area on the package base. The frame 302 may be manufactured using various conventional metal forming technologies, including stamping, casting, die casting, extrusion/parting, and machining. It is contemplated that stamping or die-casting may be the most cost effective method for producing the frames 302. However, fabricating the frame 302 using photo-chemical machining (PCM), also known as chemical etching, may, in some instances be the most economical method. In some instances, several sheets of photo-chemical machined (i.e., etched) metals and/or alloy might be bonded together to form the frame 302. One of the bonding methods includes TC bonding, also known as diffusion bonding, the PCM'd layers together to create the frame 302. Depending upon the degree of flatness required for the contemplated bonding procedure and the degree achieved by a particular frame manufacturing method, surface grinding, and possibly even lapping or polishing, may be required on the frame seal-ring area 310 or base seal-ring area 320, to provide the final flatness necessary for a successful hermetic seal.

In this example, the base seal-ring area 320 is on the frame face opposite frame seal-ring area 310, and may utilize the same layers of nickel 704 overlaid by gold 706 to facilitate eventual welding to the package base 104. In some instances, the gold 706 will not be overlaid on the nickel 704.

In some embodiments, the frame 302 will serve as a "heat sink" and/or "heat spreader" when the cover assembly 300 is eventually welded to the package base 104. It is contemplated that conventional high temperature welding processes (e.g., manual or automatic electrical resistance seam welding or laser welding) may be used for this operation. If the metallized glass sheet 304 was welded directly to the package base 104 using these welding processes, the concentrated heat could cause thermal stresses likely to crack the glass sheet or distort its optical properties. However, when a metal frame is attached to the transparent sheet, it acts as both a heat sink, absorbing some of the heat of welding, and as a heat spreader, distributing the heat over a wider area such that the thermal stress on the transparent sheet 304 is reduced to minimize the likelihood of cracking or optical distortion. Kovar alloy is especially useful in this heat sink and heat spreading role as explained by Kovar alloy's thermal conductivity, 0.0395, which is approximately fourteen times higher than the thermal conductivity of Corning 7052 glass, 0.0028.

Another important aspect of the frame 302 is that it should be formed from a material having a CTE that is similar to the CTE of the transparent sheet 304 and the CTE of the package base 104. This matching of CTE between the frame 302, transparent sheet 304 and package base 104 is beneficial to minimize stresses between these components after they are joined to one another so as to ensure the long term reliability of the hermetic seal therebetween under conditions of thermal cycling and/or thermal shock environments.

For window assemblies that will be attached to package bases formed of ceramic, alumina or Kovar alloy, Kovar alloy is preferred for use as the material for the frame 304. Although Kovar alloy will be used for the frames in many of the embodiments discussed in detail herein, it will be understood that Kovar alloy is not necessarily suitable for use with all transparent sheet materials. Additionally, other frame materials besides Kovar alloy may be suitable for use with glass. Suitability is determined by the desire that the material of the transparent sheet 304, the material of the frame 302 and the material of the package base 104 all have closely matching CTEs to insure maximum long-term reliability of the hermetic seals.

Figure 8:
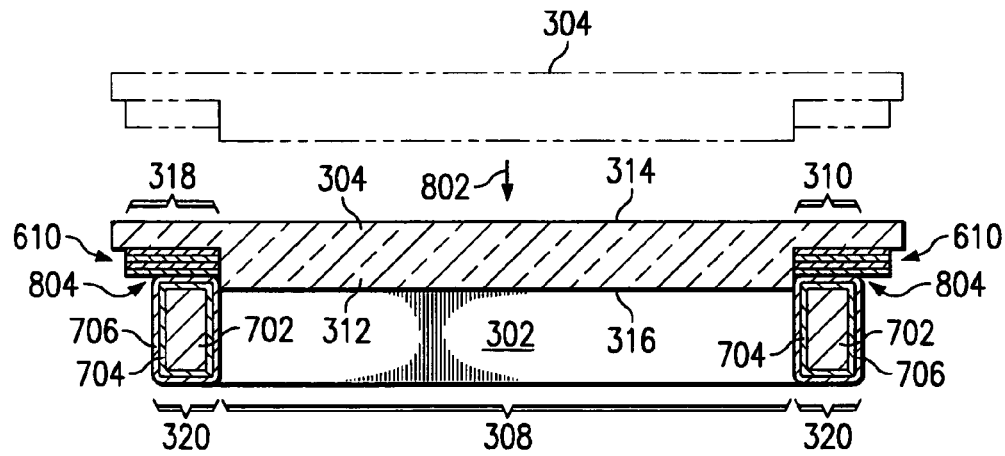
FIG. 8 illustrates placing the frame against the metallized sheet prior to bonding.

Referring now to FIG. 8, the next step of the manufacturing process is to position the frame 302 against the sheet 304 such that at least a portion of the frame seal-ring area 310 and a least a portion of the sheet seal-ring area 318 contact one another along a continuous junction region 804 that circumscribes the window portion 312. Actually, in some cases a plasma-cleaning operation and/or a solvent or detergent cleaning operation is performed on the seal-ring areas and any other sealing surfaces just prior to joining the components to ensure maximum reliability of the joint. In FIG. 8, the sheet 304 moves from its original position (denoted in broken lines) until it is in contact with the frame 302. It is, of course, first necessary to remove any remaining tacky tape or other masking materials left over from operations used to prepare the sheet seal-ring area 318 if they cannot withstand the elevated temperatures encountered in the joining process without degradation of the mask material and/or its adhesive, if an adhesive is used to attach the mask to the sheet. It will be appreciated that it is not necessary that the sheet seal-ring area 318 and the frame seal-ring area 310 have an exact correspondence with regard to their entire areas, rather, it is only necessary that there be some correspondence between the two seal-ring areas forming a continuous junction region 804 which circumscribes the window portion 312. In the embodiment illustrated in FIG. 8, the metallized layers 610 in the sheet seal-ring area 318 are much wider than the plated outer layer 706 of the frame seal-ring area 310. Further, the window portion 312 of the sheet 304 extends partway through the frame aperture 308, providing a means to center the sheet 304 on the frame 302.

The next step of the manufacturing process is to heat the junction region 804 until a joint is formed between the frame 302 and the sheet 304 all along the junction region, whereby a hermetic seal circumscribing the window portion 312 is formed. It is necessary that during the step of heating the junction region 804, the temperature of the window portion 312 of the sheet 304 remain below its glass transition temperature, $T_G$ as well as below the softening temperature of the sheet 304, to prevent damage to the finished surfaces 314 and 316. The softening point for glass is defined as the temperature at which the glass has a viscosity of 107.6 dPa s or 107.6 poise (method of measurement: ISO 7884-3). The current invention contemplates several options for accomplishing this heating. A first option is to utilize thermal compression (TC) bonding, also known as diffusion bonding, including conventional hot press bonding as well as Hot Isostatic Press or Hot Isostatic Processing (HIP) diffusion bonding. As previously described, TC bonding, also known as diffusion bonding involves the application of high pressures to the materials being joined such that a reduced temperature is required to produce the necessary diffusion bond. Rules for determining the thickness and composition of the metallic layers 610 on the sheet 304 were previously provided, for TC bonding to, e.g., a Kovar alloy, nickel or gold frame such as illustrated in FIG. 7. The estimated process parameters for the TC bonding of a Kovar alloy/nickel/gold frame 302 to a metallized sheet 304 having aluminum as the final layer would be a temperature of approximately 380° C. at an applied pressure of approximately 95,500 psi (6713.65 kg/cm$^2$). Under these conditions, the gold plating 706 on the Kovar alloy frame 302 will diffuse into/with the aluminum layer, e.g., layer 4 in Example 7. Since the 380° C. temperature necessary for TC bonding is below the approximately 500° C. to 900° C. $T_G$ for hard glasses such as Corning 7056, the TC bonding process could be performed in a single or batch mode by fixturing the cover assembly components 302, 304 together in compression and placing the compressed assemblies into a furnace (or oven, etc.) at approximately 380° C. The hermetic bond would be obtained without risking the finished surfaces 314 and 316 of the window portion 312. Vacuum, sometimes with some small amounts of specific gasses included, or other atmospheres with negative or positive pressures might be needed inside the furnace to promote the TC bonding process.

Alternatively, employing resistance welding at the junction area 804 to add additional heat in addition to the TC bonding could allow preheating the window assemblies to less than 380° C. and possibly reduce the overall bonding process time. In another method, the TC bonding could be accomplished by fixturing the cover assembly components 302 and 304 using heated tooling that would heat the junction area 304 by conduction. In yet another alternative method, electrical resistance welding can be used to supply 100% of the heat required to achieve the necessary TC bonding temperature, thereby eliminating the need for furnaces, ovens, etc. or specialized thermally conductive tooling.

After completion of TC bonding or other welding processes, the window assembly 300 is ready for final processing, for example, chamfering the edges of the cover assembly to smooth them and prevent chipping, scratching, marking, etc., during post-assembly, cleaning, marking or other operations. In some instances, the final processing may include the application of a variety of coatings to the window and/or to the frame.

Figure 9:
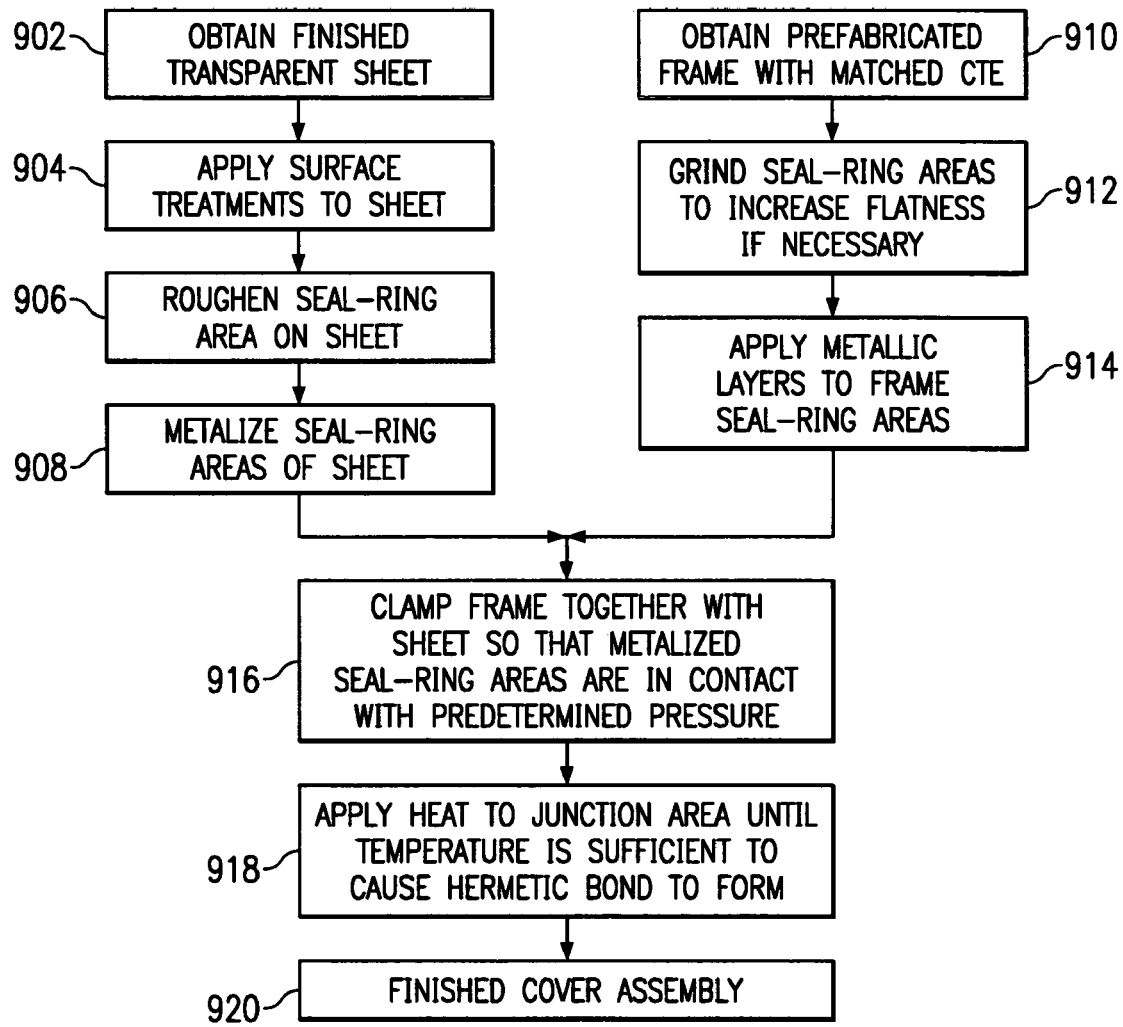
FIG. 9 is a block diagram of a process for manufacturing cover assemblies using prefabricated frames in accordance with one embodiment.

Referring now to FIG. 9, there is illustrated a block diagram of the manufacturing process just described in accordance with one embodiment of the current invention. Block 902 represents the step of obtaining a sheet of transparent material, e.g., glass or other material, having finished top and bottom surfaces as previously described. The process then proceeds to block 904 as indicated by the arrow.

Block 904 represents the step of applying surface treatments to the sheet, e.g., scratch-resistant or anti-reflective coatings, as previously described. In addition to these permanent surface treatments, block 904 also represents the sub-steps of applying tape or other temporary masks to the surfaces of the sheet to protect them during the subsequent steps of the process. It will be appreciated that the steps represented by block 904 are optional and that one or more of these steps may not be present in every embodiment of the invention. The process then proceeds to block 906 as indicated by the arrow.

Block 906 represents the step of preparing the seal-ring area on the sheet to provide better adhesion for the metallic layers, if such metallic layers are used. This step usually involves roughening the seal-ring area using chemical etching, mechanical grinding, laser ablating or sandblasting as previously described. To the extent necessary, block 906 also represents the sub-steps of removing any masking material from the seal-ring area. Block 906 further represents the optional steps of cleaning the sheet (or at least the seal-ring area of the sheet) to remove any greases, oils or other contaminants from the surface of the sheet. As previously discussed, such cleaning steps may be performed regardless of whether the seal-ring area is to be metallized (i.e., to promote better adhesion of the metallic layers) or is to be left unmetallized (i.e., to promote better diffusion bonding of the unmetallized sheet). It will be appreciated that the steps represented by block 906 are optional and that some or all of these steps may not be present in every embodiment of the invention. The process then proceeds to block 908 as indicated by the arrow.

Block 908 represents the step of metallizing the seal-ring areas of the sheet. The step represented by block 908 is mandatory only when the desired bond of sheet 304 to frame 302 is a metal-to-metal bond since at least one metallic layer must be applied to the seal-ring area of the sheet. It is possible, for instance by use of diffusion bonding processes, to bond the sheet 304 to frame 302 without first metallizing sheet 304. In most embodiments, block 908 will represent numerous sub-steps for applying successive metallic layers to the sheet, where the layers of each sub-step may be applied by processes including CVD, PVD, cold-spray or solution bath plating as previously described. Following the steps represented by block 908, the sheet is ready for joining to the frame. However, before the process can proceed to this joining step (i.e., block 916), a suitable frame must first be prepared.

Block 910 represents the step of obtaining a pre-fabricated frame, preferably having a CTE that closely matches the CTE of the transparent sheet from block 902 and the CTE of the package base. In most cases where the base is alumina or Kovar alloy, a frame formed of Kovar alloy will be suitable. As previously described, the frame may be formed using, e.g., stamping, die-casting or other known metal-forming processes. The process then proceeds to block 912 as indicated by the arrow.

Block 912 represents the step of grinding, polishing and/or otherwise flattening the seal-ring areas of the frame as necessary to increase its flatness so that it will fit closely against the seal-ring areas of the transparent sheet. It will be appreciated that the steps represented by block 912 are optional and may not be necessary or present in every embodiment of the invention. The process then proceeds to block 914 as indicated by the arrow.

Block 914 represents the step of applying additional metallic layers to the seal-ring areas of the frame. These metallic layers are sometimes necessary to achieve compatible chemistry for bonding with the metallized seal-ring areas of the transparent sheet. In most embodiments, block 914 will represent numerous sub-steps for applying successive metallic layers to the frame. Block 914 further represents the optional steps of cleaning the frame (or at least the seal-ring area of the frame) to remove any greases, oils or other contaminants from the surface of the frame. As previously discussed, such cleaning steps may be performed regardless of whether the seal-ring area of the frame is to be metallized with additional metal layers or is to be used without additional metallization. Once the steps represented by block 914 are completed, the frame is ready for joining to the transparent sheet. Thus, the results of process block 908 and block 914 both proceed to block 916 as indicated by the arrows.

Block 916 represents the step of clamping the prepared frame together with the prepared transparent sheet so that their respective metallized seal-ring areas are in contact with one another under conditions producing a predetermined contact pressure at the junction region circumscribing the window portion. This predetermined contact pressure between the seal-ring surfaces allows thermal compression (TC) bonding of the metallized surfaces to occur at a lower temperature than would be required for conventional welding (including most soldering and brazing processes). The process then proceeds to block 918 as indicated by the arrow.

Block 918 represents the step of applying heat to the junction between the frame and the transparent sheet while maintaining the predetermined contact pressure until the temperature is sufficient to cause thermal compression bonding to occur. In some embodiments, block 918 will represent a single heating step, e.g., heating the fixtured assembly in a furnace. In other embodiments, block 918 will represent several sub-steps for applying heat to the junction area, for example, first preheating the fixtured assembly (e.g., in a furnace) to an intermediate temperature, and then using resistance welding techniques along the junction to raise the temperature of the localized area of the metallic layers the rest of the way to the temperature where thermal compression bonding will occur. The thermal compression bonding creates a hermetic seal between the transparent sheet material and the frame. The process then proceeds to block 920 as indicated by the arrow.

In the illustrated example, metallized seal-ring areas are joined using diffusion bonding/thermal compression bonding in which the predetermined pressure is applied first (block 916) and the heat is applied second (block 918). It will be appreciated, however, that the use of diffusion bonding is not limited to these specific conditions. In some other embodiments, the sheet and/or frame may not be metallized prior to bonding. In still other embodiments, the heat may be applied first until the desired bonding temperature is reached, and the predetermined pressure may be applied thereafter until the diffusion bond is formed. In yet additional embodiments, the heat and pressure may be applied simultaneously until the diffusion bond is formed.

Block 920 represents the step of completing the window assembly. Block 920 may represent merely cooling the window assembly after thermal compression bonding, or it may represent additional finishing processes including chamfering the edges of the assembly to prevent chipping, cracking, etc., marking the assembly, coating the window and/or the frame with one or more materials, or other post-assembly procedures. The process of this embodiment has thus been described.

It will be appreciated that in alternative embodiments of the invention, conventional welding techniques (including soldering and/or brazing) may be used instead of thermal compression bonding to join the frame to the transparent sheet. In such alternative embodiments, the steps represented by blocks 916 and 918 of FIG. 9 would be replaced by the steps of fixturing the frame and transparent sheet together so that the metallized seal-ring areas are in contact with one another (but not necessarily producing a predetermined contact pressure along the junction) and then applying heat to the junction area using conventional means until the temperature is sufficient to cause the melting and diffusing of the metallic layers necessary to achieve the welded bond.

In an alternative embodiment, braze-soldering is used to join the frame 302 to the metallized sheet 304. In this embodiment, a solder metal or solder alloy may be utilized as the final layer of the metallic layers 610 on the metallized sheet 304, and clamping the sheet 304 to the frame 302 at a high predetermined contact pressure is not required. A solder metal or solder alloy preform may be utilized as a separate, intermediate item between the frame 302 and the sheet 304 instead of having a solder metal or solder alloy as the final layer of the metallic layers 610 on the metallized sheet 304. Light to moderate clamping pressure can be used: 1) to insure alignment during the solder's molten phase; and 2) to promote even distribution of the molten solder all along the junction region between the respective seal-ring areas; thereby helping to insure a hermetic seal, however, this clamping pressure does not contribute to the bonding process itself as in TC bonding. In most other respects, however, this embodiment is substantially similar to that previously described.

The following examples, not to be considered limiting, are provided to illustrate the details of the metallic layers 610 in the sheet seal-ring area 318 that are suitable for braze-soldering to a Kovar alloy/nickel/gold frame 302 such as that illustrated in FIG. 7.

EXAMPLE 33

| Layers | Metal | Deposition | Min. (microns) | Max. (microns) |
|---|---|---|---|---|
| 1 | Al | CVD, PVD | 0.002 | 25 |
| 2 | Cu | CVD, PVD, SBP | 0.002 | 6.35 |
| 3 | Ni | CVD, PVD, SBP | 0.002 | 6.35 |
| 4 | Eutectic Au—Sn solder | CVD, PVD, SBP | 1.27 | 127 |

EXAMPLE 34

| Layers | Metal | Deposition | Min. (microns) | Max. (microns) |
|---|---|---|---|---|
| 1 | Al | CVD, PVD | 0.002 | 25 |
| 2 | Cu | CVD, PVD, SBP | 0.002 | 6.35 |
| 3 | Ni | CVD, PVD, SBP | 0.002 | 6.35 |
| 4 | Sn—Bi solder | CVD, PVD, SBP | 1.27 | 152.4 |

EXAMPLE 35

| Layers | Metal | Deposition | Min. (microns) | Max. (microns) |
|---|---|---|---|---|
| 1 | Al | CVD, PVD | 0.002 | 25 |
| 2 | Zn | CVD, PVD, SBP | 0.002 | 6.35 |
| 3 | Ni | CVD, PVD, SBP | 0.002 | 6.35 |
| 4 | Eutectic Au—Sn solder | CVD, PVD, SBP | 1.27 | 127 |

EXAMPLE 36

| Layers | Metal | Deposition | Min. (microns) | Max. (microns) |
|---|---|---|---|---|
| 1 | Al | CVD, PVD | 0.002 | 25 |
| 2 | Zn | CVD, PVD, SBP | 0.002 | 6.35 |
| 3 | Ni | CVD, PVD, SBP | 0.002 | 6.35 |
| 4 | Sn—Bi solder | CVD, PVD, SBP | 1.27 | 152.4 |

EXAMPLE 37

| Layers | Metal | Deposition | Min. (microns) | Max. (microns) |
|---|---|---|---|---|
| 1 | Cr | CVD, PVD | 0.002 | 0.15 |
| 2 | Zn | CVD, PVD, SBP | 0.002 | 6.35 |
| 3 | Ni | CVD, PVD, SBP | 0.002 | 6.35 |
| 4 | Eutectic Au—Sn solder | CVD, PVD, SBP | 1.27 | 127 |

EXAMPLE 38

| Layers | Metal | Deposition | Min. (microns) | Max. (microns) |
|---|---|---|---|---|
| 1 | Cr | CVD, PVD | 0.002 | 0.15 |
| 2 | Ni | CVD, PVD, SBP | 0.002 | 6.35 |
| 3 | Eutectic Au—Sn solder | CVD, PVD, SBP | 1.27 | 127 |

EXAMPLE 39

| Layers | Metal | Deposition | Min. (microns) | Max. (microns) |
|---|---|---|---|---|
| 1 | Cr | CVD, PVD | 0.002 | 0.15 |
| 2 | Zn | CVD, PVD, SBP | 0.002 | 6.35 |
| 3 | Ni | CVD, PVD, SBP | 0.002 | 6.35 |
| 4 | Sn—Bi solder | CVD, PVD, SBP | 1.27 | 152.4 |

EXAMPLE 40

| Layers | Metal | Deposition | Min. (microns) | Max. (microns) |
|---|---|---|---|---|
| 1 | Cr | CVD, PVD | 0.002 | 0.15 |
| 2 | Ni | CVD, PVD, SBP | 0.002 | 6.35 |
| 3 | Sn—Bi solder | CVD, PVD, SBP | 1.27 | 152.4 |

EXAMPLE 41

| Layers | Metal | Deposition | Min. (microns) | Max. (microns) |
|---|---|---|---|---|
| 1 | Cr | CVD, PVD | 0.002 | 0.15 |
| 2 | Sn—Bi solder | CVD, PVD, SBP | 1.27 | 152.4 |

EXAMPLE 42

| Layers | Metal | Deposition | Min. (microns) | Max. (microns) |
|---|---|---|---|---|
| 1 | De-stressed Sn Solder | CVD, PVD | 1.27 | 152.4 |

EXAMPLE 43

| Layers | Metal | Deposition | Min. (microns) | Max. (microns) |
|---|---|---|---|---|
| 1 | Sn—Bi Solder | CVD, PVD | 1.27 | 152.4 |

EXAMPLE 44

| Layers | Metal | Deposition | Min. (microns) | Max. (microns) |
|---|---|---|---|---|
| 1 | Eutectic Au—Sn Solder | CVD, PVD | 1.27 | 127 |

EXAMPLE 45

| Layers | Metal | Deposition | Min. (microns) | Max. (microns) |
|---|---|---|---|---|
| 1 | Ni | CVD, PVD | 0.002 | 152.4 |
| 2 | Eutectic Au—Sn Solder | CVD, PVD, SBP | 1.27 | 127 |

EXAMPLE 46

| Layers | Metal | Deposition | Min. (microns) | Max. (microns) |
|---|---|---|---|---|
| 1 | Ni | CVD, PVD | 0.002 | 152.4 |
| 2 | Sn—Bi Solder | CVD, PVD, SBP | 1.27 | 152.4 |

While numerous examples herein show the use of eutectic Au—Sn, other applications may utilize non-eutectic Au—Sn, or other eutectic or non-eutectic solders for attaching the window. This allows subsequent use of a higher melting temperature solder to attach the unit to a higher level assembly without melting the window bond.

By way of further examples, not to be considered limiting, the following combinations are preferred for the metallic layers 610 in the sheet seal-ring area 318 for braze-soldering to a Kovar alloy/nickel/gold frame 302 such as that illustrated in FIG. 7.

EXAMPLE 47

| Layers | Metal | Deposition | Min. (microns) | Max. (microns) |
|---|---|---|---|---|
| 1 | Al | CVD, PVD | 0.1 | 2.54 |
| 2 | Cu | CVD, PVD, SBP | 0.25 | 2.54 |
| 3 | Ni | CVD, PVD, SBP | 1 | 5.08 |
| 4 | Eutectic Au—Sn solder | CVD, PVD, SBP | 2.54 | 63.5 |

EXAMPLE 47a

| Layers | Metal | Deposition | Min. (microns) | Max. (microns) |
|---|---|---|---|---|
| 1 | Al | CVD, PVD | 0.1 | 2.54 |
| 2 | Cu | CVD, PVD, SBP | 0.25 | 2.54 |
| 3 | Ni | CVD, PVD, SBP | 1 | 5.08 |
| 4 | Sn—Cu—Ag Solder | CVD, PVD, SBP | 2.54 | 63.5 |

EXAMPLE 48

| Layers | Metal | Deposition | Min. (microns) | Max. (microns) |
|---|---|---|---|---|
| 1 | Al | CVD, PVD | 0.1 | 2.54 |
| 2 | Cu | CVD, PVD, SBP | 0.25 | 2.54 |
| 3 | Ni | CVD, PVD, SBP | 1 | 5.08 |
| 4 | Sn—Bi solder | CVD, PVD, SBP | 2.54 | 127 |

EXAMPLE 49

| Layers | Metal | Deposition | Min. (microns) | Max. (microns) |
|---|---|---|---|---|
| 1 | Al | CVD, PVD | 0.1 | 2.54 |
| 2 | Zn | CVD, PVD, SBP | 0.3175 | 5.08 |
| 3 | Ni | CVD, PVD, SBP | 1 | 5.08 |
| 4 | Eutectic Au—Sn solder | CVD, PVD, SBP | 2.54 | 63.5 |

EXAMPLE 49a

| Layers | Metal | Deposition | Min. (microns) | Max. (microns) |
|---|---|---|---|---|
| 1 | Al | CVD, PVD | 0.1 | 2.54 |
| 2 | Zn | CVD, PVD, SBP | 0.3175 | 5.08 |
| 3 | Ni | CVD, PVD, SBP | 1 | 5.08 |
| 4 | Sn—Cu—Ag Solder | CVD, PVD, SBP | 2.54 | 63.5 |

EXAMPLE 50

| Layers | Metal | Deposition | Min. (microns) | Max. (microns) |
|---|---|---|---|---|
| 1 | Al | CVD, PVD | 0.1 | 2.54 |
| 2 | Zn | CVD, PVD, SBP | 0.3175 | 5.08 |
| 3 | Ni | CVD, PVD, SBP | 1 | 5.08 |
| 4 | Sn—Bi solder | CVD, PVD, SBP | 2.54 | 127 |

EXAMPLE 51

| Layers | Metal | Deposition | Min. (microns) | Max. (microns) |
|---|---|---|---|---|
| 1 | Cr | CVD, PVD | 0.05 | 0.12 |
| 2 | Zn | CVD, PVD, SBP | 0.3175 | 5.08 |
| 3 | Ni | CVD, PVD, SBP | 1 | 5.08 |
| 4 | Eutectic Au—Sn solder | CVD, PVD, SBP | 2.54 | 63.5 |

EXAMPLE 51a

| Layers | Metal | Deposition | Min. (microns) | Max. (microns) |
|---|---|---|---|---|
| 1 | Cr | CVD, PVD | 0.05 | 0.12 |
| 2 | Zn | CVD, PVD, SBP | 0.3175 | 5.08 |
| 3 | Ni | CVD, PVD, SBP | 1 | 5.08 |
| 4 | Sn—Cu—Ag Solder | CVD, PVD, SBP | 2.54 | 63.5 |

EXAMPLE 52

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Eutectic Au—Sn solder | CVD, PVD, SBP | 2.54 | 63.5 |

EXAMPLE 52a

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Sn—Cu—Ag Solder | CVD, PVD, SBP | 2.54 | 63.5 |

EXAMPLE 53

| Layers | Metal | Deposition | Min. (microns) | Max. (microns) |
|---|---|---|---|---|
| 1 | Cr | CVD, PVD | 0.05 | 0.12 |
| 2 | Zn | CVD, PVD, SBP | 0.3175 | 5.08 |
| 3 | Ni | CVD, PVD, SBP | 1 | 5.08 |
| 4 | Sn—Bi solder | CVD, PVD, SBP | 2.54 | 127 |

EXAMPLE 54

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Sn—Bi solder | CVD, PVD, SBP | 2.54 | 127 |

EXAMPLE 55

| Layers | Metal | Deposition | Min. (microns) | Max. (microns) |
|---|---|---|---|---|
| 1 | Cr | CVD, PVD | 0.05 | 0.12 |
| 2 | Sn—Bi solder | CVD, PVD, SBP | 2.54 | 127 |

EXAMPLE 56

| Layers | Metal | Deposition | Min. (microns) | Max. (microns) |
|---|---|---|---|---|
| 1 | De-stressed Sn Solder | CVD, PVD | 2.54 | 127 |

EXAMPLE 57

| Layers | Metal | Deposition | Min. (microns) | Max. (microns) |
|---|---|---|---|---|
| 1 | Sn—Bi Solder | CVD, PVD | 2.54 | 127 |

EXAMPLE 58

| Layers | Metal | Deposition | Min. (microns) | Max. (microns) |
|---|---|---|---|---|
| 1 | Eutectic Au—Sn Solder | CVD, PVD | 2.54 | 63.5 |

EXAMPLE 58a

| Layers | Metal | Deposition | Min. (microns) | Max. (microns) |
|---|---|---|---|---|
| 1 | Sn—Cu—Ag Solder | CVD, PVD | 2.54 | 63.5 |

EXAMPLE 59

| Layers | Metal | Deposition | Min. (microns) | Max. (microns) |
|---|---|---|---|---|
| 1 | Ni | CVD, PVD | 0.1 | 5.08 |
| 2 | Eutectic Au—Sn Solder | CVD, PVD, SBP | 2.54 | 63.5 |

EXAMPLE 59a

| Layers | Metal | Deposition | Min. (microns) | Max. (microns) |
|---|---|---|---|---|
| 1 | Ni | CVD, PVD | 0.1 | 5.08 |
| 2 | Sn—Cu—Ag Solder | CVD, PVD, SBP | 2.54 | 63.5 |

EXAMPLE 60

| Layers | Metal | Deposition | Min. (microns) | Max. (microns) |
|---|---|---|---|---|
| 1 | Ni | CVD, PVD | 0.1 | 5.08 |
| 2 | Sn—Bi Solder | CVD, PVD, SBP | 2.54 | 127 |

Figure 10:
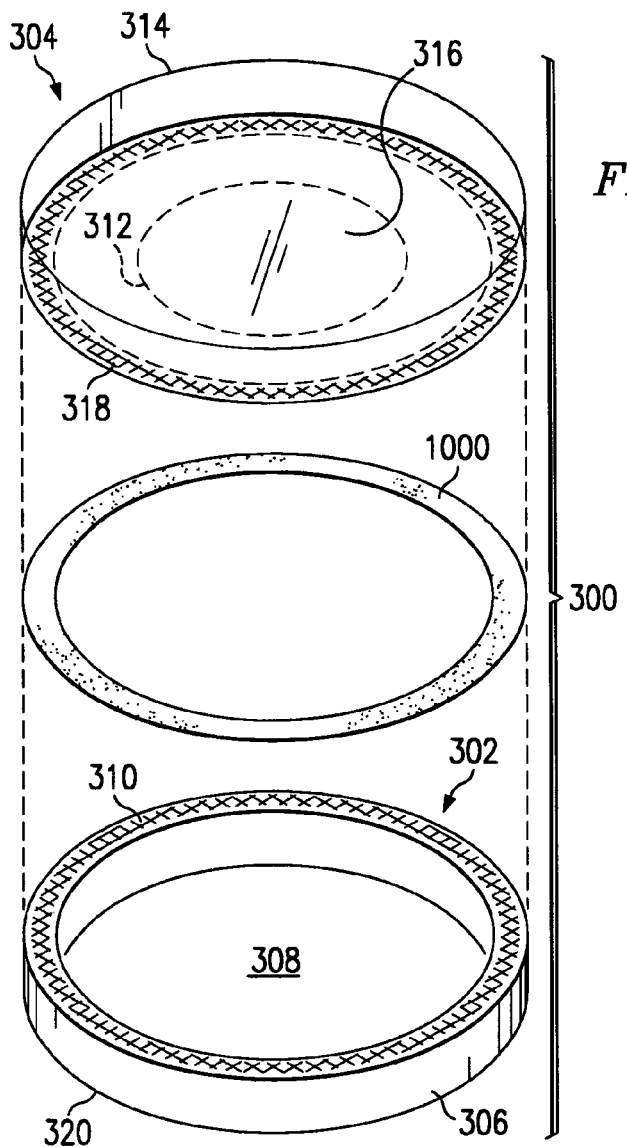
FIG. 10 is an exploded view of a cover assembly manufactured using a solder preform.

Referring now to FIG. 10, there is illustrated yet another embodiment of the current invention. Note that in this embodiment, the cover assembly 300 is circular in configuration rather than rectangular. It will be appreciated that this is simply another possible configuration for a cover assembly manufactured in accordance with this invention, and that this embodiment is not limited to configurations of any particular shape. As in the embodiment previously described, this embodiment also uses braze-soldering to hermetically join the transparent sheet 304 to the frame 302. However, in this embodiment, the solder for braze soldering is provided in the form of a separate solder preform 1000 having the shape of the sheet seal-ring area 318 or the frame seal-ring area 310. Also in this embodiment, preform 1000 can be of materials other than solder for use as an innerlayer or interlayer material between the transparent sheet 304 and the frame 302. When used as the innerlayer or interlayer for TC bonding, one or more elements of preform 1000 diffuses with one or more elements of sheet 304 and the frame 302.

In this embodiment, when the preform solder 1000 is used for braze-soldering to hermetically join the transparent sheet 304 to the frame 302, instead of positioning the frame and the sheet directly against one another, the frame 302 and the sheet 304 are instead positioned against opposite sides of the solder preform 1000 such that the solder preform is interposed between the frame seal-ring area 310 and the sheet seal-ring are 318 along a continuous junction region that circumscribes the window portion 312. After the frame 302 and sheet 304 are positioned against the solder preform 1000, the junction region is heated until the solder preform fuses forming a solder joint between the frame and sheet all along the junction region. The heating of the junction region may be performed by any of the procedures previously described, including heating or preheating in a furnace, oven, etc., either alone or in combination with other heating methods including resistance welding. It is required that during the step of heating the junction region, the temperature of the window portion 312 of the sheet 304 remain below the glass transition temperature $T_G$ and the softening temperature such that the finished surfaces 314 and 316 on the sheet are not adversely affected.

The current embodiment using a solder preform 1000 can be used for joining a metallized sheet 304 to a Kovar alloy/nickel/gold frame such as that illustrated in FIG. 7. In accordance with a preferred embodiment, the solder preform 1000 is formed of a gold-tin (Au—Sn) alloy, and in a more preferred embodiment, the gold-tin alloy is the eutectic composition. One of the alternative alloys for preform 1000 is tin-copper-silver (Sn—Cu—Ag). The thickness of the gold-tin preform 1000 will probably be within the range from about 6 microns to about 101.2 microns. The thickness of other alloys for preform 1000 will also probably be within the range of about 6 microns to about 101.2 microns.

The following examples, not to be considered limiting, are provided to illustrate the details of the metallic layers 610 and the sheet seal-ring area 318 that are suitable for braze-soldering to a Kovar alloy/nickel/gold frame in combination with a gold-tin solder preform or other suitable solder alloy preforms, including, but not limited to tin-copper-silver alloys.

EXAMPLE 61

| Layers | Metal | Deposition | Min. (microns) | Max. (microns) |
|---|---|---|---|---|
| 1 | Al | CVD, PVD | 0.002 | 25 |
| 2 | Cu | CVD, PVD, SBP | 0.002 | 6.35 |
| 3 | Ni | CVD, PVD, SBP | 0.002 | 6.35 |
| 4 | Au | CVD, PVD, SBP | 0.0508 | 0.508 |

EXAMPLE 62

| Layers | Metal | Deposition | Min. (microns) | Max. (microns) |
|---|---|---|---|---|
| 1 | Al | CVD, PVD | 0.002 | 25 |
| 2 | Cu | CVD, PVD, SBP | 0.002 | 6.35 |
| 3 | Ni | CVD, PVD, SBP | 0.002 | 6.35 |
| 4 | Sn—Bi | CVD, PVD, SBP | 0.635 | 12.7 |

EXAMPLE 63

| Layers | Metal | Deposition | Min. (microns) | Max. (microns) |
|---|---|---|---|---|
| 1 | Al | CVD, PVD | 0.002 | 25 |
| 2 | Zn | CVD, PVD, SBP | 0.002 | 6.35 |
| 3 | Ni | CVD, PVD, SBP | 0.002 | 6.35 |
| 4 | Au | CVD, PVD, SBP | 0.0508 | 0.508 |

EXAMPLE 64

| Layers | Metal | Deposition | Min. (microns) | Max. (microns) |
|---|---|---|---|---|
| 1 | Al | CVD, PVD | 0.002 | 25 |
| 2 | Zn | CVD, PVD, SBP | 0.002 | 6.35 |
| 3 | Ni | CVD, PVD, SBP | 0.002 | 6.35 |
| 4 | Sn—Bi | CVD, PVD, SBP | 0.635 | 12.7 |

EXAMPLE 65

| Layers | Metal | Deposition | Min. (microns) | Max. (microns) |
|---|---|---|---|---|
| 1 | Cr | CVD, PVD | 0.002 | 0.15 |
| 2 | Zn | CVD, PVD, SBP | 0.002 | 6.35 |
| 3 | Ni | CVD, PVD, SBP | 0.002 | 6.35 |
| 4 | Au | CVD, PVD, SBP | 0.0508 | 0.508 |

EXAMPLE 66

| Layers | Metal | Deposition | Min. (microns) | Max. (microns) |
|---|---|---|---|---|
| 1 | Cr | CVD, PVD | 0.002 | 0.15 |
| 2 | Ni | CVD, PVD, SBP | 0.002 | 6.35 |
| 3 | Au | CVD, PVD, SBP | 0.0508 | 0.508 |

EXAMPLE 67

| Layers | Metal | Deposition | Min. (microns) | Max. (microns) |
|---|---|---|---|---|
| 1 | Cr | CVD, PVD | 0.002 | 0.15 |
| 2 | Zn | CVD, PVD, SBP | 0.002 | 6.35 |
| 3 | Ni | CVD, PVD, SBP | 0.002 | 6.35 |
| 4 | Sn—Bi | CVD, PVD, SBP | 0.635 | 12.7 |

EXAMPLE 68

| Layers | Metal | Deposition | Min. (microns) | Max. (microns) |
|---|---|---|---|---|
| 1 | Cr | CVD, PVD | 0.002 | 0.15 |
| 2 | Ni | CVD, PVD, SBP | 0.002 | 6.35 |
| 3 | Sn—Bi | CVD, PVD, SBP | 0.635 | 12.7 |

EXAMPLE 69

| Layers | Metal | Deposition | Min. (microns) | Max. (microns) |
|---|---|---|---|---|
| 1 | Cr | CVD, PVD | 0.002 | 0.15 |
| 2 | Sn—Bi | CVD, PVD, SBP | 0.635 | 12.7 |

EXAMPLE 70

| Layers | Metal | Deposition | Min. (microns) | Max. (microns) |
|---|---|---|---|---|
| 1 | Cr | CVD, PVD | 0.002 | 0.15 |

EXAMPLE 71

| Layers | Metal | Deposition | Min. (microns) | Max. (microns) |
|---|---|---|---|---|
| 1 | De-stressed Sn or Sn—Bi | CVD, PVD | 0.635 | 12.7 |

EXAMPLE 72

| Layers | Metal | Deposition | Min. (microns) | Max. (microns) |
|---|---|---|---|---|
| 1 | Au | CVD, PVD | 0.0508 | 0.508 |

EXAMPLE 73

| Layers | Metal | Deposition | Min. (microns) | Max. (microns) |
|---|---|---|---|---|
| 1 | Ni | CVD, PVD | 0.002 | 152.4 |
| 2 | Au | CVD, PVD, SBP | 0.0508 | 0.508 |

EXAMPLE 74

| Layers | Metal | Deposition | Min. (microns) | Max. (microns) |
|---|---|---|---|---|
| 1 | Ni | CVD, PVD | 0.002 | 152.4 |
| 2 | Sn—Bi | CVD, PVD, SBP | 0.635 | 12.7 |

EXAMPLE 75

| Layers | Metal | Deposition | Min. (microns) | Max. (microns) |
|---|---|---|---|---|
| 1 | Ni | CVD, PVD | 0.002 | 152.4 |
| 2 | Sn (De-stressed after deposition) | CVD, PVD, SBP | 0.635 | 12.7 |

By way of further examples, not to be considered limiting, the following combinations are preferred for the metallic layers 610 and the sheet seal-ring area 318 for braze-soldering to a Kovar alloy/nickel/gold frame in combination with a gold-tin soldered preform. In addition to having a frame of Kovar alloy/nickel/gold, materials other than Kovar may be employed as the frame's base material and the overlying layer or layers may be nickel without the gold, or combinations of two or more metals including, but not limited to nickel and gold.

EXAMPLE 76

| Layers | Metal | Deposition | Min. (microns) | Max. (microns) |
|---|---|---|---|---|
| 1 | Al | CVD, PVD | 0.1 | 2.54 |
| 2 | Cu | CVD, PVD, SBP | 0.25 | 2.54 |
| 3 | Ni | CVD, PVD, SBP | 1 | 5.08 |
| 4 | Au | CVD, PVD, SBP | 0.127 | 0.381 |

EXAMPLE 77

| Layers | Metal | Deposition | Min. (microns) | Max. (microns) |
|---|---|---|---|---|
| 1 | Al | CVD, PVD | 0.1 | 2.54 |
| 2 | Cu | CVD, PVD, SBP | 0.25 | 2.54 |
| 3 | Ni | CVD, PVD, SBP | 1 | 5.08 |
| 4 | Sn—Bi | CVD, PVD, SBP | 2.54 | 7.62 |

EXAMPLE 78

| Layers | Metal | Deposition | Min. (microns) | Max. (microns) |
|---|---|---|---|---|
| 1 | Al | CVD, PVD | 0.1 | 2.54 |
| 2 | Zn | CVD, PVD, SBP | 0.3175 | 5.08 |
| 3 | Ni | CVD, PVD, SBP | 1 | 5.08 |
| 4 | Au | CVD, PVD, SBP | 0.127 | 0.381 |

EXAMPLE 79

| Layers | Metal | Deposition | Min. (microns) | Max. (microns) |
|---|---|---|---|---|
| 1 | Al | CVD, PVD | 0.1 | 2.54 |
| 2 | Zn | CVD, PVD, SBP | 0.3175 | 5.08 |
| 3 | Ni | CVD, PVD, SBP | 1 | 5.08 |
| 4 | Sn—Bi | CVD, PVD, SBP | 2.54 | 7.62 |

EXAMPLE 80

| Layers | Metal | Deposition | Min. (microns) | Max. (microns) |
|---|---|---|---|---|
| 1 | Cr | CVD, PVD | 0.05 | 0.12 |
| 2 | Zn | CVD, PVD, SBP | 0.3175 | 5.08 |
| 3 | Ni | CVD, PVD, SBP | 1 | 5.08 |
| 4 | Au | CVD, PVD, SBP | 0.127 | 0.381 |

EXAMPLE 81

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Au | CVD, PVD, SBP | 0.127 | 0.381 |

EXAMPLE 82

| Layers | Metal | Deposition | Min. (microns) | Max. (microns) |
|---|---|---|---|---|
| 1 | Cr | CVD, PVD | 0.05 | 0.12 |
| 2 | Zn | CVD, PVD, SBP | 0.3175 | 5.08 |
| 3 | Ni | CVD, PVD, SBP | 1 | 5.08 |
| 4 | Sn—Bi | CVD, PVD, SBP | 2.54 | 7.62 |

EXAMPLE 83

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Sn—Bi | CVD, PVD, SBP | 2.54 | 7.62 |

EXAMPLE 84

| Layers | Metal | Deposition | Min. (microns) | Max. (microns) |
|---|---|---|---|---|
| 1 | Cr | CVD, PVD | 0.05 | 0.12 |
| 2 | Sn—Bi | CVD, PVD, SBP | 2.54 | 7.62 |

EXAMPLE 85

| Layers | Metal | Deposition | Min. (microns) | Max. (microns) |
|---|---|---|---|---|
| 1 | Cr | CVD, PVD | 0.05 | 0.12 |

EXAMPLE 86

| Layers | Metal | Deposition | Min. (microns) | Max. (microns) |
|---|---|---|---|---|
| 1 | De-stressed Sn or Sn—Bi | CVD, PVD | 2.54 | 7.62 |

EXAMPLE 87

| Layers | Metal | Deposition | Min. (microns) | Max. (microns) |
|---|---|---|---|---|
| 1 | Au | CVD, PVD | 0.127 | 0.381 |

EXAMPLE 88

| Layers | Metal | Deposition | Min. (microns) | Max. (microns) |
|---|---|---|---|---|
| 1 | Ni | CVD, PVD | 0.1 | 5.08 |
| 2 | Au | CVD, PVD, SBP | 0.127 | 0.381 |

EXAMPLE 89

| Layers | Metal | Deposition | Min. (microns) | Max. (microns) |
|---|---|---|---|---|
| 1 | Ni | CVD, PVD | 0.1 | 5.08 |
| 2 | Sn—Bi | CVD, PVD, SBP | 2.54 | 7.62 |

EXAMPLE 90

| Layers | Metal | Deposition | Min. (microns) | Max. (microns) |
|---|---|---|---|---|
| 1 | Ni | CVD, PVD | 0.1 | 5.08 |
| 2 | Sn (De-stressed after deposition) | CVD, PVD, SBP | 2.54 | 7.62 |

Figure 11:
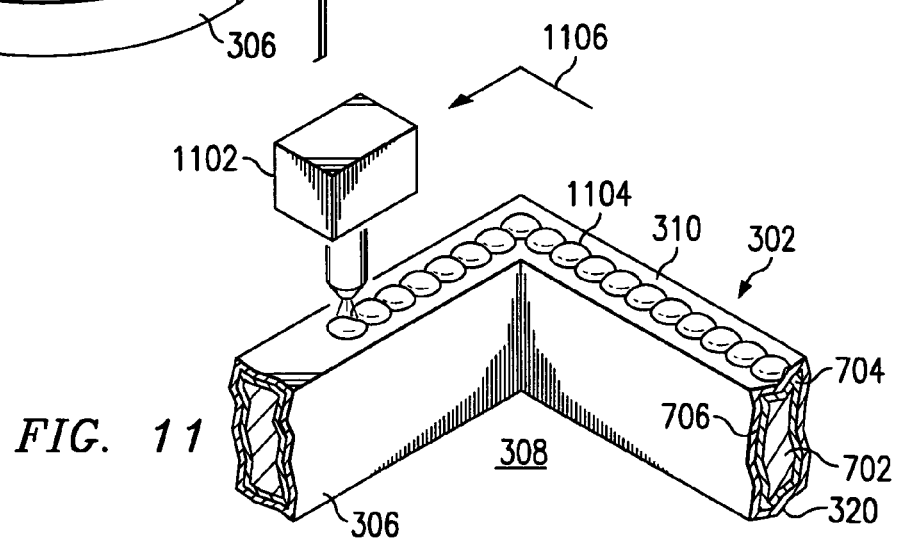
FIG. 11 is a partial perspective view of another embodiment utilizing solder applied by inkjet.

Referring now to FIG. 11, there is illustrated yet another embodiment of the current invention. This embodiment also uses soldering, however, in this embodiment the solder is applied via inkjet technology to either the metallized area 610 in the sheet seal-ring area 318 or the sheet seal-ring 310 of the frame assembly. FIG. 11 shows a portion of the Kovar alloy/nickel/gold frame 302 (or other frame alloy and overlayer combination) and an inkjet dispensing head 1102 which is dispensing overlapping drops of solder 1104 onto the frame seal-ring area 310 as the dispensing head moves around the frame aperture 308 or the frame aperture is moved underneath the dispensing head, as indicated by arrow 1106. Preferably, the inkjet dispensed solder is a gold-tin (Au—Sn) alloy, and more preferably it is the eutectic composition. The preferred thickness of the gold-tin solder applied by dispensing head 1102 in this embodiment is within the range from about 6 microns to about 101.2 microns. It will be appreciated that while the example illustrated in FIG. 11 shows the dispensing head 1102 depositing the solder droplets 1104 onto the frame 302, in other embodiments the inkjet deposited solder may be applied to the sheet seal-ring area 318, either alone or in combination with applications on the frame seal-ring area 310. In still other embodiments, the inkjet deposited solder may be used to create a discrete solder preform that would be employed as described in the previous examples herein. In still other embodiments, the inkjet deposited material, which may or may not be solder, may be used to create an innerlayer or interlay preform that would be employed for use in TC bonding or HIP diffusion bonding as described in previous examples herein. Details of the metallic layers 610 in the sheet seal-ring area 318 that are suitable for a soldering to a Kovar alloy/nickel/gold frame 302 such as that illustrated in FIG. 7 using inkjet supplied solder are substantially identical to those layers illustrated in previous Examples 21 through 32.

Referring now to FIGS. 12*a* through 12*c* and FIGS. 13*a* through 13*c*, there is illustrated yet another alternative method for manufacturing cover assemblies constituting another embodiment of the current invention. Whereas, in the previous embodiments a separate prefabricated metal frame was joined to the transparent sheet to act as a heat spreader/heat sink needed for subsequent welding, in this embodiment a cold gas dynamic spray deposition process is used to fabricate a metallic frame/heat spreader directly on the transparent sheet material. In other words, in this embodiment the frame is fabricated directly on the transparent sheet as an integral part, no subsequent joining operation is required. In addition, since cold gas dynamic spray deposition can be accomplished at near room temperature, this method is especially useful where the transparent sheet material and/or surface treatments thereto have a relatively low $T_G$, melting temperature, or other heat tolerance parameter.

Figure 12A:
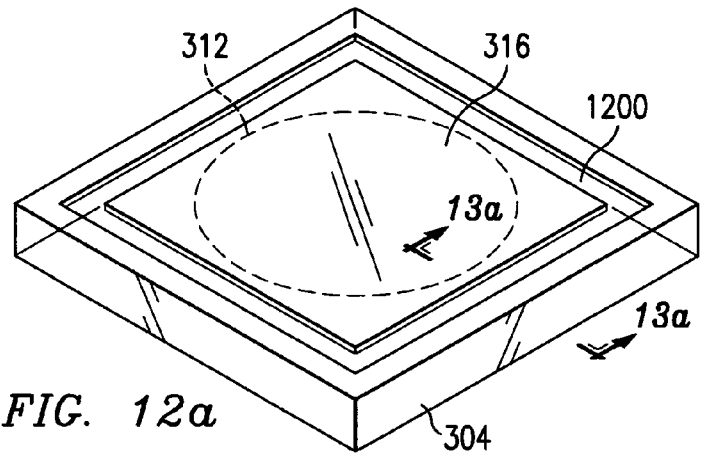
FIGS. 12a-c and FIGS. 13a-c illustrate a process of manufacturing cover assemblies in accordance with yet another embodiment of the invention, specifically.

Referring specifically to FIG. 12*a*, there is illustrated a sheet of transparent material 304 having a window portion 312 defined thereupon. The window portion 312 has finished top and bottom surfaces 314 and 316 (note that the 304 sheet appears bottom side up in FIGS. 12*a* through 12*c*). A frame attachment area 1200 is defined on the sheet 304, the frame attachment area circumscribing the window portion 312. It will be appreciated in the embodiment illustrated in FIG. 12 that the frame attachment area 1200 need not follow the specific boundaries of the window area 312 (i.e., which in this case are circular) as long as the frame attachment area 1200 completely circumscribes the window portion.

It will be appreciated that, unless specifically noted otherwise, the initial steps of obtaining a transparent sheet having a window portion with finished top and bottom surfaces, preparing the seal-ring area of the sheet and metallizing the seal-ring area of the sheet are substantially identical to those described for the previous embodiments and will not be described in detail again.

Figure 12B:
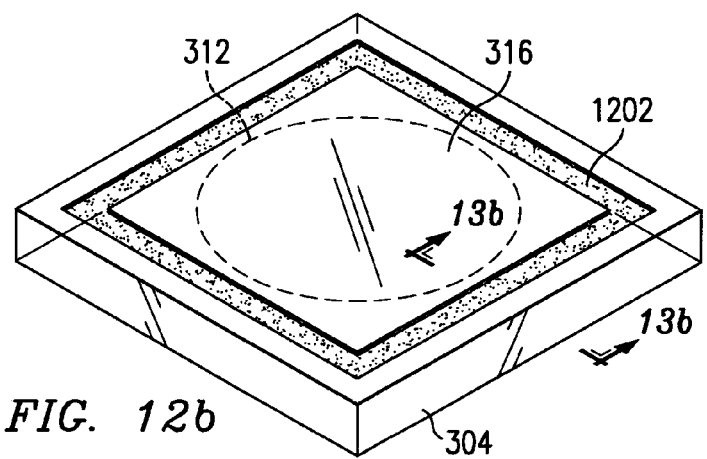
Figure 13A:
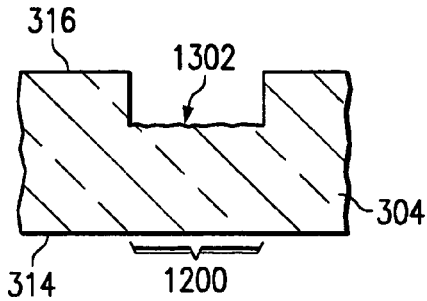

Referring now also to FIG. 13*a*, there is illustrated a partial cross-sectional view to the edge of the sheet 304. In this example, the step of preparing a frame attachment area 1200 on the sheet 304 comprises an optional step of roughening the frame attachment area by roughening and/or grinding the surface from its original level (shown in broken line) to produce a recessed area 1302. After the frame attachment area 1200 has been prepared, metal layers are deposited into the frame attachment area of the sheet using cold gas dynamic spray deposition. In FIG. 12*b*, an initial metal layer 1202 has been applied into the frame attachment area 1200 using cold gas dynamic spray deposition.

Figure 13B:
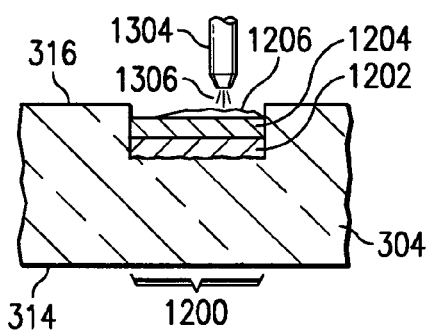
Figure 13C:
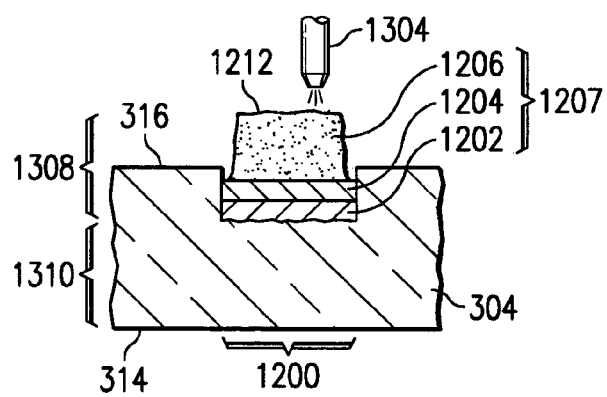

Referring now also to FIG. 13*b*, the cold gas dynamic spray nozzle 1304 is shown depositing a stream of metal particles 1306 onto the frame attachment area 1200. The initial layer 1202 has now been overlaid with a secondary layer 1204 and the spray nozzle 1304 is shown as it begins to deposit the final Kovar alloy layer 1206. Layer 1206 need not be Kovar.

Figure 12C:
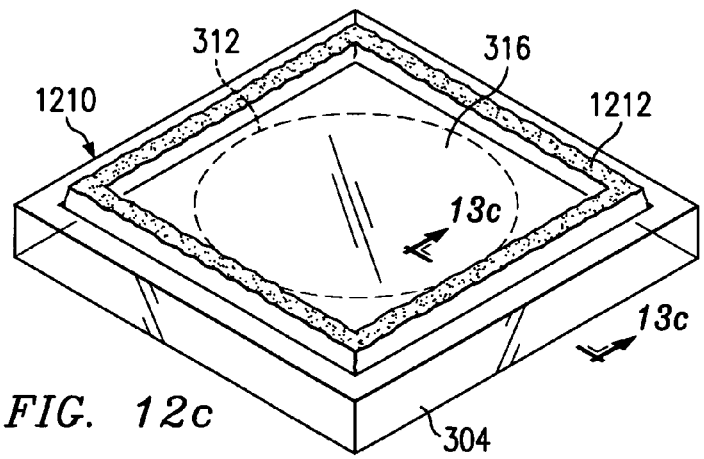

Referring now to FIG. 12*c*, the completed cover assembly 1210 is illustrated including the integral frame/heat spreader 1212, which has been built up from layer 1206 to a predetermined height, denoted by reference numeral 1308, above the finished surface of the sheet. In a preferred embodiment, the predetermined height 1308 of the built-up metal frame above the frame attachment area 1200 is within the range from about 5% to about 100% of the thickness denoted by reference numeral 1310 of the sheet 304 beneath the frame attachment area. In the embodiment shown, the step of depositing metal using cold gas dynamic spray included depositing a layer of Kovar alloy onto the sheet to fabricate the built-up frame/heat spreader 1212. The use of cold gas dynamic spray deposition allows a tremendous range of thickness for this Kovar alloy layer, which thickness may be within the range from about 2.54 microns to about 12,700 microns. It will, of course, be appreciated that the frame/heat spreader 1212 may be fabricated through the deposition of materials other than Kovar alloy, depending upon the characteristics of the transparent sheet 304 and of the package base 104, especially their respective CTEs.

The following examples, not to be considered limiting, are provided to illustrate the details of the metallic layers, denoted collectively by reference numeral 1207 for forming a frame/heat spreader compatible with hard glass transparent sheets and Kovar alloy or ceramic package bases. The deposition of materials other than Kovar alloy may be used as the final layer whenever Kovar Alloy is indicated as the final layer, depending upon the characteristics of the transparent sheet 304 and of the package base 104, especially their respective CTEs.

EXAMPLE 91

| Layers | Metal | Deposition | Min. (microns) | Max. (microns) |
|---|---|---|---|---|
| 1 | Al | cold gas spray | 2.54 | 127 |
| 2 | Cu | cold gas spray | 2.54 | 127 |
| 3 | Ni | cold gas spray | 2.54 | 127 |
| 4 | Kovar Alloy | cold gas spray | 127 | 12,700 |

EXAMPLE 92

| Layers | Metal | Deposition | Min. (microns) | Max. (microns) |
|---|---|---|---|---|
| 1 | Al | cold gas spray | 2.54 | 127 |
| 2 | Ni | cold gas spray | 2.54 | 127 |
| 3 | Kovar Alloy | cold gas spray | 127 | 12,700 |

EXAMPLE 93

| Layers | Metal | Deposition | Min. (microns) | Max. (microns) |
|---|---|---|---|---|
| 1 | Al | cold gas spray | 2.54 | 127 |
| 2 | Kovar Alloy | cold gas spray | 127 | 12,700 |

EXAMPLE 94

| Layers | Metal | Deposition | Min. (microns) | Max. (microns) |
|---|---|---|---|---|
| 1 | Kovar Alloy | cold gas spray | 127 | 12,700 |

EXAMPLE 95

| Layers | Metal | Deposition | Min. (microns) | Max. (microns) |
|---|---|---|---|---|
| 1 | Zn | cold gas spray | 2.54 | 127 |
| 2 | Ni | cold gas spray | 2.54 | 127 |
| 3 | Kovar alloy | cold gas spray | 127 | 12,700 |

EXAMPLE 96

| Layers | Metal | Deposition | Min. (microns) | Max. (microns) |
|---|---|---|---|---|
| 1 | Zn | cold gas spray | 2.54 | 127 |
| 2 | Kovar alloy | cold gas spray | 127 | 12,700 |

EXAMPLE 97

| Layers | Metal | Deposition | Min. (microns) | Max. (microns) |
|---|---|---|---|---|
| 1 | Cr | cold gas spray | 2.54 | 127 |
| 2 | Ni | cold gas spray | 2.54 | 127 |
| 3 | Kovar alloy | cold gas spray | 127 | 12,700 |

EXAMPLE 98

| Layers | Metal | Deposition | Min. (microns) | Max. (microns) |
|---|---|---|---|---|
| 1 | Cr | cold gas spray | 2.54 | 127 |
| 2 | Kovar alloy | cold gas spray | 127 | 12,700 |

EXAMPLE 99

| Layers | Metal | Deposition | Min. (microns) | Max. (microns) |
|---|---|---|---|---|
| 1 | Al | cold gas spray | 2.54 | 127 |
| 2 | Zn | cold gas spray | 2.54 | 127 |
| 3 | Ni | cold gas spray | 2.54 | 127 |
| 4 | Kovar Alloy | cold gas spray | 127 | 12,700 |

EXAMPLE 100

| Layers | Metal | Deposition | Min. (microns) | Max. (microns) |
|---|---|---|---|---|
| 1 | Ni | cold gas spray | 2.54 | 127 |
| 2 | Kovar Alloy | cold gas spray | 127 | 12,700 |

EXAMPLE 101

| Layers | Metal | Deposition | Min. (microns) | Max. (microns) |
|---|---|---|---|---|
| 1 | Sn or Sn—Bi | cold gas spray | 2.54 | 127 |
| 2 | Zn | cold gas spray | 2.54 | 127 |
| 3 | Ni | cold gas spray | 2.54 | 127 |
| 4 | Kovar Alloy | cold gas spray | 127 | 12,700 |

EXAMPLE 102

| Layers | Metal | Deposition | Min. (microns) | Max. (microns) |
|---|---|---|---|---|
| 1 | Sn or Sn—Bi | cold gas spray | 2.54 | 127 |
| 2 | Ni | cold gas spray | 2.54 | 127 |
| 3 | Kovar Alloy | cold gas spray | 127 | 12,700 |

By way of further examples, not to be considered limiting, the following combinations are preferred for the metallic layers 1207 for forming a frame/heat spreader compatible with hard glass transparent sheets and Kovar or other alloys or ceramic package bases. The deposition of materials other than Kovar alloy may be used as the final layer whenever Kovar Alloy is indicated as the final layer, depending upon the characteristics of the transparent sheet 304 and of the package base 104, especially their respective CTEs.

EXAMPLE 103

| Layers | Metal | Deposition | Min. (microns) | Max. (microns) |
|---|---|---|---|---|
| 1 | Al | cold gas spray | 12.7 | 76.2 |
| 2 | Cu | cold gas spray | 12.7 | 76.2 |
| 3 | Ni | cold gas spray | 12.7 | 76.2 |
| 4 | Kovar Alloy | cold gas spray | 635 | 2,540 |

EXAMPLE 104

| Layers | Metal | Deposition | Min. (microns) | Max. (microns) |
|---|---|---|---|---|
| 1 | Al | cold gas spray | 12.7 | 76.2 |
| 2 | Ni | cold gas spray | 12.7 | 76.2 |
| 3 | Kovar Alloy | cold gas spray | 635 | 2,540 |

EXAMPLE 105

| Layers | Metal | Deposition | Min. (microns) | Max. (microns) |
|---|---|---|---|---|
| 1 | Al | cold gas spray | 12.7 | 76.2 |
| 2 | Kovar Alloy | cold gas spray | 635 | 2,540 |

EXAMPLE 106

| Layers | Metal | Deposition | Min. (microns) | Max. (microns) |
|---|---|---|---|---|
| 1 | Kovar Alloy | cold gas spray | 635 | 2,540 |

EXAMPLE 107

| Layers | Metal | Deposition | Min. (microns) | Max. (microns) |
|---|---|---|---|---|
| 1 | Zn | cold gas spray | 12.7 | 76.2 |
| 2 | Ni | cold gas spray | 12.7 | 76.2 |
| 3 | Kovar alloy | cold gas spray | 635 | 2,540 |

EXAMPLE 108

| Layers | Metal | Deposition | Min. (microns) | Max. (microns) |
|---|---|---|---|---|
| 1 | Zn | cold gas spray | 12.7 | 76.2 |
| 2 | Kovar alloy | cold gas spray | 635 | 2,540 |

EXAMPLE 109

| Layers | Metal | Deposition | Min. (microns) | Max. (microns) |
|---|---|---|---|---|
| 1 | Cr | cold gas spray | 12.7 | 76.2 |
| 2 | Ni | cold gas spray | 12.7 | 76.2 |
| 3 | Kovar alloy | cold gas spray | 635 | 2,540 |

EXAMPLE 110

| Layers | Metal | Deposition | Min. (microns) | Max. (microns) |
|---|---|---|---|---|
| 1 | Cr | cold gas spray | 12.7 | 76.2 |
| 2 | Kovar alloy | cold gas spray | 635 | 2,540 |

EXAMPLE 111

| Layers | Metal | Deposition | Min. (microns) | Max. (microns) |
|---|---|---|---|---|
| 1 | Al | cold gas spray | 12.7 | 76.2 |
| 2 | Zn | cold gas spray | 12.7 | 76.2 |
| 3 | Ni | cold gas spray | 12.7 | 76.2 |
| 4 | Kovar Alloy | cold gas spray | 635 | 2,540 |

EXAMPLE 112

| Layers | Metal | Deposition | Min. (microns) | Max. (microns) |
|---|---|---|---|---|
| 1 | Ni | cold gas spray | 12.7 | 76.2 |
| 2 | Kovar Alloy | cold gas spray | 635 | 2,540 |

EXAMPLE 113

| Layers | Metal | Deposition | Min. (microns) | Max. (microns) |
| --- | --- | --- | --- | --- |
| 1 | Sn or Sn—Bi | cold gas spray | 12.7 | 76.2 |
| 2 | Zn | cold gas spray | 12.7 | 76.2 |
| 3 | Ni | cold gas spray | 12.7 | 76.2 |
| 4 | Kovar Alloy | cold gas spray | 635 | 2,540 |

EXAMPLE 114

| Layers | Metal | Deposition | Min. (microns) | Max. (microns) |
| --- | --- | --- | --- | --- |
| 1 | Sn or Sn—Bi | cold gas spray | 12.7 | 76.2 |
| 2 | Ni | cold gas spray | 12.7 | 76.2 |
| 3 | Kovar Alloy | cold gas spray | 635 | 2,540 |

After the deposition of the metal layers using the cold gas dynamic spray deposition, it may be necessary to grind or shape the top surface of the built-up frame 1212 to a predetermined flatness before performing additional steps to ensure that a good contact will be made in later bonding. Another process that may be used, either alone or in combination with shaping the top surface of the built-up frame, is the depositing of additional metal layers onto the built-up frame/heat spreader 1212 using solution bath plating. The most common reason for such plated layers is to promote a good bonding when the frame/heat spreader is adjoined to the package base 104. In a preferred embodiment, the additional metallic layers applied to the built-up frame 1212 include a layer of nickel directly over the cold gas dynamic spray deposited metal having a thickness within the range of about 0.002 microns to about 25 microns and, in some instances, then solution bath plating a layer of gold over the nickel layer until the gold layer has a thickness within the range from about 0.0508 microns to about 0.508 microns.

Figure 14:
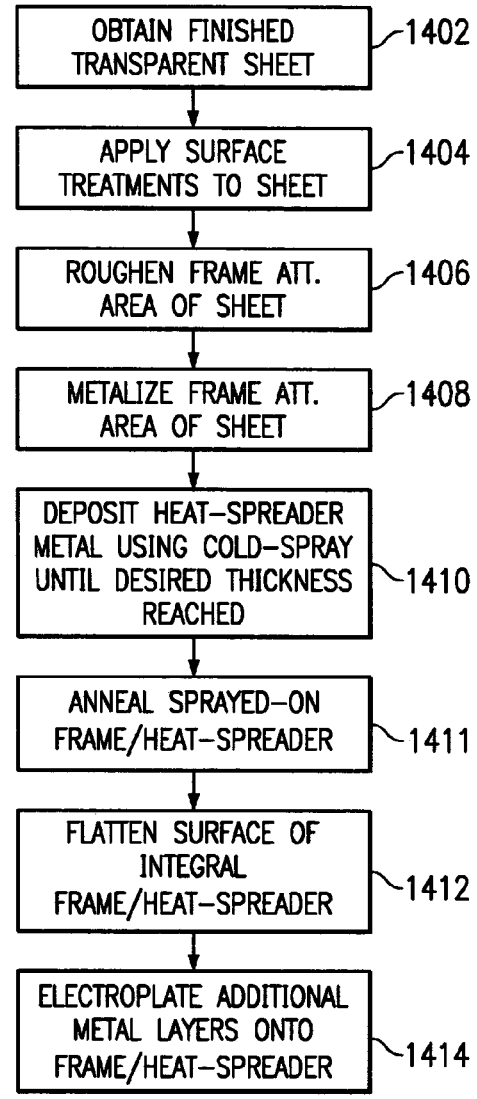
FIG. 14 is a block diagram of a process for manufacturing cover assemblies using cold gas dynamic spray technology in accordance with another embodiment.

Referring now to FIG. 14, there is illustrated a block diagram of the alternative embodiment utilizing cold gas dynamic spray deposition. It will be appreciated that, unless specifically noted otherwise, the initial steps of obtaining a transparent sheet having finished surfaces, applying surface treatments to the sheet, cleaning, roughening or otherwise preparing the frame attachment area of the sheet are substantially identical to those described for the previous embodiments and will not be described in detail again. For example, block 1402 of FIG. 14 represents the step of obtaining a sheet of transparent material having finished surfaces and corresponds directly with block 902, and with the description of suitable transparent materials. Similarly, except as noted, blocks 1404, 1406 and 1408 of FIG. 14 correspond directly with blocks 904, 906 and 908, respectively, of FIG. 9 and with the previous descriptions of the steps and sub-steps provided herein. Thus, it will be understood that all of the options described for performing the various steps and sub-steps represented by the blocks 902-908 in the previous (i.e., prefabricated frame) embodiments are applicable to the blocks 1402-1408 in the current (i.e., cold spray) embodiment.

The next step of the process is to use cold gas dynamic spray deposition to deposit frame/heat spreader metal onto any previously deposited metal layers in the frame attachment area 1200. This step is represented by block 1410. As previously described in connection with FIGS. 13b and 13c, the high velocity particles 1306 from the gas nozzle 1304 form a new layer on the previous metallic layers, and by directing the cold spray jet across the frame attachment area 1200 repeatedly, the new material can become a continuous metallic layer around the entire periphery of the frame attachment area, i.e., it will circumscribe the window portion 312 of the transparent sheet 304. Where the material of the package base 104 (to which the cover assembly 1210 will eventually be joined) is Kovar alloy or appropriately metallized alumina, Kovar alloy is preferred for the material 1206 to be cold sprayed to form the integral frame. In other cases, a heat spreader material should be selected which has a CTE that is closely matched to the CTE of the package base 104. Of course, that material must also be compatible with the cold gas dynamic spray process.

The cold spraying of the powdered heat spreader material is continued until the new layer 1206 reaches the thickness required to serve as a heat spreader/integral frame. This would represent the end of the process represented by block 1410. For some applications, the built-up heat spreader/frame 1212 is now complete and ready for use. For other applications, however, performing further finishing operations on the heat spreader/frame 1212 may be desirable.

For example, it is known that significant residual stresses may be encountered in metal structures deposited using cold-gas dynamic spray technology as a result of the mechanics of the spray process. These stresses may make the resulting structure prone to dimensional changes, cracking or other stress-related problems during later use. Annealing by controlled heating and cooling is known to reduce or eliminate residual stresses. Thus, in some applications, the integral heat spreader/frame 1212 is annealed following its deposition on the sheet 304. This optional step is represented by block 1411 in FIG. 14. In some embodiments, the annealing step 1411 may include the annealing of the totality of the sprayed-on metals and alloys constituting the heat spreader/frame 1212. In other embodiments, however, the annealing step 1411 includes annealing only the outermost portions of the integral built-up heat spreader/frame 1212, while the inner layers are left unannealed.

It will be appreciated that there are flatness requirements for the sealing surface at the "top" of the heat spreader (which is actually projecting from the bottom surface 316 of the sheet). If these flatness requirements are not met via the application of the heat spreader material by the cold spray process, it will be necessary to flatten the sealing surface at the next step of the process. This step is represented by block 1412 in FIG. 14. There are a number of options for achieving the required surface flatness. First, it is possible to remove surface material from the heat spreader to achieve the required flatness. This may be accomplished by conventional surface grinding, by other traditional mechanical means, or it may be accomplished by the laser removal of high spots. Where material removal is used, care must be taken to avoid damaging the finished window surfaces 314 and 316 during the material removal operations. Special fixturing and/or masking of the window portion 312 may be required. Alternatively, if the cold spray deposited heat spreader 1212 is ductile enough, the surface may be flattened using a press operation, i.e., pressing the frame against a flat pattern or by employing a rolling operation. This would reduce the handling precautions as compared to using a surface grinder or laser operations.

Finally, as previously described, in some embodiments additional metal layers are plated onto the integral frame/heat spreader 1212. These optional plating operations, such as solution bath plating layers of nickel and gold onto a Kovar alloy frame, are represented by block 1414 in FIG. 14. In the embodiment shown in FIG. 14, the optional plating operation 1414 is performed after the optional flattening operation 1412, which in turn is performed after the optional annealing operation 1411. While such order is preferred, it will be appreciated that in other embodiments the order of the optional finishing steps 1411, 1412 and 1414 may be rearranged. The primary consideration for the ordering of these finishing steps is whether later steps will damage the results of earlier steps. For example, it would be impractical to perform plating step 1414 before the flattening step 1412 if the flattening was to be carried out by grinding, while it might be acceptable if the flattening was to be carried out by pressing.

Figure 15A:
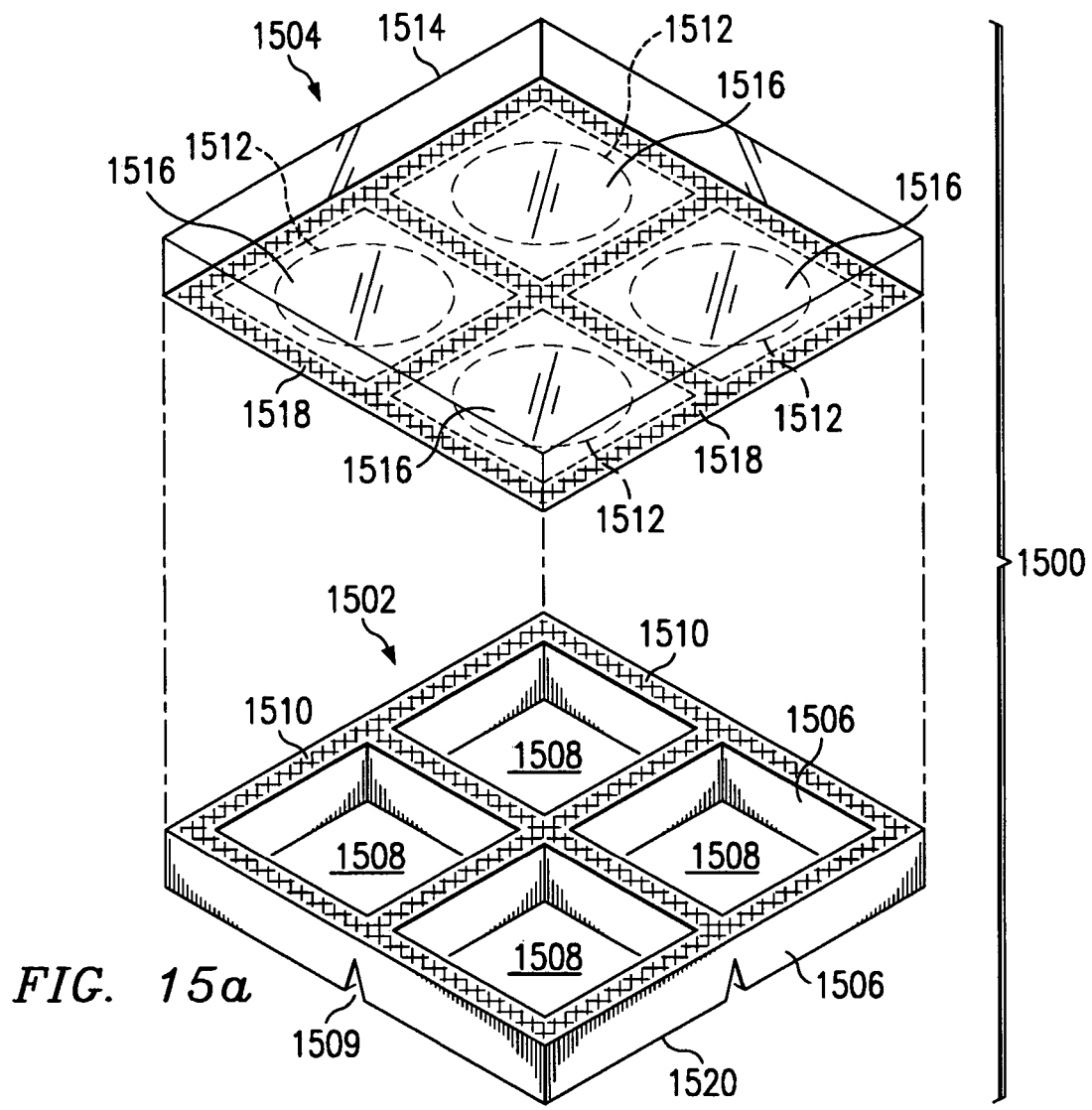
FIGS. 15a-15b illustrate a multi-unit assembly manufactured in accordance with another embodiment; specifically.
Figure 15B:
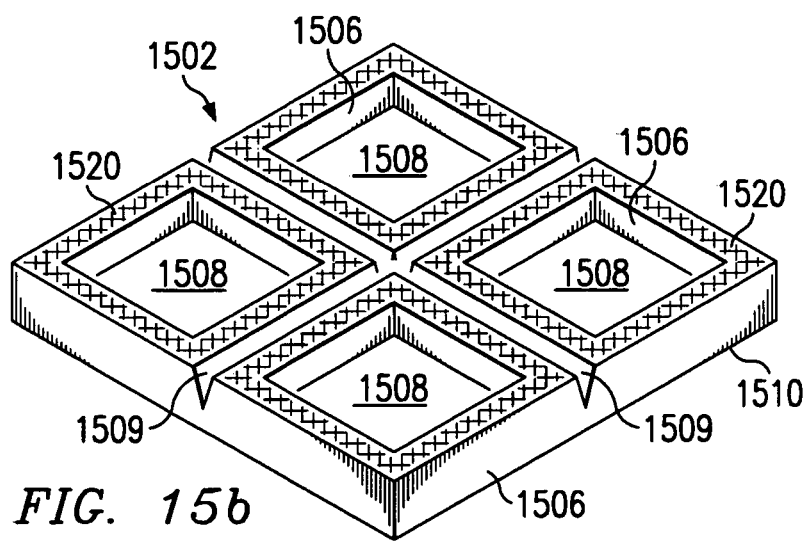

Referring now to FIGS. 15*a* and 15*b*, there is illustrated a method for manufacturing multiple cover assemblies simultaneously in accordance with another embodiment of the current invention. Shown in FIG. 15*a* is an exploded view of a multi-unit assembly that can be subdivided after fabrication to produce individual cover assemblies. The multi-unit assembly 1500 includes a frame 1502 and a sheet 1504 of a transparent material. The frame 1502 has sidewalls 1506 defining a plurality of frame apertures 1508 therethrough. Each frame aperture 1508 is circumscribed by a continuous sidewall section having a frame seal-ring area 1510 (denoted by cross-hatching). Each frame seal-ring area 1510 has a metallic surface, which may result from the inherent material of the frame 1502 or it may result from metal layers that have been applied to the surface of the frame. In some embodiments, the frame 1502 includes reduced cross-sectional thickness areas 1509 formed on the frame sidewalls 1506 between adjacent frame apertures 1508. FIG. 15*b* shows the bottom side of the frame 1502, to better illustrate the reduced cross-sectional thickness areas 1509 formed between each aperture 1508. Also illustrated is the base seal-ring area 1520 (denoted by cross-hatching) which surrounds each aperture 1508 to allow joining to the package bases 104.

Further regarding the multi-aperture frames illustrated in FIGS. 15*a* and 15*b*, it will be understood that the frame 1502 can be attached as shown, with the open ends of the V-shaped notches facing away from the sheet, or alternatively, with the open ends of the V-shaped notches facing toward the sheet.

Except for the details just described, the multiple-aperture frame 1502 of this embodiment shares material, fabrication and design details with the single aperture frame 302 previously described. In this regard, a preferred embodiment of the frame 1502 is primarily formed of Kovar alloy or similar materials and more preferably, will have a Kovar alloy core with a surface layer of gold overlaying an intermediate layer of nickel as previously described.

The transparent sheet 1504 for the multi-unit assembly can be formed from any type of transparent material as previously discussed for sheet 304. In this embodiment, however, the sheet 1504 has a plurality of window portions 1512 defined thereupon, with each window portion having finished top and bottom surface 1514 and 1516, respectively. A plurality of sheet seal-ring areas 1518 are denoted by cross-hatching surrounding each window portion in FIG. 15*a*. With respect to the material of the sheet 1504, with respect to the finished configuration of the top and bottom surfaces 1514 and 1516, respectively, of each window portion 1512, with respect to surface treatments, and/or coatings, the sheet 1504 is substantially identical to the single window portion sheet 304 previously discussed.

The next step of the process of manufacturing the multi-unit assembly 1500 is to prepare the sheet seal-ring areas 1518 for metallization. As noted earlier, each sheet seal-ring area 1518 circumscribes a window portion of the sheet 1504. The sheet seal-ring areas 1518 typically have a configuration which closely matches the configuration of the frame seal-ring areas 1510 to which they will eventually be joined. It will be appreciated, however, that in some cases other considerations will affect the configuration of the frame grid, e.g., when electrical resistance heating is used to produce bonding, then the seal-ring areas 1518 must be connected to form the appropriate circuits. The steps of preparing the sheet seal-ring areas 1518 for metallization is substantially identical to the steps and options presented during discussion of preparing the frame seal-ring area 310 on the single aperture frame 302. Thus, at a minimum, preparing the sheet seal-ring area 1518 typically involves a thorough (e.g., plasma, solvent or detergent) cleaning to remove any contaminants from the surfaces and typically also involves roughening the seal-ring area by chemical etching, laser ablating, mechanical grinding or sandblasting this area.

The step of metallizing the prepared sheet seal-ring areas 1510 of the sheet 1502 are substantially identical to the steps described for metallizing the frame seal-ring area 310 on the single aperture frame 302. For example, the metal layers shown in Examples 1 through 120 can be used in connection with thermal compression bonding, for soldering where the solder material is plated onto the sheet as a final metallic layer, and can be used in connection with soldering in combination with a separate gold-tin of solder preform and also for soldering in connection with solders deposited or formed using inkjet technology.

The next step of the process is to position the frame 1502 against the sheet 1504 (it being understood that solder preforms or solder layers would be interposed between the frame and the sheet if braze soldering is used to join the frame 1502 to the sheet 1504) such that each of the window portions 1512 overlays one of the frame apertures 1508, and that for each such window portion/frame aperture combination, at least a portion of the associated frame seal-ring area 1510 and at least a portion of the associated sheet seal-ring area 1518 contact one another along a continuous junction region that circumscribes the associated window portion. This operation is generally analogous to the steps of positioning the frame against the sheet in the single aperture embodiment previously described. If diffusion bonding is used to join the frame 1502 to the sheet 1504, an interlayer or innerlayer between the frame 1502 to the sheet 1504 may or may not be employed.

Figure 16A:
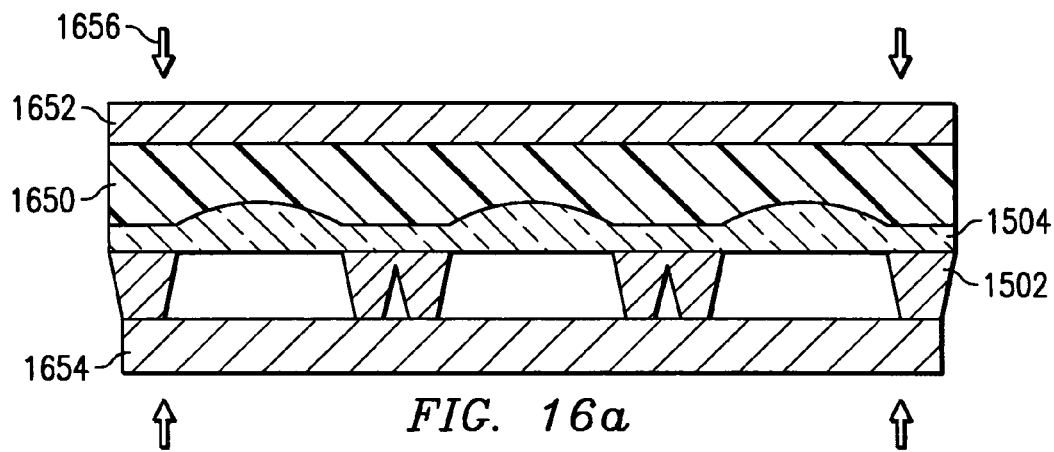
FIG. 16a illustrates compliant tooling formed in accordance with another embodiment.

Referring now to FIG. 16*a*, there is illustrated the positioning of a multi-window sheet 1504 (in this case having window portions 1512 with contoured surfaces) against a multi-aperture frame 1502 using compliant tooling in accordance with another embodiment. The compliant tooling includes a compliant element 1650 and upper and lower support plates 1652, 1654, respectively. The support plates 1652 and 1654 receive compressive force, denoted by arrows 1656, at discrete locations from tooling fixtures (not shown). The compliant member 1650 is positioned between one of the support plates and the cover assembly pre-fab (i.e., frame 1502 and sheet 1504). The compliant member 1650 yields elastically when a force is applied, and therefore can conform to irregular surfaces (such as the sheet 1504) while at the same time applying a distributed force against the irregular surface to insure that the required contact pressure is achieved all along the frame/sheet junction. Such compliant tooling can also be used to press a sheet or frame against the other member when the two members are not completely flat, taking advantage of the inherent flexibility (even if small) present in all materials. In the illustrated example, the compliant member 1650 is formed from a solid block of an elastomer material, e.g., rubber, however in other embodiments the compliant member may also be fabricated from discrete elements, e.g., springs. The compliant material must be able to withstand the elevated temperatures experienced during the bonding operation.

The next step of the process is heating all of the junction regions until a metal-to-metal joint is formed between the frame 1502 and the sheet 1504 all along each junction region, thus creating the multi-unit assembly 1500 having a hermetic frame/sheet seal circumscribing each window portion 1512. If diffusion bonding is used to join the frame 1502 and the sheet 1504, the bond could be between the outermost metal layer of the frame and the non-metallized sheet 1504. It will be appreciated that any of the heating technologies previously described for joining the single aperture frame 302 to the single sheet 304 are applicable to joining the multi-aperture frame 1502 to the corresponding multi-window sheet 1504.

Figure 16B:
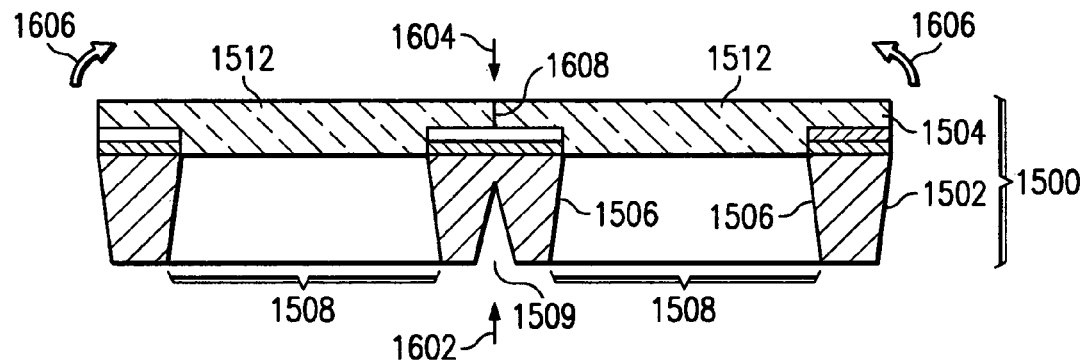
FIG. 16b is a side view of a multi-unit assembly illustrating the method of separation.

Referring now to FIG. 16*b*, the final step of the current process is to divide the multi-unit assembly 1500 along each junction region that is common between two window portions 1512 taking care to preserve and maintain the hermetic seal circumscribing each window portion. A plurality of individual cover assemblies are thereby produced. FIG. 16*b*, illustrates a side view of a multi-unit assembly 1500 following the hermetic bonding of the sheet 1504 to the frame 1502. Where the frame 1502 includes reduced cross-sectional thickness areas 1509, the step of dividing the multi-unit assembly may include scoring the frame along the back side of the reduced cross-sectional thickness area at the position indicated by arrow 1602, preferably breaking through or substantially weakening the remaining frame material below area 1509, and also simultaneously scoring the sheet 1504 along a line vertically adjacent to area 1509, i.e., at the point indicated by arrow 1604, followed by flexing the assembly 1500, e.g., in the direction indicated by arrows 1606 such that a fracture will propagate away from the score along line 1608, thereby separating the assembly into two pieces. This procedure can be repeated along each area of reduced cross-sectional thickness 1509 until the multi-unit assembly 1500 has been completely subdivided into single aperture cover assemblies that are substantially identical to those produced by the earlier method described herein. In other embodiments, instead of using the score-and-break method, the cover assemblies may be cut apart, preferably from the frame side along the path indicated by arrow 1602 (i.e., between the window portions 1512), using mechanical cutting, dicing wheel, laser, water jet or other parting technology.

Figure 17A:
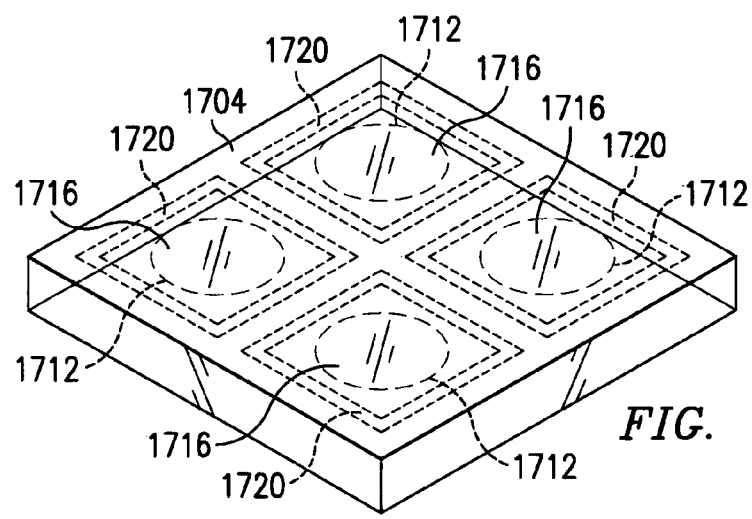
FIGS. 17a and 17b illustrate the manufacture of multiple cover assemblies in accordance with yet another embodiment, specifically.
Figure 17B:
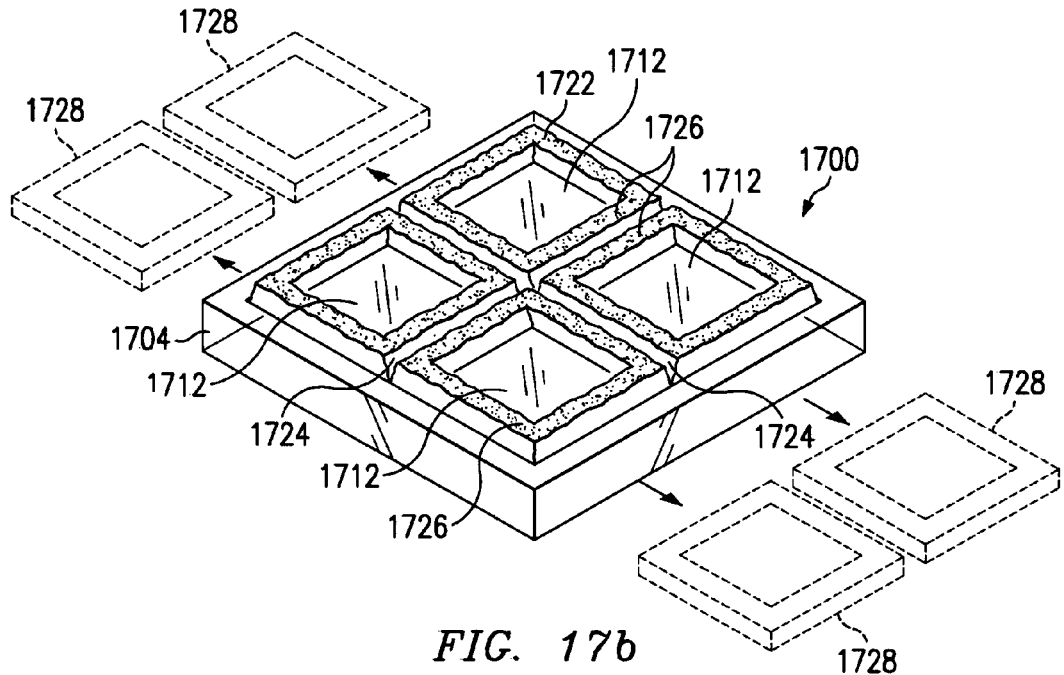

Referring now to FIGS. 17*a* and 17*b*, there is illustrated yet another method for simultaneously manufacturing multiple cover assemblies. This method expands upon the cold gas dynamic spray technique used to build an integral frame/heat spreader directly upon the transparent sheet material as previously illustrated in connection with FIGS. 12*a* through 12*c* and FIGS. 13*a* through 13*c*. As shown in FIG. 17*a*, the process starts with a sheet of nonmetallic transparent material 1704 having a plurality of window portions 1712 defined thereupon, each window portion having finished top and bottom surfaces 1714 and 1716, respectively. The properties and characteristics of the transparent sheet 1704 are substantially identical to those in the embodiments previously discussed. The next step of the process involves preparing a plurality of frame attachment areas 1720 (denoted by the path of the broken line surrounding each window portion 1712), each frame attachment area 1720 circumscribing one of the window portions 1712. As in previous embodiments, the step of preparing the frame attachment areas may comprise cleaning, roughening, grinding or otherwise modifying the frame attachment areas in preparation for metallization.

The next step in this process is metallizing the prepared frame attachment areas on the sheet, i.e., this metallization may be performed using a cold gas dynamic spray technology or where the layers are relatively thin, using a CVD, physical vapor deposition or other conventional metal deposition techniques. It will be appreciated that the primary purpose of this step is to apply metal layers necessary to obtain good adhesion to the transparent sheet 1704 and/or to meet the metallurgical requirements for corrosion prevention, etc.

Referring now to FIG. 17*b*, the next step of the process is depositing metal onto the prepared/metallized frame attachment areas of the sheet 1704 using cold gas dynamic spray deposition techniques until a built-up metal frame 1722 is formed upon the sheet having a seal-ring area 1726 that is a predetermined vertical thickness above the frame attachment areas, thus creating a multi-unit assembly having an inherent hermetic seal between the frame 1722 and the sheet 1704 circumscribing each window portion 1712. In some embodiments, reduced cross-sectional thickness areas 1724 are formed by selectively depositing the metal during the cold spray deposition. In other embodiments, the reduced cross-sectional area sections 1724 may be formed following deposition of the frame/heat spreader 1722 through the use of grinding, cutting or other mechanical techniques such as laser ablation and water jet. In addition, the reduced cross-sectional area sections 1724 may be formed following deposition of the frame/heat spreader 1722 through the use of photo-chemical machining (PCM).

The next step of the process, while not required is strongly preferred, is to flatten, if necessary, the seal-ring area 1726 of the sprayed-on frame 1722 to meet the flatness requirements for joining it to the package base 104. This flattening can be accomplished by mechanical means, e.g., grinding, lapping, polishing, etc., or by other techniques such as laser ablation.

The next step of the process, which, while not required, is strongly preferred, is to add additional metallic layers, e.g., a nickel layer and preferably also a gold layer, to the seal-ring area 1726 of the sprayed-on frame 1722 to facilitate welding the cover assembly to the package base 104. These metallic layers are preferably added using a solution bath plating process, e.g., solution bath plating, although other techniques may be used.

The next step of the process is dividing the multi-unit assembly 1700 along each frame wall section common between two window portions 1712 while, at the same time, preserving and maintaining the hermetic seal circumscribing each window portion. After dividing the multi-unit 1700, a plurality of single aperture cover assemblies 1728 (shown in broken line) will be produced, each one being substantially identical to the single aperture cover assemblies produced using the method described in FIGS. 12*a* through 12*c* and FIGS. 13*a* through 13*c*. All of the options, characteristics and techniques described for use in the single unit cover assembly produced using cold gas dynamic spray technology are applicable to this embodiment. It will be appreciated that certain operations for example, the flattening of the frame and the plating of the frame with additional metallic layers, may be performed on the multi-unit assembly 1700, prior to separation of the individual units, or on the individual units after separation.

Figure 18A:
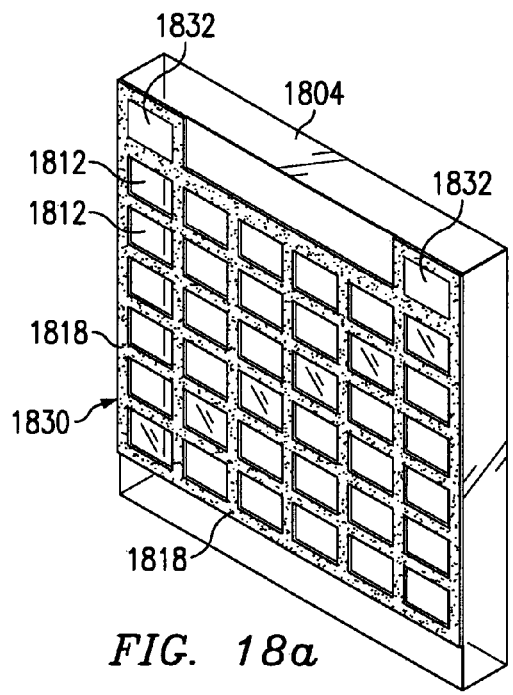
FIGS. 18a-18c illustrate an assembly configuration suitable for use with electrical resistance heating; specifically.
Figure 18B:
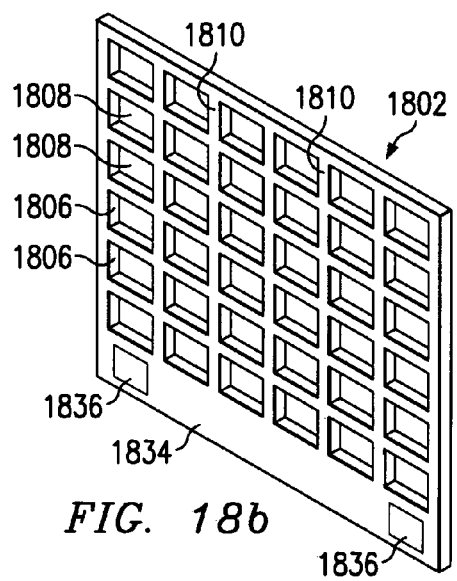
Figure 18C:
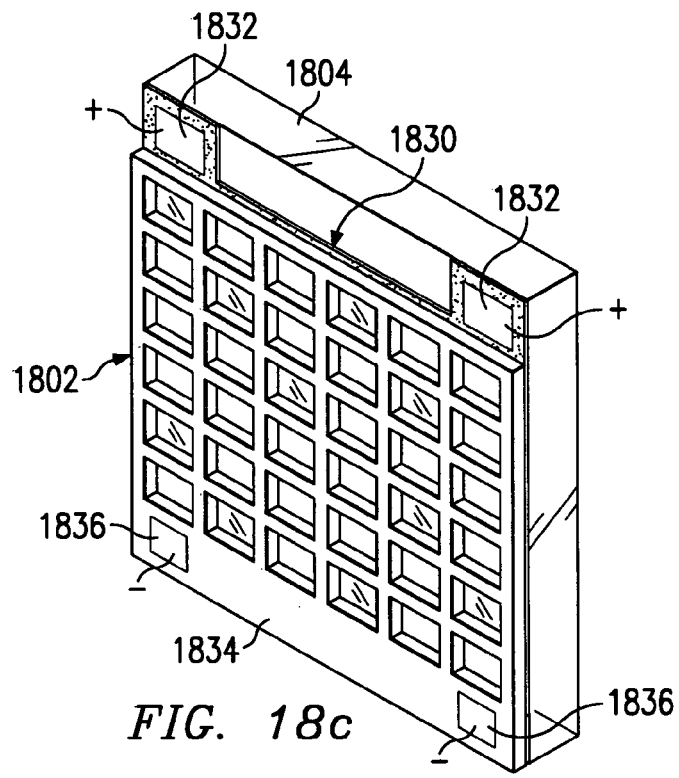

As previously described, heating the junction region between the metallized seal-ring area of the transparent sheet and the seal-ring area of the frame is required for forming the hermetic seal therebetween. Also as previously described, this heating may be accomplished using a furnace, oven, or various electrical heating techniques, including electrical resistance heating (ERH). Referring now to FIGS. 18a-18c, there is illustrated methods of utilizing electric resistance heating to manufacture multiple cover assemblies simultaneously.

Referring first to FIG. 18a, there is illustrated a transparent sheet 1804 having a plurality of seal-ring areas 1818 laid out in a rectangular arrangement around a plurality of window portions 1812. These seal-ring areas 1818 have been first prepared, and then metallized with one or more metal or metal alloy layers, as previously described herein. The transparent sheet 1804 further includes an electrode portion 1830 that has been metallized, but does not circumscribe any window portions 1812. This electrode portion is electrically connected to the metallized seal-ring areas 1818 of the sheet. One or more electrode pads 1832 may be provided on the electrode portion 1830 to receive electrical energy from electrodes during the subsequent ERH procedure.

Referring now to FIG. 18b, there is illustrated a frame 1802 having a plurality of sidewalls 1806 laid out in a rectangular arrangement around a plurality of frame apertures 1808. The apertures 1808 are disposed so as to correspond with the positions of the window portions 1812 of the sheet 1804, and the sidewalls 1806 are disposed so that frame seal-ring areas 1810 (located thereupon) correspond with the positions of the sheet seal-ring areas 1818 of the sheet. The frame is metallic or metallized in order to facilitate joining as previously described herein. The frame 1802 further includes an electrode portion 1834 that does not circumscribe any frame apertures 1808. This frame electrode portion 1834 is positioned so as not to correspond to the position of the sheet electrode portion 1830, and preferably is disposed on an opposing side of the sheet-window/frame-grid assembly (i.e., when the sheet is assembled against the frame). The frame electrode portion 1834 is electrically connected to the metallized frame seal-ring areas 1810. One or more electrode pads 1836 may be provided on the electrode portion 1834 to receive electrical energy from electrodes during the subsequent ERH procedure.

Referring now to FIG. 18c, the sheet 1804 is shown positioned against the frame 1802 in preparation for heating to produce the hermetic seal therebetween. If applicable, solder or a solder preform has been positioned therebetween as previously described. It will be appreciated that when the transparent sheet 1804 is brought against the frame 1802, the metallized seal-ring areas 1818 on the lower surface of the sheet will be in electrical contact with the metallized seal-ring areas 1810 on the upper surface of the frame. However, the sheet electrode portion 1830 and the frame electrode portion 1834 will not be in direct contact with one another, but instead will be electrically connected only through the metallized seal-ring areas 1818 and 1810 to which they are, respectively, electrically connected. When an electrical potential is applied from electrode pads 1832 to electrode pads 1836 (denoted by the "+" and "−" symbols adjacent to the electrodes), electrical current flows through the junction region of the entire sheet-window/frame-grid assembly. This current flow produces electrical resistance heating (ERH) due to the resistance inherent in the metallic layers. In some embodiments, this electrical resistance heating may be sufficient to supply the necessary heat, in and of itself, to result in TC bonding, soldering, or other hermetic seal formation between the sheet 1804 and the frame 1802 in order to form a multi-unit assembly. In other embodiments, however, electrical resistance heating may be combined with other heating forms such as furnace or oven pre-heating in order to supply the necessary heat required for bonding to form the multi-unit assembly.

After bonding the sheet 1804 to the frame 1802 to form the multi-unit assembly, the sheet electrode portion 1830 and the frame electrode portion 1834 can be cut away and discarded, having served their function of providing electrical access for external electrodes (or other electrical supply members) to the metallized seal-ring areas of the sheet and frame, respectively. The removal of these "sacrificial" electrode portions 1830 and 1834 may occur before or during the "dicing" process step, i.e., the separating of the multi-unit assembly into individual cover assemblies. It will be appreciated that any of the technologies previously described herein for separating a multi-unit assembly into individual cover assemblies can be used for the dicing step of separating a multi-unit assembly fabricated using ERH heating.

Where ERH is to be used for manufacturing multiple cover assemblies simultaneously, the configuration of the sheet-window/frame-grid array and/or the placement of the electrodes portions within the sheet-window/frame-grid array may be selected to modify the flow of current through the junction region during heating. The primary type of modification is to even the flow of current through the various portions of the sheet-window/frame-grid during heating to produce more even temperatures, i.e., to avoid "hot spots" or "cold spots."

Referring now to FIGS. 19a-19f, there are illustrated various sheet-window/frame-grid configurations adapted for producing more even temperatures during ERH. In each of FIGS. 19a-19f, there is shown a sheet-window/frame-grid array 1900 comprising a prepared, metallized transparent sheet 1904 overlying a prepared, metallic/metallized frame 1902. The window portions of the sheet 1904 directly overlie the frame apertures of the frame 1902, and the metallized seal-ring areas of the sheet directly overlie the seal-ring areas of the frame (it will be appreciated that metallized portions of the sheet 1904 and the frame 1902 appear coincident in these figures). Metallized electrode portions formed on the transparent sheet 1904 are denoted by reference letters A, B, C and D. These electrode portions A, B, C and D are electrically connected to the adjoining sheet seal-ring areas of the sheet, but are electrically insulated from one another by non-metallized areas 1906 of the sheet. An external electrode is applied to the top of the metallic/metallized frame (on the side opposite from the sheet) across the area denoted by reference letter E. For bonding or soldering, electrical power is applied at the electrodes, e.g., one line to electrodes A, B, C and D simultaneously, and the other line to electrode E, or alternatively, one line in sequence to each of electrode A, B, C and D, and the other line to electrode E. It will be appreciated that many other combinations of electrode powering are within the scope of the invention.

Figure 19A:
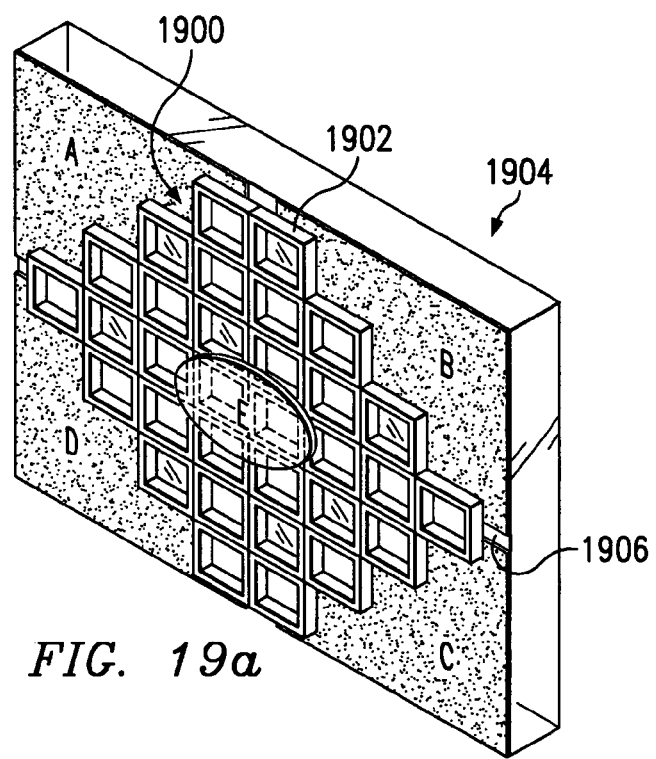
FIGS. 19a-19f illustrate multi-unit assembly configurations suitable for heating with electrical resistance heating.
Figure 19B:
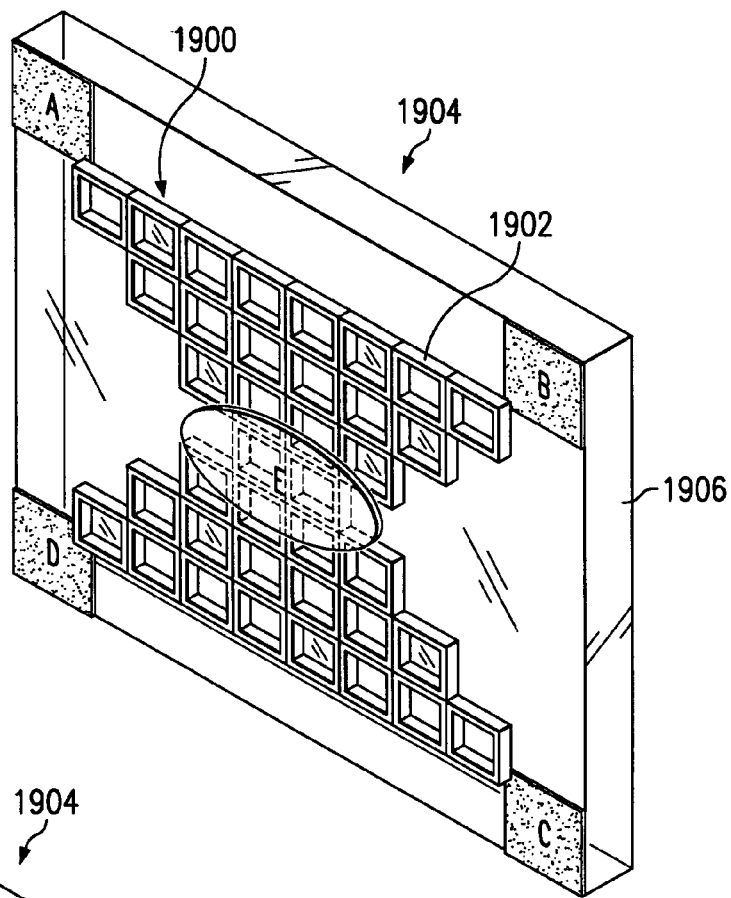
Figure 19C:
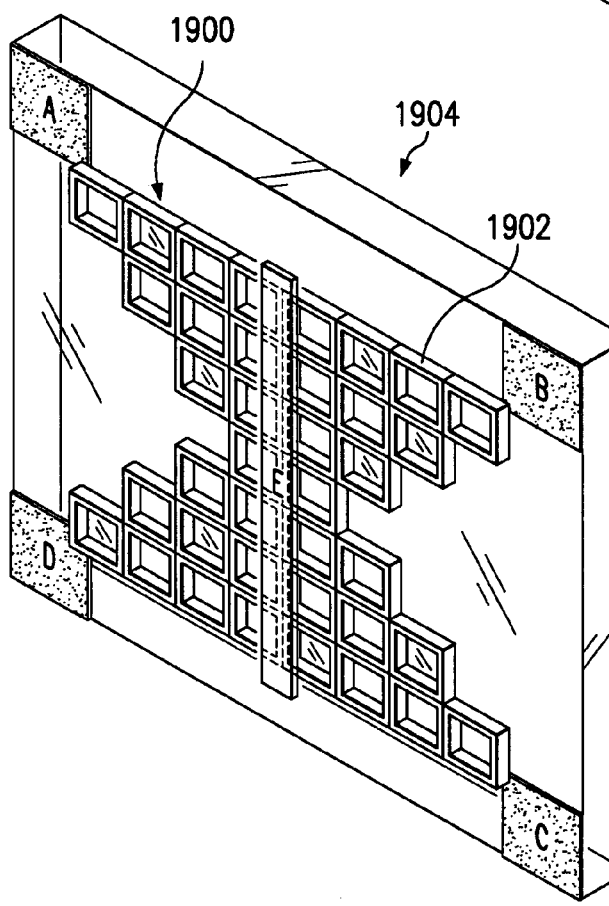
Figure 19D:
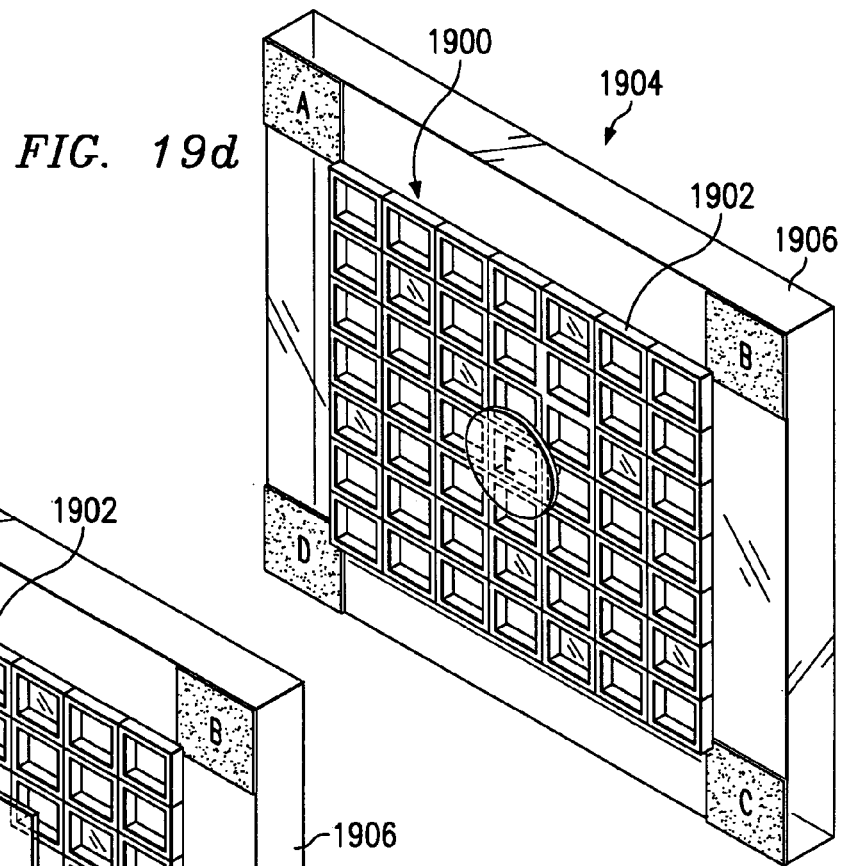
Figure 19E:
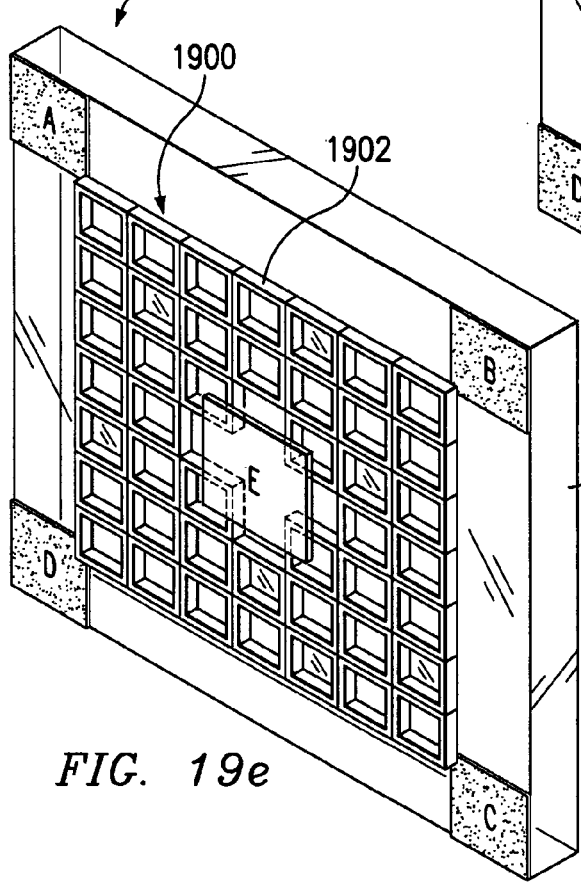
Figure 19F:
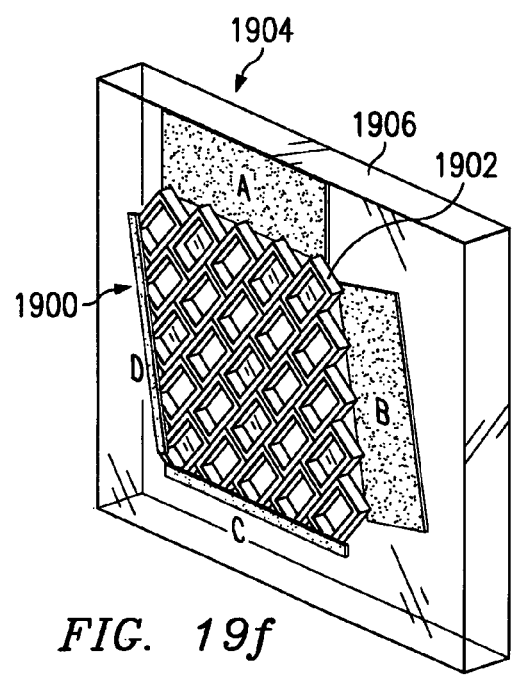

Referring to FIG. 19f, this embodiment illustrates a sheet-window/frame-grid 1900 having a "shingle" configuration, i.e., where the seal-ring areas between the window portions/frame apertures do not form continuous straight lines across the assembly array. Shingle-arrangement frame assemblies are more labor-intensive to separate using scribe-and-break or cutting procedures. Separating such assemblies requires that each row first be separated from the overall grid, and then that individual cover assemblies be separated from the row by separate scribe-and-break or cutting operations. Nevertheless, use of shingle-arrangement assemblies may have benefits relating to heating using ERH techniques.

It will be understood that a metal frame such as 1802 or 1902, which may contain one or more added layers on its exterior, including but not limited to metal or metal alloy layers, may be diffusion bonded to a non-metallized sheet using ERH techniques to apply heat to the frame. The amount of temperature rise throughout the thickness of the non-metallized sheet will depend on the intensity and duration of the application of the electrical power (voltage and amperage) to the frame, as well as other factors. An innerlayer or interlayer material may be employed between the frame and the sheet during the diffusion bonding process, as discussed previously.

It will further be appreciated that the terms "thermal compression bonding" (and its abbreviation "TC bonding") and "diffusion bonding" are used interchangeably throughout this application. The term "diffusion bonding" is preferred by metallurgists while the term "thermal compression bonding" is preferred in many industries (e.g., semiconductor manufacturing) to avoid possible confusion with other types of "diffusion" processes used for creating semiconductor devices. Regardless of which term is used, as previously discussed, diffusion bonding refers to the family of bonding methods using heat, pressure, specific positive or negative pressure atmospheres and time alone to create a bond between mating surfaces at a temperature below the normal fusing temperature of either mating surface. In other words, neither mating surface is intentionally melted, and no melted filler material is added, nor any chemical adhesives used.

As previously described, diffusion bonding utilizes a combination of elevated heat and pressure to hermetically bond two surfaces together without first causing one or both of the adjoining surfaces to melt (as is the case with conventional soldering, brazing and welding processes). When making optical cover assemblies, wafer level assemblies or other temperature-sensitive articles, it is almost always required that the bonding temperatures remain below some upper limit. For example, in optical cover assemblies, the bonding temperature should be below the $T_G$ and the softening temperature, $T_S$, of the sheet material so as not to affect the pre-existing optical characteristics of the sheet. As another example, in wafer level assemblies, the bonding temperature should be below the upper temperature limit for the embedded micro device and/or its operating atmosphere (i.e., the gas environment inside the sealed package). However, the specific temperature and pressure parameters required to produce a hermetic diffusion bond can vary widely depending upon the nature and composition of the two mating surfaces being joined. Therefore, it is possible that some combinations of transparent sheet material (e.g., glass) and frame material (e.g., metals or metallized non-metals), or some combinations of frame materials and substrate materials (e.g., silicon, alumina or metals), will have a diffusion bonding temperature that exceeds the $T_G$ and/or the $T_S$ of the sheet material, or that exceeds some other temperature limit. In such cases, it might appear that diffusion bonding is unsuitable for use in hermetically joining the components together if the temperature limits are to be followed. In fact, however, it has been discovered that the use of "interlayers," i.e., intermediate layers of specially selected material, placed between the sheet material and the frame, or between the frame material and the substrate material, can cause hermetic diffusion bonding to take place at a substantially lower temperature than if the same sheet material was bonded directly to the same frame material, or if the same frame material was bonded directly to the same substrate material. Note that the terms "interlayers" and "innerlayers" are used interchangeably throughout this application, as both terms may be encountered in the art for the same thing.

A properly matched interlayer improves the strength and hermeticity (i.e., gas tightness or vacuum tightness) of a diffusion bond. Further, it may promote the formation of compatible joints, produce a monolithic bond at lower bonding temperatures, reduce internal stresses within the bond zone, and prevent the formation of extremely stable oxides that interfere with diffusion, especially on the surface of Al, Ti and precipitation-hardened alloys. The interlayer is believed to diffuse into the parent material, thereby raising the melting point of the joint as a whole. Depending upon the materials to be joined by diffusion bonding, the interlayer material could be composed of a metal, a metal alloy, a glass material, a solder glass material including solder glass in tape or sheet form, or other materials. In the diffusion bonding of BT5-1 Ti alloy to Armco iron, an interlayer of molybdenum foil 0.3 mm thick has been used. Reliable glass-to-glass and glass-to-metal bonds are achieved with metal interlayers such as Al, Cu, Kovar, Niobium and Ti in the form of foil, usually not over 0.2 mm thick. The interlayers are typically formed into thin preforms shaped like the seal ring area of the mating surfaces to be joined.

It is important to distinguish the use of diffusion bonding interlayers from the use of conventional solder preforms and other processes previously disclosed. For purposes of this application, an interlayer is a material used between sealing surfaces to promote the diffusion bonding of the surfaces by allowing the respective mating surfaces to diffusion bond to the interlayer rather than directly to one another. For example, with the proper interlayer material, the diffusion bonding temperature for the joint between the sheet material and interlayer material, and for the joint between the interlayer material and the frame material, may be substantially below the diffusion bonding temperature of a joint formed directly between the sheet material and the frame material. Thus, use of the interlayer allows diffusion bonding of the sheet to the frame at a temperature that is substantially below the diffusion bonding temperature that would be necessary for bonding that sheet material and that frame material directly. The hermetic joint is still formed by the diffusion bonding process, i.e., none of the materials involved (the sheet material, the interlayer material nor the frame material) melts during the bonding process. This distinguishes diffusion bonding using interlayers from other processes such as the use of solder preforms in which the solder material actually melts to form the bond between the materials being joined. It is possible to use materials conventionally used for solders, for example, Au—Sn solder preforms, as interlayers for diffusion bonding. However, when used as interlayers they are used for their diffusion bonding properties and not as conventional solders (in which they melt).

The use of interlayers in the production of window assemblies or other packaging may provide additional advantages over and above their use as promoting diffusion bonding. These advantages include interlayers that serve as activators for the mating surfaces. Sometimes the interlayer materials will have a higher ductility in comparison to the base materials. The interlayers may also compensate for stresses that arise when the seal involves materials having different coefficients of thermal expansion or other thermal expansion properties. The interlayers may also accelerate the mass transfer or chemical reaction between the layers. Finally, the interlayers may serve as buffers to prevent the formation of undesirable chemical or metallic phases in the joint between components.

Figure 20A:
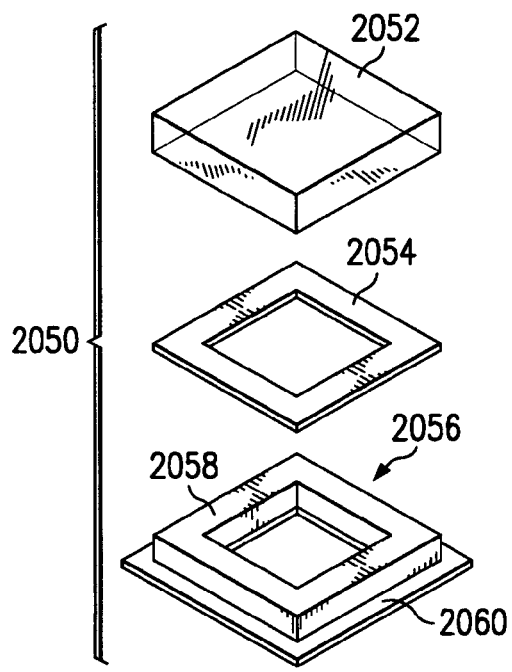
FIG. 20a illustrates an exploded view of a window assembly including interlayers for diffusion bonding.
Figure 20B:
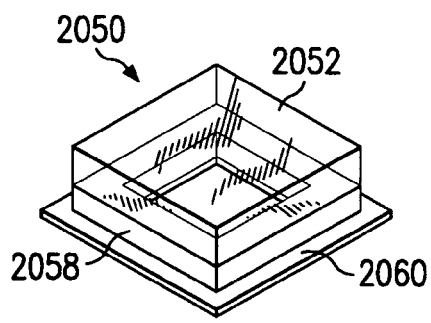
FIG. 20b illustrates the window assembly of FIG. 20a after diffusion bonding.

Referring now to FIGS. 20a and 20b, there is illustrated a window cover assembly including interlayers to promote joining by diffusion bonding. In this embodiment, the window assembly 2050 includes a transparent glass sheet 2052, an interlayer 2054 and a metal or metal alloy base 2056. The base 2056 includes a built-up seal ring area 2058 and a flange 2060 that facilitates the subsequent electric resistance seam welding of the finished window assembly to a package base or other higher level portion of the final component. The interlayer 2054 in this embodiment takes the form of a metallic preform that has the configuration selected to match the seal ring area 2058 of the frame. To form the hermetic window assembly, the sheet 2052, interlayer 2054 and frame 2056 are placed in a fixture (i.e., tooling) or mechanical apparatus (not shown) which can provide the required predetermined bonding pressure between the seal ring areas of the respective components. In some cases, the fixture may serve only to align the components during bonding, while the elevated bonding pressure is applied from a mechanical apparatus such as a ram. In other cases, however, the fixture may be designed to constrain the expansion of the stacked components during heating (i.e., along the stacking axis), whereby the thermal expansion of the assembly components toward the fixture, and of the fixture itself toward the components, will "self-generate" some or all of the necessary bonding pressures between the components as the temperature increases.

Figure 20C:
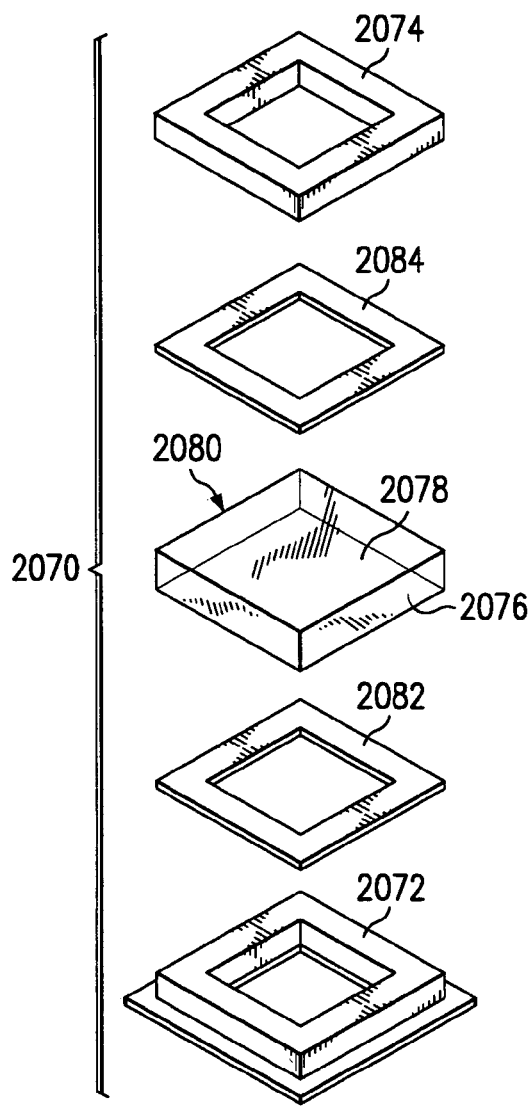
FIGS. 20c and 20d illustrate an additional embodiment of the invention having internal and external frames; specifically.
Figure 20D:
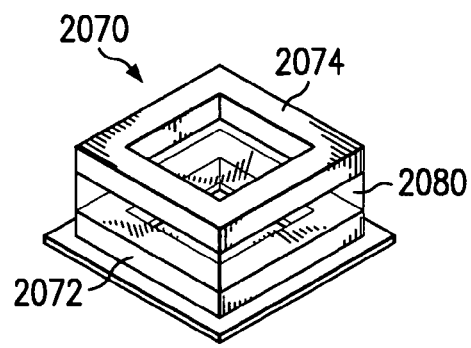
Figure 20E:
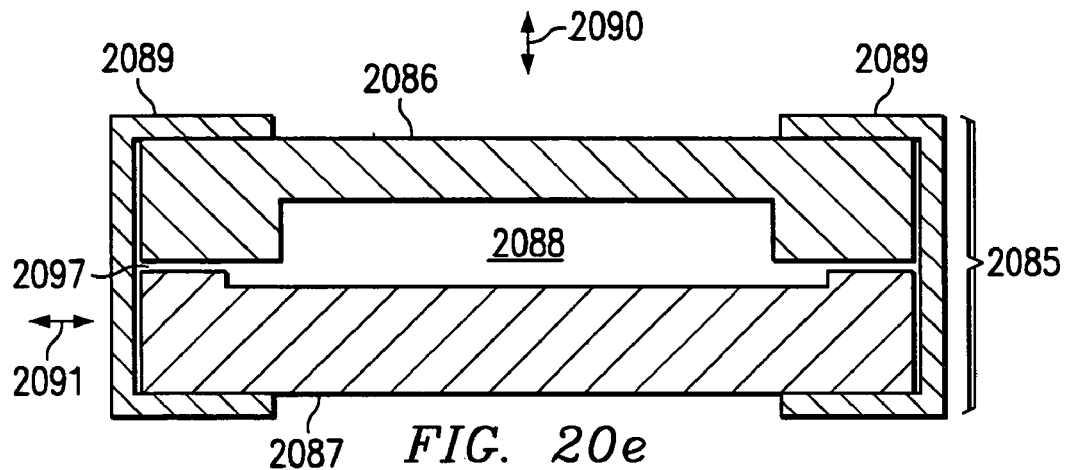
FIGS. 20e, 20f and 20g, illustrate fixtures for aligning and compressing the window assemblies during diffusion bonding; specifically.
Figure 20F:
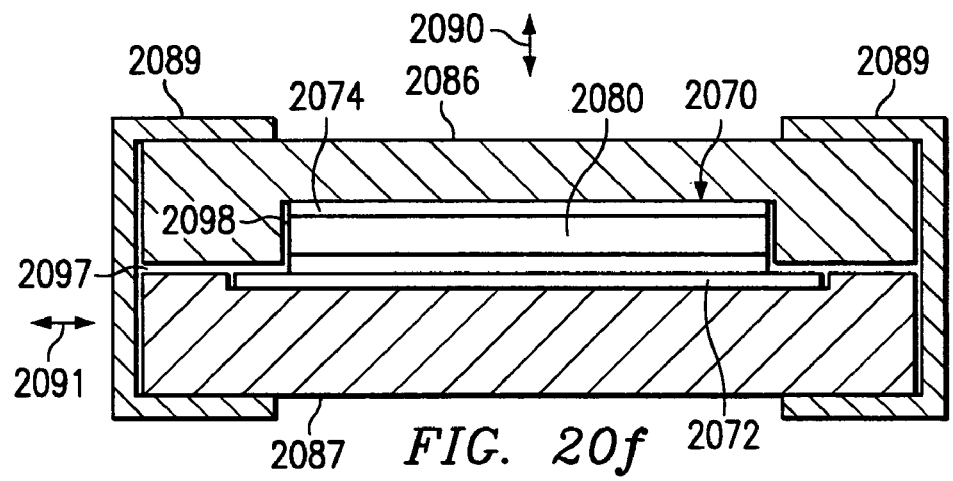

Referring now to FIGS. 20e and 20f, an example of a "self-compressing" fixture assembly is shown. As best seen in FIG. 20e, the fixture 2085 includes an upper fixture member 2086 and a lower fixture member 2087 that together define a cavity 2088 for receiving the window assembly components to be bonded. Clamps 2089 are provided which constrain the outward movement of the fixture members 2086 and 2087 in the axial direction (denoted by arrow 2090). Generally, the CTE of the material forming the clamps 2089 will be lower than the CTE of the material forming the fixture members 2086 and 2087. FIG. 20f shows the components for the window assembly 2070 (FIGS. 20c and 20d) loaded into the cavity 2088 of the fixture 2085 in preparation for bonding. Note that while the fixture members 2086 and 2087 are in contact with the upper and lower surfaces of the window components, a small gap 2097 is left between the fixture members themselves to allow the members to expand axially toward one another when heated (since they are constrained by the clamps). Also note that a small gap 2098 is generally left between the lateral sides of the window assembly components and the fixture members 2086 and 2087 to minimize the lateral force exerted on the components by the fixture members during heating. When the fixture 2085 is heated, the inner surfaces (i.e., facing the cavity 2088) of the fixture members 2086 and 2087 will expand due to thermal expansion) axially toward one another against the window components, and the window components will expand outward against the fixture. These thermal expansions can press the window components against one another with great force in the axial direction to facilitate diffusion bonding. It will be appreciated that thermal expansion of the fixture members 2086 and 2087 will also occur in the lateral direction (denoted by arrow 2091). While this lateral expansion is not generally desired, in most cases is will not present an obstacle to the use of self-compressing fixtures.

Figure 20G:
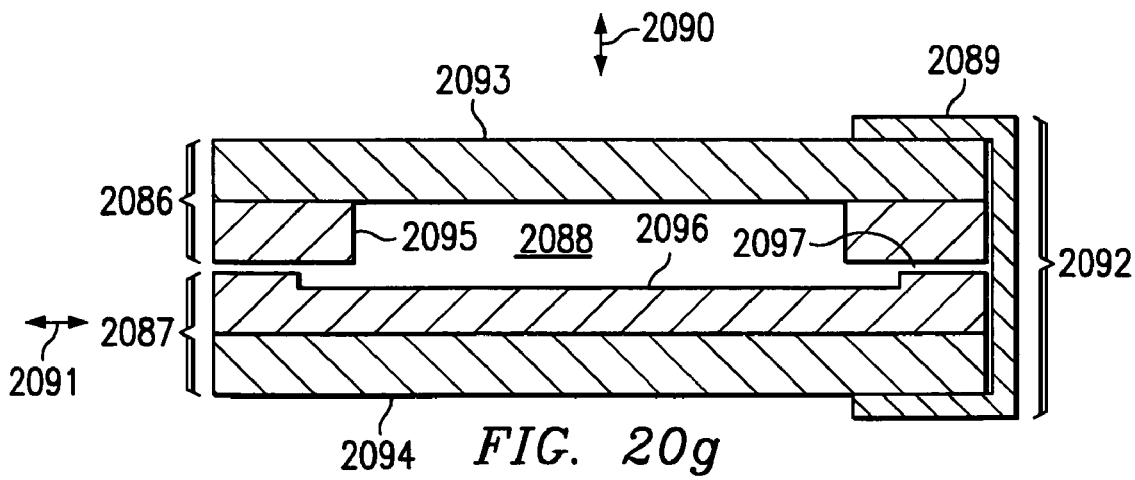

Referring now to FIG. 20g, there is illustrated an alternative self-compressing fixture adapted to enhance thermal expansion (and hence compression) in the axial direction 2090 without causing excessive thermal expansion in the lateral direction 2091. As with the previous example, alternative fixture 2092 includes an upper fixture member 2086 and a lower fixture member 2087 defining a cavity 2088 for receiving the window assembly components to be bonded, and clamps 2089 (only one of which is shown for purposes of illustration) which constrain the outward movement of the fixture members in the axial direction 2090. Also as in the previous embodiment, a first small gap 2097 is present between the fixture members 2086 and 2087 themselves, and a second small gap 2098 is present between the lateral sides of the window components and the fixture members. Unlike the previous embodiment, however, each fixture member 2086 and 2087 of the alternative fixture 2092 comprises two sub-members, namely, first sub-members 2093 and 2094, respectively, adapted to bear primarily axially against the window assembly components (not shown), and second sub-members 2095 and 2096, respectively, adapted to hold and align the window assembly components in the cavity. By selecting a material for the first sub-members 2093 and 2094 having a high CTE, axial expansion (and hence compression) during heating will be correspondingly high. However, lateral expansion and relative lateral movement between the second sub-members 2095 and 2096 and the window components can be minimized by selecting a different material for the second sub-members, namely, a material having a lower CTE (i.e., lower than the CTE for the first sub-members). Preferably, the CTE of the second sub-members 2095 and 2096 will be close to the CTE for the adjacent window components.

Referring again to FIGS. 20a and 20b, the assembled (but not yet bonded) components of the window assembly 2050 are then heated until the diffusion bonding pressure/temperature conditions are reached, and these conditions are maintained until a first diffusion bond is formed between the sheet 2052 and the interlayer 2054, and a second diffusion bond is formed between the interlayer 2054 and the seal ring area 2058 of the frame 2056. It will be understood that the first bond between the sheet and the interlayer may actually occur before, after or simultaneously with, the second bond between the interlayer and the frame. As previously explained, it will also be understood that the order of applying heat and pressure to form the diffusion bond is not believed to be significant, i.e., in other words whether the pre-determined pressure is applied, and then the heat is applied or whether the heat is applied and then the predetermined pressure is applied, or whether both heat and pressure are increased simultaneously is not believed to be significant, rather the diffusion bonding will occur when the preselected pressure and temperature are present in the bond region for a sufficient amount of time. After the diffusion bonds are formed, the sheet 2052 will be hermetically bonded to the frame 2056 to form a completed window assembly 2050 as shown in FIG. 20b.

In further embodiments of the current invention, it has been discovered that clean, i.e., unmetallized, glass windows may be directly bonded to frames of Kovar or other metallic materials using diffusion bonding. This is in addition to the diffusion bonding of metallized glass windows to Kovar frames as previously described. Optionally, the direct diffusion bonding of unmetallized glass windows to metallic frames may be enhanced through the use of certain compounds, e.g., molybdenum-manganese, on the frames. Whether the glass is metallized or unmetallized, the diffusion bonding is most commonly performed in a vacuum, however, it may be performed in various other atmospheres. The use of oxidizing atmospheres is typically not required, however, as any resulting oxides tend to be dispersed by pressures encountered in the bonding operation. In still other embodiments, of the invention, diffusion bonding can be used for joining frames made of Kovar and other metallic materials directly to sheets or wafers of semiconductor materials including silicon and gallium arsenide (GaAs).

Since successful diffusion bonding requires the mating surfaces being bonded to be brought into intimate contact with one another, the surface finish characteristics of the mating surfaces may be important parameters of the invention. It is believed that the following mating surface parameters will allow successful diffusion bonding between the mating surfaces of Kovar frames and thin sheet materials including, but not limited to, Kovar to metallized glass, Kovar to clean (i.e., unmetallized) glass, Kovar to metallized silicon, Kovar to clean (i.e., unmetallized) silicon, Kovar to metallized gallium arsenide (GaAs) and Kovar to clean (i.e., unmetallized) GaAs: Parallelism of sheet material (i.e., uniformity of thickness) within the range of about 12.7 microns; Surface flatness (i.e., deviation in height per unit length when placed on ideal flat surface) within range from 5 mils/inch to about 10 mils/inch; Surface roughness not more than about 16 micro-inches (0.4064 microns). These surface parameters can also be used for diffusion bonding of Kovar directly to Kovar, e.g., to manufacture built-up metallic frames.

The temperature parameters for diffusion bonding between the mating surfaces of Kovar frames and the thin sheet materials described above are believed to be within the range from about 40% to about 70% of the absolute melting temperature, in degrees Kelvin, of the parent material having the lower melting temperature. When diffusion bonding is used for bonding optically finished glass or other transparent materials, the bonding temperature may be selected to be below the $T_G$ and/or the softening temperature of the for the glass other transparent materials, thereby avoiding damage to the optical finish. Depending upon the bonding temperature selected, in some embodiments the application of optical and/or protective coatings to the transparent sheets (i.e., that become the windows) may be performed after the bonding of the sheets to the frames, rather than before bonding. In other embodiments, some of the optical and/or protective coatings may be applied to the glass sheets prior to bonding, while other coatings may be applied subsequent to bonding. With regard to pressure parameters, a pressure of 105.5 kg/cm$^2$ (500 psi) is believed suitable for diffusion bonding Kovar frames and the thin sheet materials previously described.

It will be noted that since the diffusion bonding occurs at high temperature, the CTE of the glass sheet should be matched to the CTE of the metallic frame. To the extent that the CTEs cannot be completely matched (e.g., due to non-linearities in the CTEs over the range of expected temperatures), then it is preferred that the CTE of the glass sheet be lower than the CTE of the metallic frame. This will result in the metallic frame shrinking more than the glass sheet as the combined window/frame assembly cools from its elevated bonding temperature (or from an elevated operational temperature) back to room temperature. The glass will therefore be subjected primarily to compression stress rather than tension, which reduces the tendency for cracking.

Referring now to FIGS. 20c and 20d, there is illustrated an additional embodiment of the invention, a window assembly having internal and external frames. FIG. 20c illustrates the components of window assembly 2070 before assembly, while FIG. 20d illustrates the completed assembly. The window assembly 2070 includes separate frame members 2072 and 2074, which are bonded (using diffusion bonding, soldering, brazing or other techniques disclosed herein) to the inner and outer surfaces 2076 and 2078, respectively, of the transparent sheet 2080. In other words, the transparent window material is "sandwiched" between a layer of frame material on the top of the window and a layer of frame material on the bottom of the window. Interlayers 2082 and 2084 may be provided for diffusion bonding as previously described, or alternatively, solder preforms (also shown as 2082 and 2084) may be provided for bonding by soldering as previously described.

Typically, the same bonding technique will be used for bonding both the internal and external frames to the window, however, this is not required. Similarly, the internal and external bonds will typically be formed at the same time, however, this in not required. The internal frame 2072 must, however, be hermetically bonded to the window 2080 to produce a hermetic window assembly. A hermetic bond is not typically required for bonding the external frame 2074 to the window 2080, however, it may be preferred for a number of reasons.

One benefit of window assemblies having the so-called "sandwiched" frame configuration is to equalize the stresses on the internal and external surfaces, 2076 and 2078, respectively, of the transparent sheet 2080 that are caused by differential thermal expansion characteristics of the frames 2072 and 2074 and sheet (due to unequal CTE), e.g., during cooling after bonding, or during thermal cycling. Put another way, when a window assembly has a frame bonded to only one surface, uneven expansion and contraction between the frame and sheet may produce significant shear stresses within the sheet. These shear stresses may be strong enough to cause shear failure (e.g., cracking or flaking) within the transparent sheet even though the window-to-frame bond itself remains intact. When a frame is bonded to both the internal and external surfaces of the window, however, the shear stresses within the glass (or other transparent material) may be significantly reduced. This is particularly true if the same material or material having similar CTEs are used for both the internal and external frames. This stress-equalization through the thickness of the window increases the reliability and durability of the assembled window during subsequent thermal cycling and/or physical shock.

Sandwiched construction may be used in window assemblies or in WLP assemblies. Sandwiched construction with internal and external frames is especially advantageous where the sheet and frame materials have significantly different CTEs. In addition to the stress balancing features of sandwiched construction, use of an external frame on the sheet may have additional benefits, including: enhancing thermal spreading across the window; enhancing heat dissipation from the assembly; serving as an optical aperture; facilitating the aligning/fixturing or clamping of the device during bonding or assembly to higher level assemblies; and to display working symbolization.

Figure 21A:
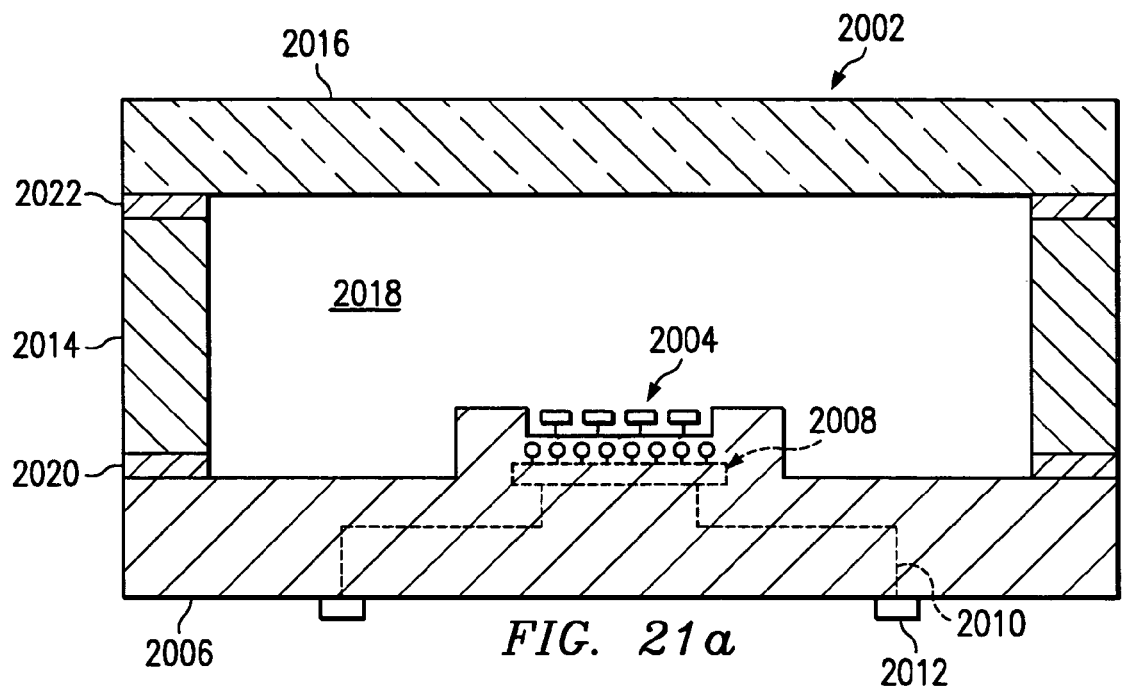
FIGS. 21a-21b are cross-sectional views of wafer-level hermetic micro-device packages in accordance with other embodiments of the invention; specifically.
Figure 21B:
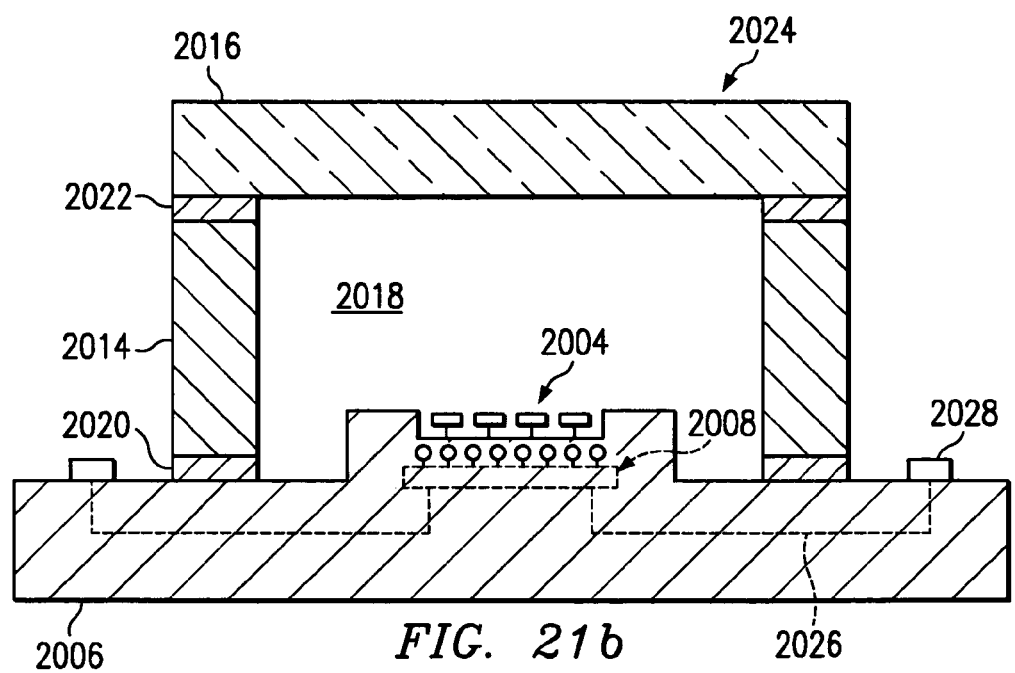

Referring now to FIGS. 21a and 21b, there are illustrated two examples of hermetically sealed wafer-level packages (also known as "WLPs") for micro-devices in accordance with other embodiments of the invention. These embodiments are substantially similar to one another, except that wafer-level package 2002 (FIG. 21a) has reverse-side external electrical connections while wafer-level package 2024 (FIG. 21b) has same-side external electrical connections. The wafer-level packages, while similar in many respects to the discrete device packages previously disclosed herein, utilize the substrate of the micro-device itself, typically a semiconductor substrate, as a portion of the package's hermetic envelope. Such wafer-level packaging provides a very economical method for hermetically encapsulating wafer-fabricated micro-devices, especially where high production volumes are involved. As will be described below, a single micro-device may be packaged using WLP technology, or multiple micro-devices on the original production wafer may be packaged simultaneously using WLP technology in accordance with various aspects of the current invention.

Referring now specifically to FIG. 21a, the wafer-level package 2002 encloses one or more micro-devices 2004, e.g., a MEMS device or MOEMS device fabricated on a substrate 2006. The substrate 2006 is typically a wafer of silicon (Si) or gallium arsenide (GaAs) upon which electronic circuitry 2008 associated with the micro-device 2004 is formed using known semiconductor fabrication methods. Electrical vias 2010 (shown in broken line) may be formed in the substrate 2006 using known methods to connect the circuitry 2008 to externally accessible connection pads 2012 disposed on the reverse side (i.e., with respect to the device) of the substrate. It will be appreciated that the path of vias 2010 shown in FIG. 20 has been simplified for purposes of illustration. One end of a frame 2014 made of Kovar or other metallic material is hermetically bonded to the substrate 2006, and a transparent window 2016 is, in turn, hermetically bonded to the other end of the frame to complete the hermetic envelope sealing the micro-device within the cavity 2018. The frame-mating surfaces of the substrate 2006 may be prepared or metallized with one or more metal layers 2020 to facilitate bonding to the frame, and similarly the frame-mating surfaces of the window 2016 may be prepared or metallized with one or more metal layers 2022 for the same purpose.

Referring now specifically to FIG. 21b, the wafer-level package 2024 is substantially identical to the package 2002 previously described, except that in this case the vias 2026 are routed to external connection pads 2028 disposed on the same side of the substrate 2006. Obviously, in such embodiments, the frame 2014 and window 2016 are dimensioned to leave uncovered a portion of the substrate's upper surface.

Figure 21C:
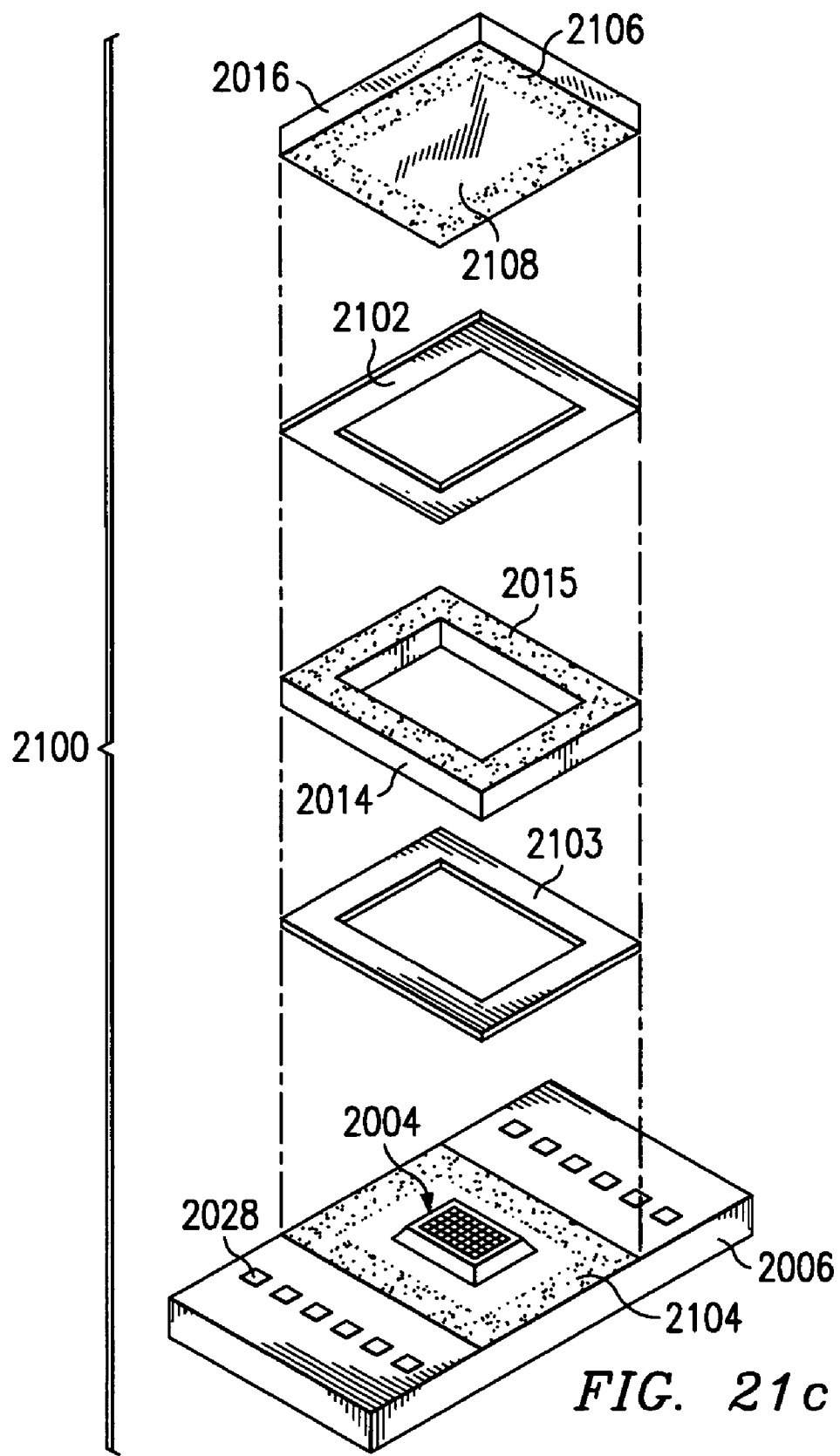
FIG. 21c is an exploded view illustrating the method of assembly of the package of FIG. 21b.

Referring now to FIG. 21c, there is shown an exploded view of a WLP 2100 illustrating one possible method of manufacture. To package individual or multiple micro-devices using WLP methods, the following components are necessary: a substrate 2006 having a micro-device 2004 thereupon; a frame/spacer 2014 having a continuous sidewall 2015 and that is "taller" than the device to be encapsulated (to provide clearance); and a transparent sheet or window 2016. Depending upon the bonding method to be used, solder preforms of a metal alloy or glass composition, or interlayers for diffusion bonding 2102 and 2103 may also be required. It will be appreciated that the top preform 2102 (between the window 2106 and the frame 2014) may be a different material than the bottom preform 2103 (between the frame 2014 and the substrate 2006).

Briefly, the steps for forming the package 2100 are as follows: A first frame-attachment area 2104 is prepared on the surface of the wafer substrate 2006 of the subject micro-device. This first frame-attachment area 2104 has a plan (i.e., configuration when viewed from above) that circumscribes the micro-device or micro-devices 2004 on the substrate 2006. A second frame-attachment area 2106 is prepared on the surface of the window 2016. The second frame-attachment area 2106 typically has a plan substantially corresponding to the plan of the first frame-attachment area 2104. The execution order of the previous two steps is immaterial. Next, the frame/spacer 2014 is positioned between the substrate 2006 and the window 2016. The frame/spacer 2014 has a plan substantially corresponding to, and in register with, the plans of the first and second frame-attachment areas 2104 and 2106, respectively. If applicable, the solder preforms 2102 and 2103 or diffusion bonding interlayers 2102 and 2103 are interposed at this time between the frame/spacer 2014 and the frame-attachment areas 2104 and/or 2106. Finally, the substrate 2006, frame/spacer 2014 and window 2016 are bonded together (facilitated by solder or glass preforms 2102 and 2103 or diffusion bonding interlayers 2102 and 2103, if applicable) to form a hermetically sealed package encapsulating micro-device 2004 within, but allowing light to travel to and/or from the micro-device through the transparent aperture area 2108 of the window.

It will be understood that diffusion bonding of the package 2100 can be performed in a single (combined) step or in a number of sub-steps. For example, all five components (sheet 2016, first interlayer 2102, frame 2014, second interlayer 2103 and substrate 2006) could be stacked in a single fixture and simultaneously heated and pressed together to cause diffusion bonds to form at each of the sealing surfaces. Alternatively, the window sheet 2016 may be first diffusion bonded to the frame 2014 using first interlayer 2102 (making a first subassembly), and then this first subassembly may be subsequently diffusion bonded to the substrate 2006 using second interlayer 2103. In another alternative, the frame 2014 could be diffusion bonded to the substrate 2006 using second interlayer 2103, and then the transparent sheet 2016 may subsequently be bonded to the sub-assembly using first interlayer 2102. The choice of which bonding sequence to be used would, of course, depend upon the exact materials to be used, the heat sensitivity of the transparent material in the sheet 2016, the heat sensitivity of the micro device 2004 and, perhaps, other parameters such as the expansion characteristics of the frame 2014 and interlayer materials.

It will further be appreciated that the current invention is similar in several respects to the manufacturing of the "stand-alone" hermetic window assemblies previously described. The preparing of the frame-attachment areas 2106 of the window 2016 may be performed using the same techniques previously described for use in preparing the sheet seal-ring area 318, including cleaning, roughening, and/or metallizing with one or more metallic layers as set forth in the earlier Examples 1-96.

While the transparent windowpane 2016 may be roughened (e.g., in preparing the frame-attachment area 2106) to promote adhesion of the first metallic layer being deposited onto it (e.g., by CVD or PVD), the wafer substrate 2006 will not typically be roughened in the same manner. Instead, the initial metallic layer on the wafer substrate 2006 will typically be deposited using conventional wafer fabrication techniques. Where conventional methods of wafer fabrication include the requirement or option of etching a silicon or GaAs wafer to promote adhesion of a metal's deposition, then the same practice may be followed in preparing the frame attachment area 2104 on the wafer substrate 2006 when building WLP devices.

Other wafer or substrate materials include, but are not limited to, glass, diamond and ceramic materials. Some ceramic wafers are known as alumina wafers. These alumina wafers or substrates may be multi-layer substrates, and may be manufactured using Low-Temperature Co-Fired (LTCC) or High-Temperature Co-Fired (HTCC) materials and processes. LTCC and HTCC substrates often have internal and external electrical circuitry or interconnections. This circuitry is typically screen printed onto the ceramic or alumina material layer(s) prior to co-firing the layers together.

Also, any of the bonding techniques and parameters previously described for use on window assemblies may be used to hermetically bond the WLP components to one another, including diffusion bonding/TC bonding with or without the use of interlayers, soldering using a solder preform and soldering using inkjet-dispensed solders. The primary difference is that when making "stand-alone" window assemblies, only two primary components (namely, the transparent sheet/window 304 and frame 302) are bonded together, while when making WLPs, three primary components (namely, the window 2016, frame 2014 and substrate 2006) are bonded together (sometimes simultaneously). Of course, when producing WLPs using soldering techniques, additional components may be required, for example one or more solder preforms 2102 or a quantity of inkjet-dispensed solder. The solder preforms, if used, may be attached to the top and/or bottom of the frame 2014 as one step in the manufacture of that item. This will simplify the alignment of the three major components of the WLP assembly. It will, of course, be appreciated that this pre-attachment of the solder preforms to the frame is also applicable to the "stand-alone" window assemblies previously described. One of the methods for attaching solder preforms to the window 2016, frame 2014 and/or substrate 2006 is to tack the preform in place using a localized heat source.

Prior to soldering components together, cleaning the surfaces of the solder preforms and/or the metallized surfaces of the window 2016, frame 2014 and/or substrate 2006 may be necessary to remove surface oxides. It is desirable to avoid using fluxes during the soldering process to eliminate the need for post-soldering or defluxing. Several surface preparation technologies are available to prepare the metal and solder surfaces for fluxless soldering.

Several other processes may be used for preparing the surfaces of window assemblies or WLP components for soldering to avoid the need to remove fluxes after soldering. A first option is to use what is known in the trade as a no-clean flux. This type of flux is intended to be left in place after soldering. A second option is the use of gas plasma treatments for improving solderability without flux. For example, a non-toxic fluorine-containing gas may be introduced that reacts at the surface of the solder. This reaction forms a crust on the solder and dissolves upon remelt. The welds and joints formed are equal to or better than those formed when using flux. Such plasmas offer benefits including the removal by reduction of oxides and glass to promote improvements in solderability and wire bondability. Such treatments have been indicated on thick film copper, gold and palladium. Additional candidate gases for leaving a clean oxide-free surface include hydrogen and carbon monoxide plasma. Still further candidate gases include hydrogen, argon and freon gas combinations. One version of plasma treatment is known as Plasma-Assisted Dry Soldering (PADS). The PADS process coverts tin oxide (present in fluxless solders when unstable reduced tin oxide reoxidizes upon exposure to air) to oxyfluorides that promote wetting. The conversion film breaks up when the solder melts and allows reflow. The film is understood to be stable for more than a week in air and for more than two weeks when the parts are stored in nitrogen.

As in the previously described methods for manufacture of individual and multiple window assemblies for hermetically packaging discrete micro-devices, the selection of compatible materials for the various components for the manufacture of WLPs is another aspect of the invention. For example, each of the primary components (e.g., window, frame/spacer and wafer substrate) of the WLP will preferably have closely matched CTEs to insure maximum long-term reliability of the hermetic seal. The frame/spacer 2014 may be formed of either a metallic material or of a non-metallic material. The best CTE match will be achieved by forming the frame/spacer 2014 from the same material as either the wafer substrate 2006 or the window 2016. However, gallium arsenide (GaAs) and silicon (Si) (i.e., the materials typically used for the wafer substrate) and most glasses (i.e., the material that is typically used for the window) are relatively brittle, at least in comparison to most metals and metal alloys. These non-metallic materials are therefore typically not as preferred for forming the frame/spacer 2014 as are metals or metal alloys, because the metals and metal alloys typically exhibit better resistance to cracking. In fact, the use of a metal or metal alloy for the frame/spacer 2014 is believed to provide additional resistance to accidental cracking or breaking of the wafer substrate 2006, window 2016 and complete WLP 2002 after bonding.

When a metallic frame/spacer 2014 is employed, it will preferably be plated with either gold alone, or with nickel and then gold, sometimes to facilitate diffusion bonding or soldering, but more often, to provide a surface on the frame/spacer that provides various kinds of protection between the frame/spacer and the atmosphere inside the package. If, however, a non-metallic frame/spacer 2014 is employed, then it might be metallized to facilitate diffusion bonding or soldering. The metal layers used on the frame/spacer 2014 may be the same as those used on the windowpane 304 for the manufacture of window assemblies, e.g., the final layer might be one of chromium, nickel, tin, tin-bismuth and gold.

In selecting compatible materials for the components of WLPs, it is recognized that silicon (Si) has a CTE ranging from about 2.6 PPM/°K at 293°K to about 4.1 PPM/°K at 1400°K. If it is assumed that the operating temperatures for micro-devices such as MEMS and MOEMS will be within the range from about −55°C. to about +125°C., and that the expected diffusion bonding or soldering temperatures will be within the range from about +250°C. to about +500°C., it may be interpolated that silicon wafers of the type used for WLP substrates will have a CTE within the range from about 2.3 PPM/°K to about 2.7 PPM/°K. One metallic material believed suitable for use in frame/spacers 2014 that will be bonded to silicon (Si) substrates is the alloy known as "Low Expansion 39 Alloy," developed by Carpenter Specialty Alloys. Low Expansion 39 Alloy is understood to have a composition (weight percent; nominal analysis) as follows: about 0.05% C, about 0.40% Mn, about 0.25% Si, about 39.0% Ni, and the balance Fe. Low Expansion 39 Alloy has a CTE that is understood to range from about 2.3 PPM/°K over the interval of 25°C. to 93°C., to about 2.7 PPM/°K at 149°C., to about 3.2 PPM/°K at 260°C., and to about 5.8 PPM/°K at 371°C.

Similarly, it is recognized that gallium arsenide (GaAs) of the type used for WLP wafer substrates has a nominal CTE of about 5.8 PPM/°K. Based on material suppliers' data, Kovar alloy is understood to have a CTE ranging from about 5.86 PPM/°K at 20°C. to about 5.12 PPM/°K at 250°C. Thus, Kovar alloy appears to be a good choice for frame/spacers 2014 that will be bonded to GaAs substrates. Another material believed suitable for frame/spacers 2014 that will be bonded to GaAs substrates is the alloy known as Silvar™, developed by Texas Instruments Inc.'s Metallurgical Materials Division, of Attleboro, Mass. It is understood that Silvar™ is a derivative of Kovar with CTE characteristics closely matched to GaAs devices.

With regard to the window/lens for WLPs, it is believed that all of the glasses previously described for use in the manufacture of individual and multiple window assemblies having Kovar frames, e.g., Corning 7052, 7050, 7055, 7056, 7058 and 7062, Kimble (Owens Corning) EN-1, Kimble K650 and K704, Abrisa soda-lime glass, Schott 8245 and Ohara Corporation S-LAM60, will be suitable for the window/lens 2016 of WLPs having a GaAs substrate 2006. Pyrex glasses and similar formulations are believed suitable for the window/lens 2016 of WLPs having silicon substrates 2006. The properties of Pyrex, per the Corning website, are: softening point of about 821°C., annealing point of about 560°C., strain point of about 510°C., working point of about 1252°C., expansion (0-300°C.) of about $32.5 \times 10^{-7}$/°C., density of about 2.23 g/cm$^3$, Knoop hardness of about 418 and refractive index (at 589.3 nm) of about 1.474.

Figure 22:
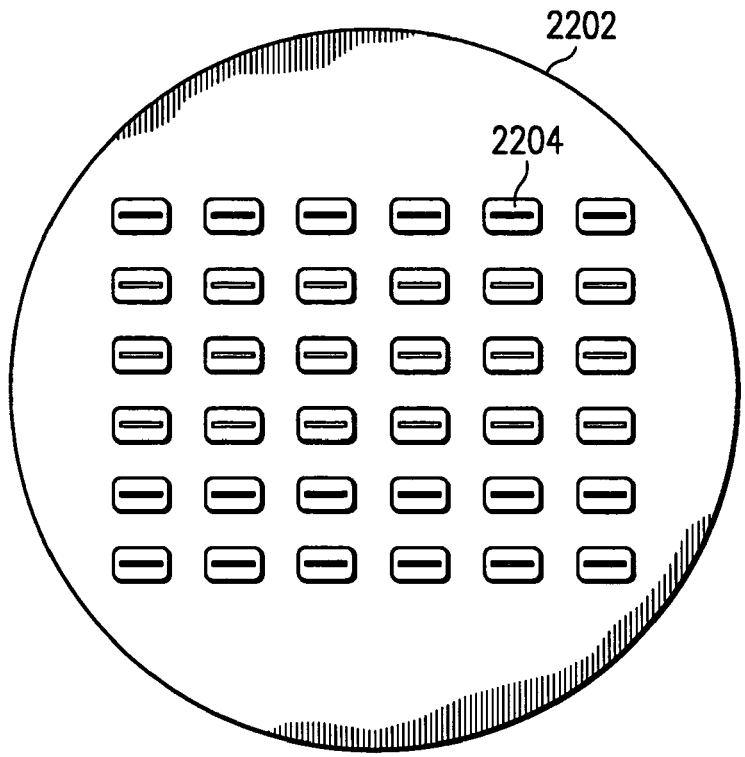
FIG. 22 illustrates a semiconductor wafer having a multiple micro-devices formed thereupon suitable for multiple simultaneous wafer-level packaging.

Referring now to FIG. 22, there is illustrated a semiconductor wafer 2202 having a plurality of micro-devices 2204 formed thereupon. It will be appreciated that methods for the production of multiple micro-devices on a single semiconductor wafer are conventional. Heretofore, however, when the micro-devices 2204 are of the type which must be hermetically packaged prior to use, e.g., MEMS, MOEMS, optoelectronic or optical devices, it has been standard practice in the industry to first "individuate" or "singulate" the microdevices, e.g., by cutting-apart, dicing (apart) or breaking-apart the wafer 2202 into sections having, typically, only a single micro-device on each, and then packaging the individuated micro-devices in separate packages. Now, in accordance with additional embodiments of the current invention, multiple micro-devices may be individually hermetically packaged, or hermetically packaged in multiples, in a WLP prior to individuation or singulation of the substrate wafer. This process is referred to as multiple simultaneous wafer-level packaging, or "MS-WLP."

Referring now to FIGS. 23 through 29, there is illustrated one method for MS-WLP of micro-devices. Briefly, this method includes the steps of: a) preparing a first frame-attachment area on the surface of a semiconductor wafer substrate having a plurality of micro-devices, the first frame-attachment area having a plan circumscribing individual (or multiple) micro-devices on the substrate; b) preparing a second frame-attachment area on the surface of a window (i.e., a sheet of transparent material), the second frame-attachment area having a plan substantially corresponding to the plan of the first frame-attachment area; c) positioning a frame/spacer between the substrate and the window, the frame/spacer having a plan substantially corresponding to, and in register with the plans of the first and second frame-attachment areas, respectively; and d) hermetically bonding the substrate, frame/spacer and window together so as to encapsulate the micro-device. If applicable, solder preforms or other materials including, but not limited to, innerlayers of interlayers for diffusion bonding, are also positioned between the frame/spacer and the window and/or substrate before bonding.

Figure 23:
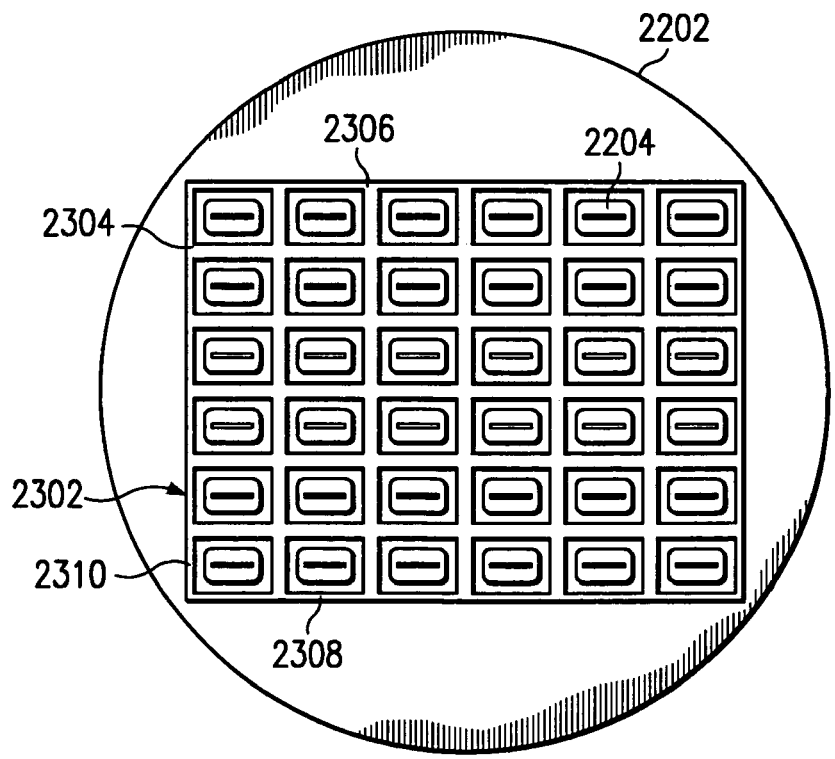
FIG. 23 illustrates the semiconductor wafer of FIG. 22 after metallization of the wafer surface.

Referring now specifically to FIG. 23, the frame-attachment area 2302 of semiconductor wafer 2202 has been prepared by depositing metallized layers onto the surface of the wafer substrate completely around (i.e., circumscribing) each micro-device 2204. In the embodiment shown, the prepared frame-attachment area 2302 includes a rectangular grid consisting of double-width metallized rows 2304 and columns 2306 (interposed between the micro-devices 2204) surrounded by single-width outer rows 2308 and columns 2310. The composition and thickness of the metallized layers in frame-attachment area 2302 may be any of those previously described for use in preparing the sheet seal-ring area 318 as set forth in Examples 1-96.

Figure 24:
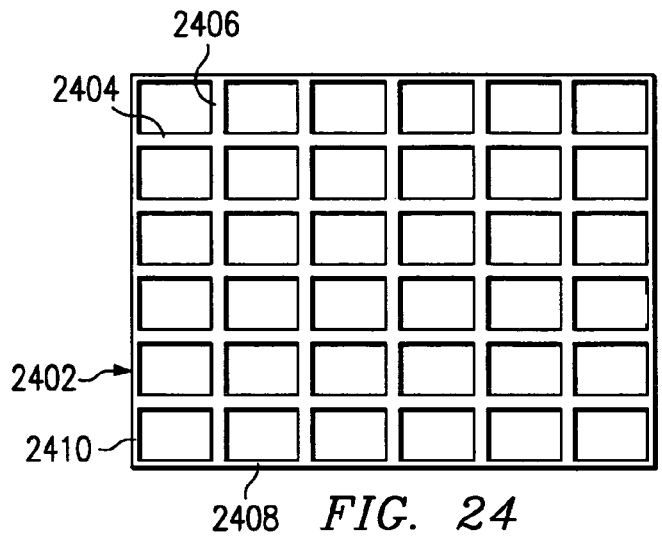
FIG. 24 illustrates a metallic frame for attachment between the wafer surface and the window sheet of a hermetic package.

Referring now to FIG. 24, there is illustrated a MS-WLP frame/spacer 2402 for attachment between the wafer 2202 and the window sheet 2602 of the MS-WLP assembly. It will be appreciated that in this embodiment, the MS-WLP frame/spacer 2402 has double-width row members 2404 and column members 2406 surrounded by single-width outer row members 2408 and column members 2410, resulting in a plan which corresponds substantially with the plan of the frame-attachment area 2302 on the wafer substrate 2202. As will be further described below, the purpose of the double-width row and column members 2404 and 2406 is to allow room for cutting the frame during singulation of the MS-WLP assembly after bonding. It will be appreciated that, in other embodiments, the MS-WLP frame/spacer may have a different configuration. In this embodiment, the MS-WLP frame/spacer 2402 is formed of a metal alloy having a CTE substantially matched to the CTE of wafer substrate, however, in other embodiments the frame/spacer may be formed of non-metallic materials as previously described. Also as previously described, the frame/spacer 2402 will preferably be plated or metallized to facilitate the bonding process.

Figure 25A:
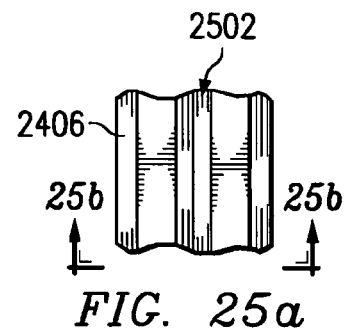
FIGS. 25a-25d show enlarged views of the frame members of FIG. 24; specifically.
Figure 25B:
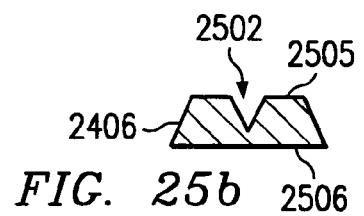
Figure 25C:
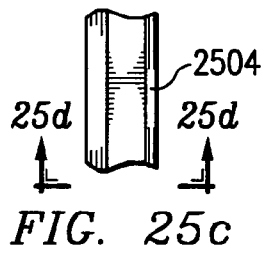
Figure 25D:
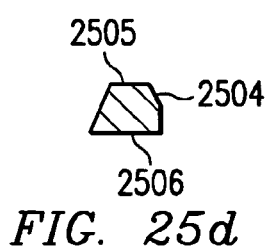

Referring now to FIGS. 25*a*-25*d*, there are illustrated details of a preferred configuration for the frame/spacer 2402. FIG. 25*a* shows an enlarged plan view of a portion of the double-width column member 2406 and FIG. 25*b* shows an end view of the same portion. It will be appreciated that the row members 2404 of the frame/spacer 2402 preferably have a similar configuration. The member 2406 is formed to have a "groove" 2502, or reduced thickness area, running along the central portion of each member, i.e., between the adjacent micro-devices in the completed MS-WLP assembly. As will be further described below, the groove 2502 facilitates cutting apart of the MS-WLP assembly during singulation of the packaged micro-devices. After being cut apart along the groove 2502, the frame member 2406 will be divided into two single-width members 2504, each one having the configuration shown in FIGS. 25*c* and 25*d*. During assembly, the grooved side 2505 of the frame member is preferably positioned against the wafer substrate 2202, while the ungrooved side 2505 is positioned against the window sheet.

Figure 26:
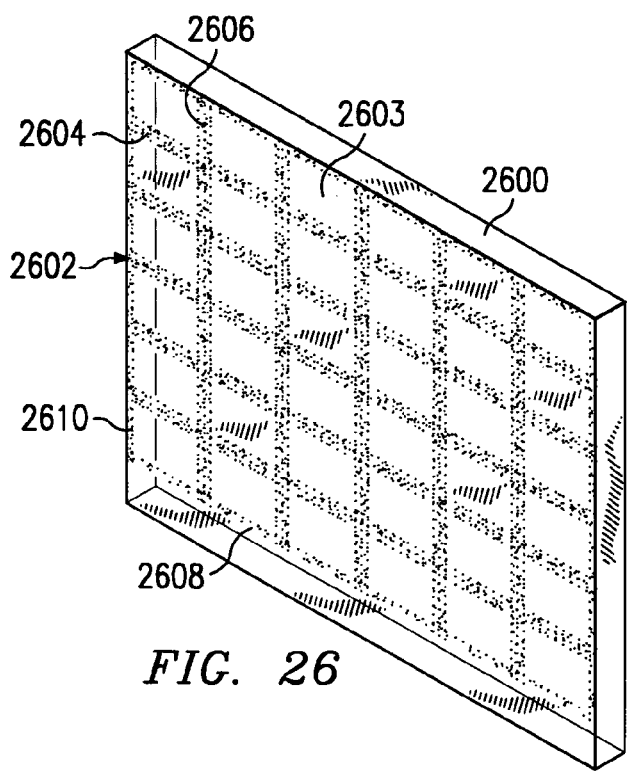
FIG. 26 illustrates a metallized window sheet for attachment to the frame of FIG. 24.

Referring now to FIG. 26, there is illustrated a MS-WLP window sheet 2600 for attachment to the MS-WLP frame/spacer 2402. The window sheet 2600 is formed of glass or other transparent material having a CTE compatible with the other principal components of the assembly as previously described. At least the inner side (i.e., the side that will be inside the hermetic envelope) of the sheet 2600, and preferably both sides, must be optically finished. Any desired optical or protective coatings are preferably present on at least the inner side, and preferably on both sides, of the sheet 2600 at this point. However, if the sheet 2600 is attached to only the frame/spacer 2402 in the first of two bonding operations, then the optical or protective coatings may be applied prior to the second, later bonding step of attaching the window assembly to the wafer. A frame-attachment area 2602 is prepared on the MS-WLP window sheet 2600 so as to circumscribe a plurality of window apertures 2603 that will ultimately be aligned with the micro-devices 2204 in the final MS-WLP assembly. In the embodiment shown, the prepared frame-attachment area 2602 takes the form of metallic layers deposited on the sheet 2600 in a rectangular grid consisting of double-width rows 2604 and columns 2606 surrounded by single-width outer rows 2608 and columns 2610. This results in a plan for the frame-attachment area 2602 that corresponds substantially with the plan of the frame/spacer 2402. The composition and thickness of the metallized layers 2604, 2606, 2608 and 2610 in the frame-attachment area 2602 may be any of those previously described for use in preparing the sheet seal-ring area 318 of the "stand-alone" windows set forth in Examples 1-96.

In some embodiments, the inner surface of the window sheet 2600 may be scribed, e.g., with a diamond stylus, through each portion of the frame-attachment area 2602 to facilitate breaking apart of the MS-WLP assembly during singulation. The scribing of the window sheet 2600 would obviously be performed prior to bonding or joining it to the frame/spacer 2402. Where the frame/spacer 2402 includes grooved members such as those illustrated in FIGS. 25*a*-25*b*, then the scribe lines on the sheet 2600 will preferably be in register with the grooves 2502 of the frame members in the MS-WLP assembly.

Figure 27:
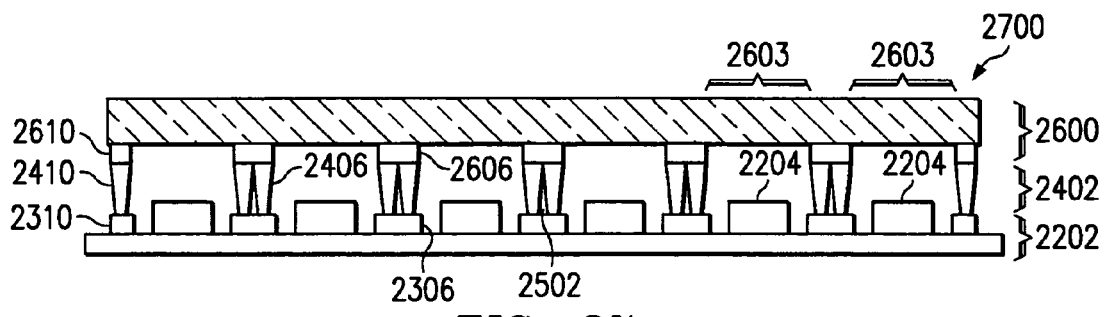
FIG. 27 shows a cross-sectional side view of a multiple-package assembly prior to singulation.

Referring now to FIG. 27, there is illustrated a side view of a complete MS-WLP assembly 2700. It will be appreciated that the proportions of some of the components shown in FIG. 27 (e.g., the thicknesses of the metallic layers) may be exaggerated for purposes of illustration. The frame/spacer 2402 is positioned between the wafer substrate 2202 (with associated micro-devices 2204) and the window sheet 2600, with the plans of the frame-attachment areas 2302 and 2602 being substantially in register with the plan of the frame/spacer 2402 such that each micro-device or set of micro-devices 2204 is positioned beneath a window aperture area 2603 of the window sheet. Of course, if the assembly 2700 is bonded using solder technology, then solder preforms (not shown) having a plan substantially corresponding with the frame-attachment areas 2302 and 2602 are also positioned between the frame/spacer 2402 and the frame-attachment areas prior to bonding. Also, if innerlayers or interlayers are used in conjunction with diffusion bonding, these interlayers (not shown) having a plan substantially corresponding with the frame-attachment areas 2302 and 2602 are also positioned between the frame/spacer 2402 and the frame-attachment areas prior to bonding. Any of the previously described bonding technologies may be used to effectuate the bond between the components. The MS-WLP assembly 2700 will look essentially the same before bonding and after bonding (except for incorporation into the bond area of any solder preforms).

After bonding, the MS-WLP assembly 2700 is cut apart, or singulated, to form a plurality of hermetically sealed packages containing one or more micro-devices each. There are several options carrying out the singulation procedure. However, since the window sheet 2600, frame 2402 and wafer substrate 2202 are bonded together, simply scribing and breaking the window sheet (as was done for the multiple stand-alone window assemblies) is not practical. Instead, at least the window sheet 2600 or the wafer substrate 2202 must be cut. The remaining portion may then either be cut, or scribed and broken. It is believed that the best result will be obtained by cutting the wafer substrate 2202 using a wafer-dicing saw, and then either scribing-and-breaking the window sheet 2600, or cutting the window sheet using a similar dicing saw.

Figure 28:
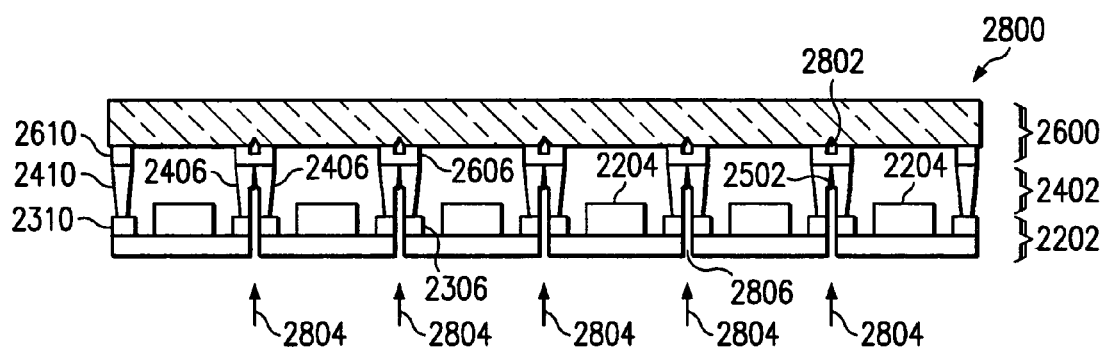
FIG. 28 illustrates one option for singulation of the multiple-package assembly of FIG. 27.

Referring now to FIG. 28, there is illustrated one option for singulation of a MS-WLP assembly. The MS-WLP assembly 2800 shown in FIG. 28 is similar in most respects to the assembly 2700 shown in FIG. 27, however, in this case the window sheet 2600 was pre-scribed (as denoted by reference number 2802) through the metallic layers 2406, if employed (and also layers 2404 running perpendicular thereto, also if employed) of the interior frame-attachment areas. After bonding, the assembly 2800 is cut from the outer side of the wafer substrate 2202 (as indicated by arrow 2804) completely through the substrate and into the groove 2502 of interior frame/spacer members 2606 (and also members 2604 running perpendicular thereto). The cut 2804 does not, however, continue through the window sheet 2600. Instead, after the wafer substrate 2202 and frame 2402 are cut, the window sheet 2600 is broken by bending it along the pre-scribed lines 2802. The assembly 2800 may be first broken into rows, then each row broken into individual packages along the column lines, or vice versa. In one variation of this method, the window sheet 2600 is not pre-scribed, but instead is scribed through the kerf 2806 formed by cutting through the wafer substrate 2202 and frame 2402. It will be appreciated that this scribing must be sufficiently forceful to cut through the remaining portion of the frame member 2406 and metallic layers 2606 under the groove 2502. The assembly is then broken into individual packages along the scribe lines as before.

Figure 29:
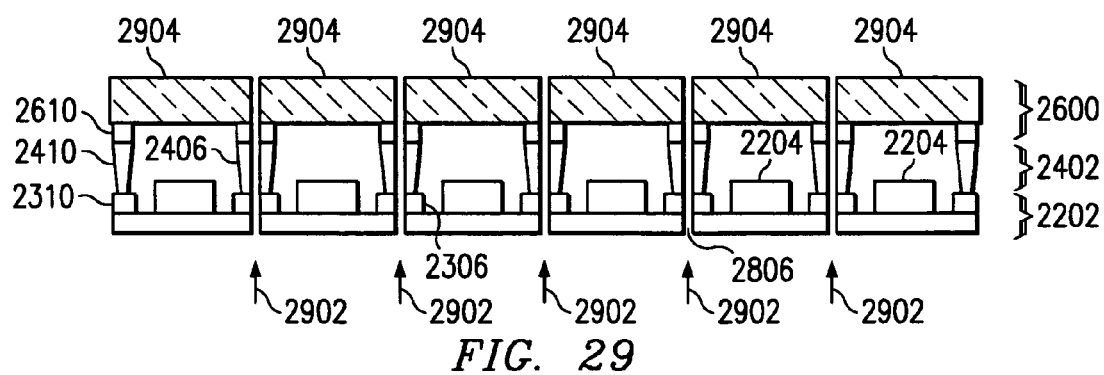
FIG. 29 illustrates another option for singulation of the multiple-package assembly of FIG. 27.

Referring now to FIG. 29, in another variation, a MS-WLP assembly 2900 is individuated by simply cutting completely through the wafer substrate 2202, frame/spacer 2402 and window sheet 2600 between each micro-device 2204 as indicated by arrow 2902. The result is a plurality of individually WLP micro-devices 2904. The individuating cuts may be made from either the window side or the substrate side, however, it may be necessary to protect the outer surface of the window sheet (e.g., with masking tape, etc.) to protect it from damage during the sawing operation.

When electrical-resistance heating ("ERH") is used to facilitate diffusion bonding or soldering of the components of a MS-WLP assembly, the electrical current is typically applied so that it flows through both the window/frame junction and the frame/substrate junction simultaneously. To facilitate this ERH heating, the configuration of the MS-WLP assembly may be modified to provide "sacrificial" metallized areas (i.e., areas that will be discarded later) on the window sheet and wafer substrate for placement of ERH electrodes. Preferably, the electrode placement areas on the substrate and window will be accessible from directions substantially perpendicular to the wafer.

Figure 30:
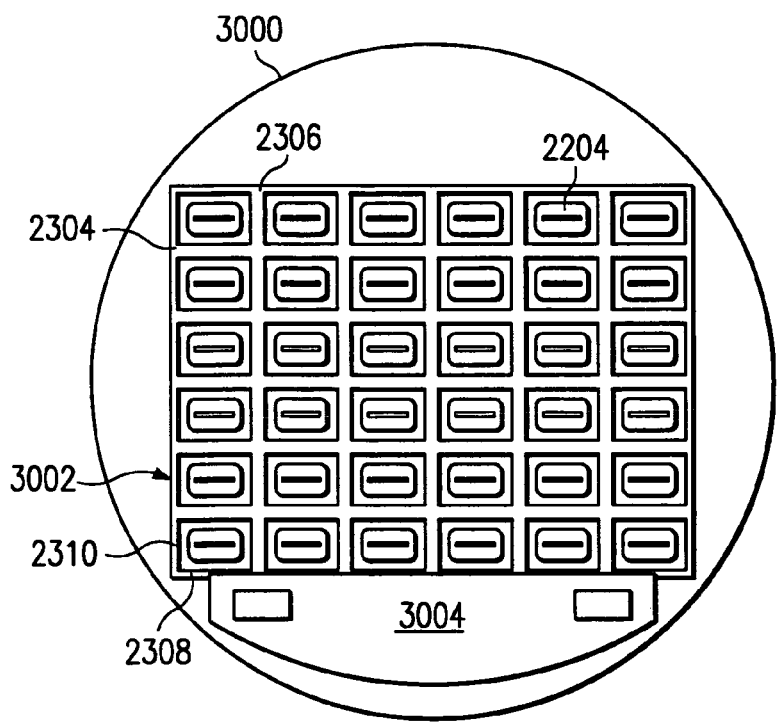
FIG. 30 illustrates a semiconductor wafer after metallization of the wafer surface in accordance with another embodiment having an electrode placement portion.

Referring now to FIG. 30, there is illustrated a wafer 3000 similar in most respects to the wafer 2002 of FIG. 23, i.e., having a plurality of micro-devices 2204 formed thereon and a metallized frame-attachment area 3002 formed thereon so as to surround the micro-devices. In this case, however, the wafer 3000 further includes a metallized electrode placement pad 3004 positioned at one end of the wafer. The electrode placement pad 3004 is in electrical contact with the metallized layers 2304, 2306, 2308 and 2310 of the frame-attachment area 3002.

Figure 31:
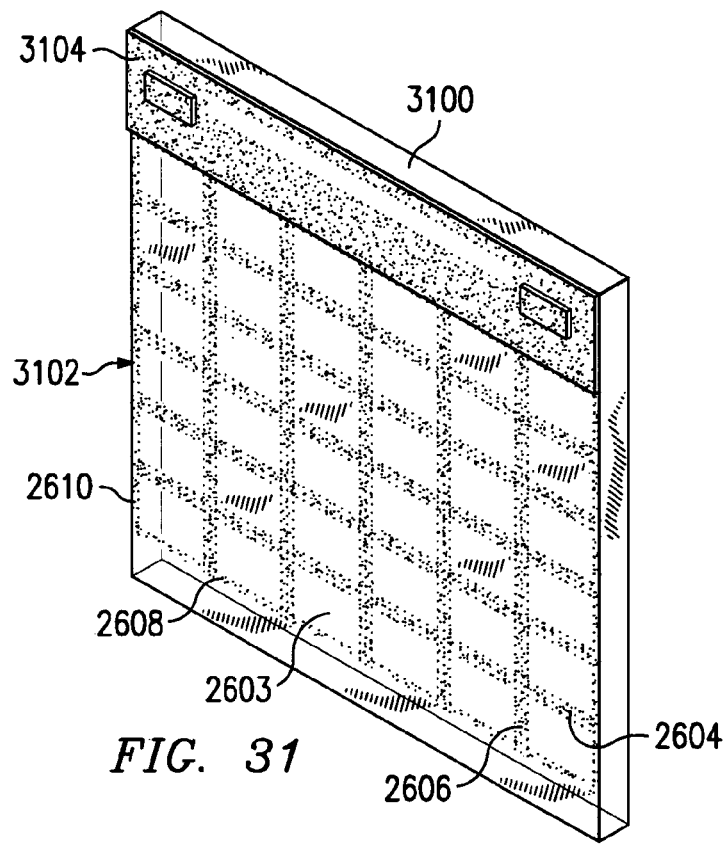
FIG. 31 illustrates a metallized window sheet in accordance with another embodiment having an electrode placement portion.

Referring now to FIG. 31, there is illustrated window sheet 3100 similar in most respects to the sheet 2600 of FIG. 26, i.e., having a metallized frame-attachment area 3102 formed thereon so as to surround the window aperture areas 2603 on the sheet. In this case, however, the sheet 3100 further includes a metallized electrode placement pad 3104 positioned at one end of the sheet. The electrode placement pad 3104 is in electrical contact with the metallized layers 2604, 2606, 2608 and 2610 of the frame-attachment area 3102.

Figure 32:
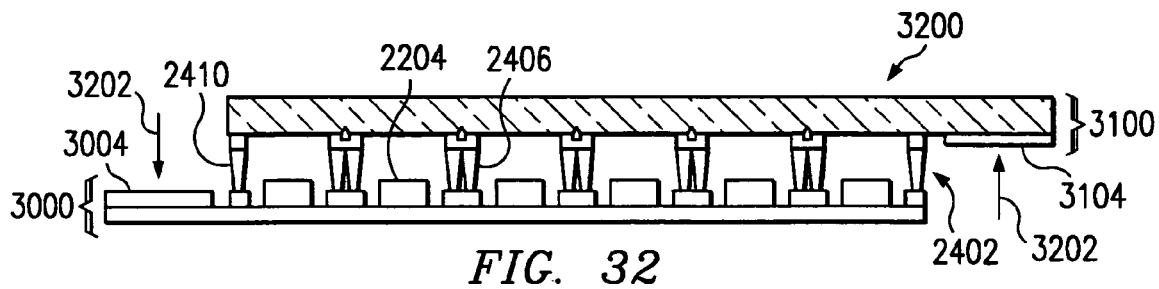
FIG. 32 is a cross-sectional side view of a multiple-package assembly prior to singulation in accordance with another embodiment having direct electrode access.

Referring now to FIG. 32, there is illustrated a MS-WLP assembly 3200 in accordance with another embodiment. The components of the assembly 3200 are positioned such that the wafer substrate 3000 and the window sheet 3100 are adjacent to the frame/spacer 2402, but the respective metallized electrode placement pads 3004 and 3104 overhang on opposite sides of the assembly. This configuration provides unobstructed access to the pads 3004 and 3104 in a direction perpendicular to the wafer (as denoted by arrows 3202), allowing easy attachment of electrodes for ERH procedures.

During bonding of WLP assemblies, there are two bonds that should typically occur simultaneously: the junction between the frame/spacer and the window sheet and the junction between the frame/spacer and the wafer substrate. As was described previously, however, the window may first be bonded only to the frame, and later, using ERH, the window/frame assembly can be attached to the substrate of the device. As was previously described in the process for the manufacturing of stand-alone window assemblies, the configuration of the metal frame and placement of ERH electrodes may be critical for even heating using ERH heating techniques. Similarly, for MS-WLP devices, the metallization patterns and ERH electrode placement locations on the wafer substrate and the window sheet may be important to achieving even heating. Therefore, the size/shape of the frame including possibly excess or sacrificial features, and the metallization patterns on both the window sheet and the wafer substrate should be concurrently designed, modeled (e.g., using software simulation) and prototyped to ensure even heating of the bonded surfaces/features.

Figure 33:
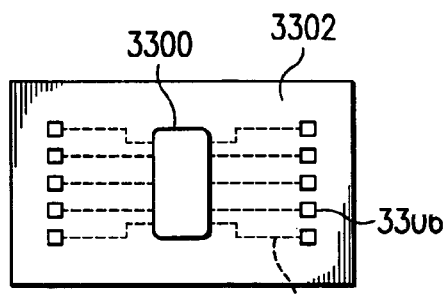
FIG. 33 is a top view of a micro-device with same-side pads.

It will be appreciated that the previous embodiment describes a method for manufacturing MS-WLP assemblies which is suited for micro-devices having opposite-side electrical connection pads. Referring now to FIG. 33, there is illustrated a micro-device having same-side electrical connections. The micro-device 3300 is disposed on one side of a semiconductor substrate 3302. A plurality of vias 3304 run from the active areas of the micro-device, through the substrate, and to a plurality of connection pads 3306 located on the same side of the substrate. Obviously, the electrical connection pads 3306 must be accessible even after the micro-device 3300 has been sealed within its hermetic package. In the following embodiment, there is presented another method for manufacturing MS-WLP assemblies suited for use with such micro-devices with same-side connections.

Figure 34:
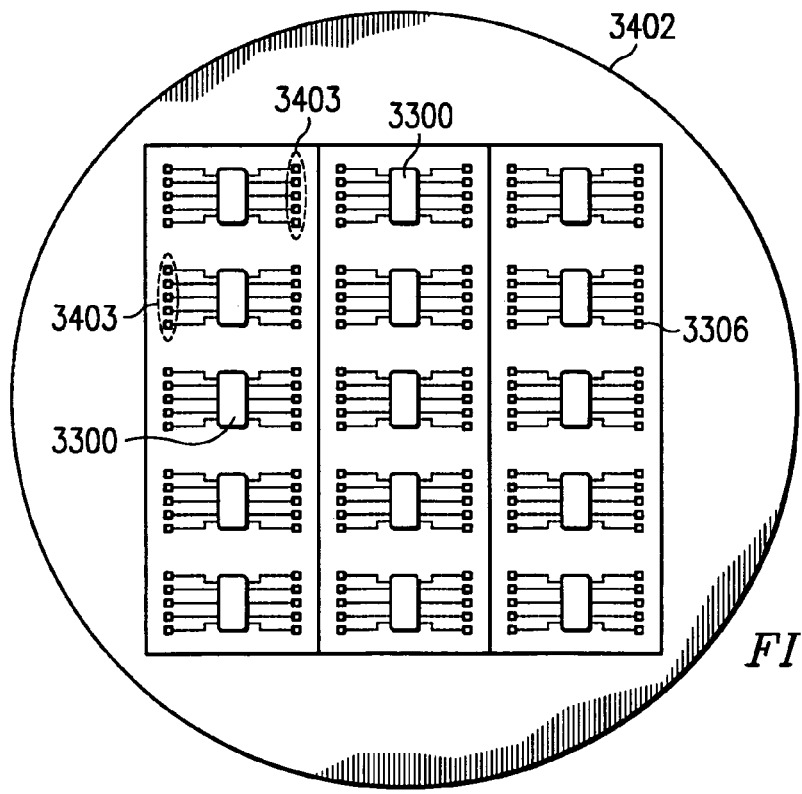
FIG. 34 illustrates a semiconductor wafer having formed thereon a plurality of the micro-devices of FIG. 33.

Referring now to FIG. 34, there is illustrated a wafer 3402 having a plurality of micro-devices 3300 formed thereupon, each micro-device having one or more sets 3403 of associated same-side connection pads 3306. In accordance with this embodiment, the multiple micro-devices 3300 are individually hermetically packaged in a WLP prior to individuation of the substrate wafer 3402, however the same-side electrical connection pads 3306 remain accessible. The steps of this embodiment are similar in many respects to those of the previous embodiment, except for the changes described below.

Figure 35:
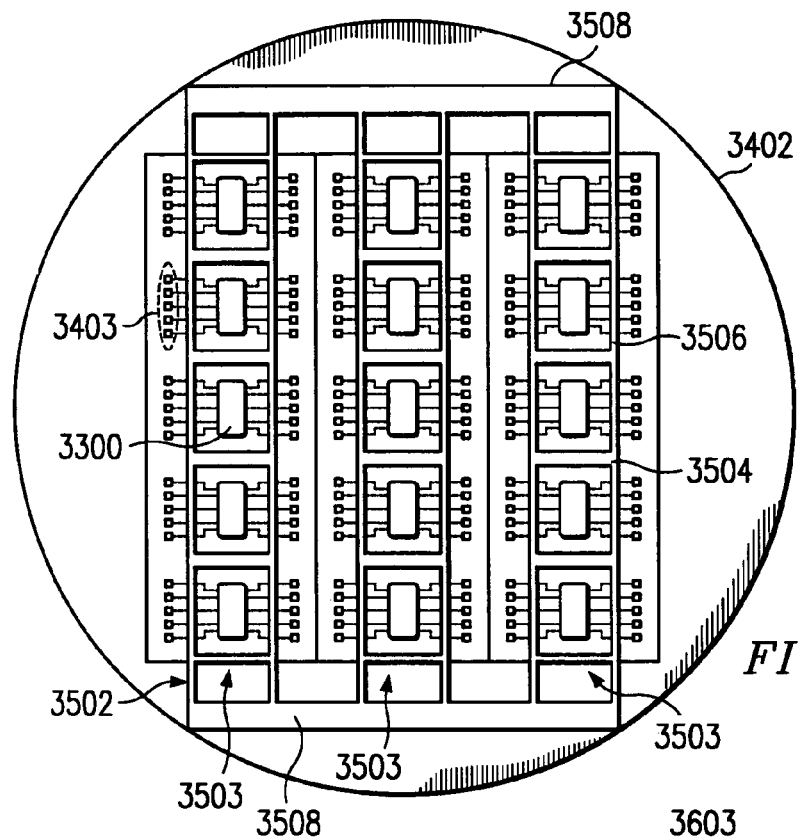
FIG. 35 illustrates the semiconductor wafer of FIG. 34 after metallization of the wafer surface.

Referring now to FIG. 35, the frame-attachment area 3502 of the semiconductor wafer 3402 is first prepared, in this case by depositing metallized layers onto the surface of the wafer substrate circumscribing each micro-device 3300. In the embodiment shown, the prepared frame-attachment area 3502 includes three "ladder-shaped" grids 3503, each consisting of double-width metallized rows 3504 (i.e., the "rungs" of the ladder) and single-width columns 3506 (the "sides" of the ladder) connected by buss strips 3508 at each end. The composition and thickness of the metallized layers in frame-attachment area 3502 may be any of those previously described for use in preparing the sheet seal-ring area or frame attachment areas.

Figure 36:
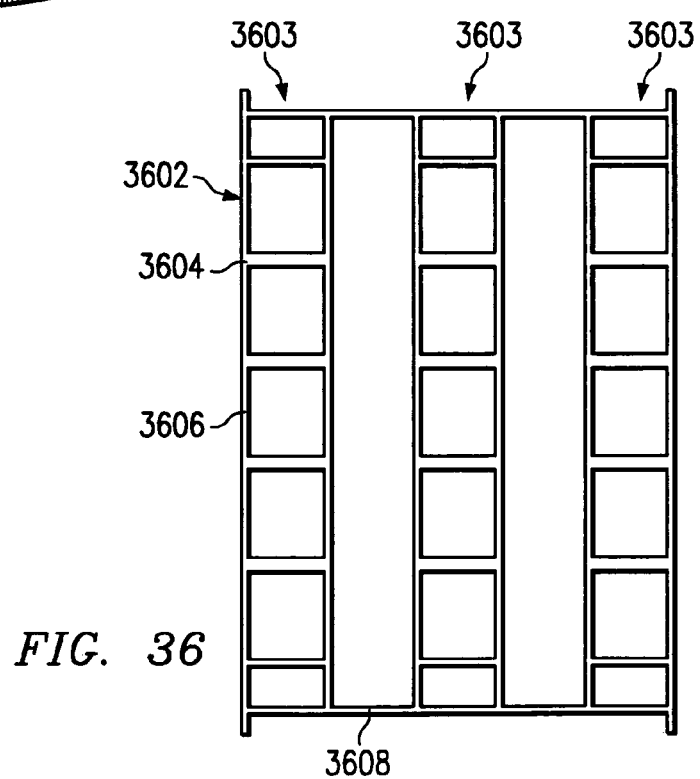
FIG. 36 illustrates a metallic frame for attachment to the wafer surface of FIG. 35.

Referring now to FIG. 36, there is illustrated a MS-WLP frame/spacer 3602 for attachment between the wafer 3402 and the window sheet 3702 (FIG. 37) of the MS-WLP assembly. It will be appreciated that in this embodiment, the MS-WLP frame/spacer 3602 is configured into multiple ladder shaped portions 3603, each portion having double-width rung members 3604 and single-width side members 3606 that are configured to have a plan substantially corresponding to the ladder-shaped plans 3503 of the frame-attachment area 3502 on the wafer substrate 3402. The ladder-shaped portions 3603 are attached to, and held in relative position to one-another by, connecting members 3608 located at opposite ends of the frame/spacer 3602. As in the previous embodiment, the double-width members 3604 allow room for cutting the frame 3602 between micro-devices during singulation of the MS-WLP assembly (i.e., after bonding). In a preferred embodiment, the double-width members may have a grooved cross-section (e.g., similar to that shown in FIGS. 25a and 25b) to facilitate their cutting apart. It will be appreciated however, that in other embodiments the MS-WLP frame/spacer may have a different configuration. In this embodiment, the MS-WLP frame/spacer 3602 is formed of a metal alloy having a CTE substantially matched to the CTE of the wafer substrate, however, in other embodiments the frame/spacer may be formed of non-metallic materials as previously described. Also as previously described, the frame/spacer 3602 will preferably be plated or metallized to facilitate the subsequent bonding process.

Figure 37:
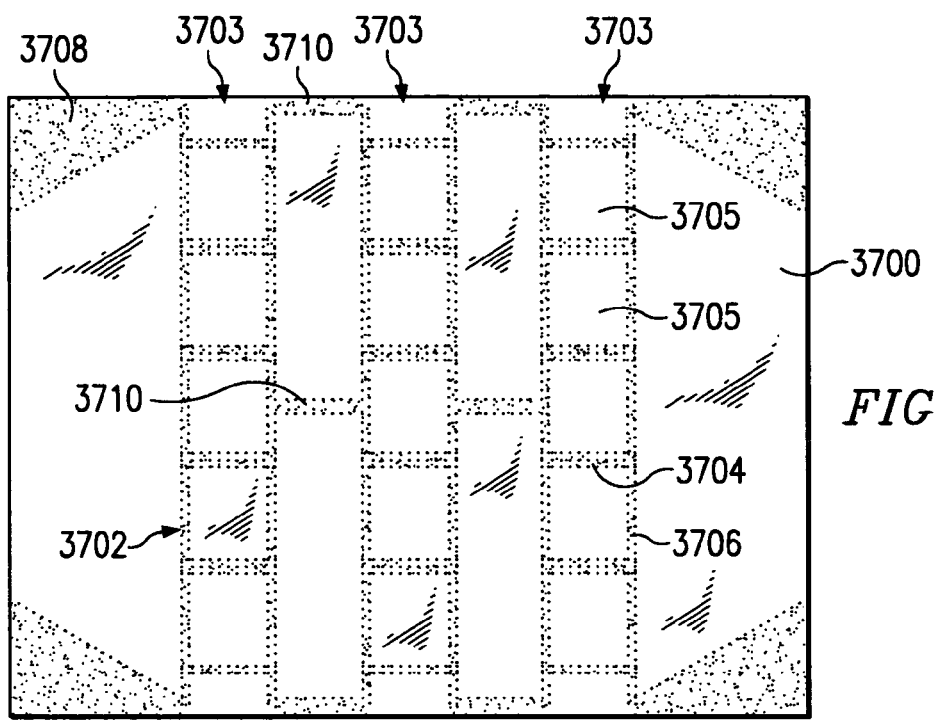
FIG. 37 illustrates a metallized window sheet for attachment to the frame of FIG. 36.

Referring now to FIG. 37, there is illustrated a MS-WLP window sheet 3700 for attachment to the MS-WLP frame/spacer 3602. The window sheet 3700 is formed of glass or other transparent material having a CTE compatible with the other principal components of the assembly as previously described. At least the inner side (i.e., the side that will be inside the hermetic envelope) of the sheet 3700 (and preferably both sides) is optically finished, and any desired optical or protective coatings are in place on the inner side. Either before or after any desired optical or protective coatings are in place on the inner side of sheet 3700 (and preferably both sides), a frame-attachment area 3702 is prepared on the MS-WLP window sheet 3700 so as to circumscribe a plurality of window apertures 3705 that will ultimately be aligned with the micro-devices 3300 in the final MS-WLP assembly. In the embodiment shown, the prepared frame-attachment area 3702 includes metallic layers deposited on the sheet 3700 in multiple ladder-shaped portions 3703, each portion including double-width rung members 3704 and single-width side members 3706. Each ladder portion 3703 has a plan that corresponds substantially with the plan of the ladder portions 3603 of the frame/spacer 3602. The methods and procedures for preparation of the window sheet 3700, including the composition and thickness of the metallized layers 3704 and 3706 in the frame-attachment area 3702, may be any of those previously described for use in preparing the sheet seal-ring area 318 of the "stand-alone" window assemblies or the frame attachment areas 2602 of the window sheet 2600 of the MS-WLP.

In the embodiment illustrated in FIG. 37, the metallized layers of window sheet 3700 extend beyond the ladder-shaped portions 3703, and included additional portions configured to facilitate electric resistance heating (ERH). These additional portions include electrode attachment portions 3708 and bridge portions 3710, both of which are electrically connected to the metallized layers 3704 and 3706 of the ladder portions 3703. The configuration, e.g., placement and thickness, of these electrode attachment portions 3708 and bridge portions 3710 are selected to manage the flow of ERH current through the interfaces between the metallized portions of the window sheet 3700 and the frame/spacer 3602, and through the interface between the frame/spacer 3602 and the metallized portions of the substrate 3402, thereby controlling the heating at these interfaces during ERH-facilitated bonding operations.

As in previous embodiments, the inner surface of the window sheet 3700 may be scribed, e.g., with a laser or diamond stylus, through each portion of the frame-attachment area 3702 to facilitate breaking apart of the MS-WLP assembly during singulation. Where the frame/spacer 3602 includes grooved members such as those illustrated in FIGS. 25a-25b, then the scribe lines on the window sheet 3700 will preferably be in register with the grooves 2502 of the frame members in the MS-WLP assembly.

Figure 38:
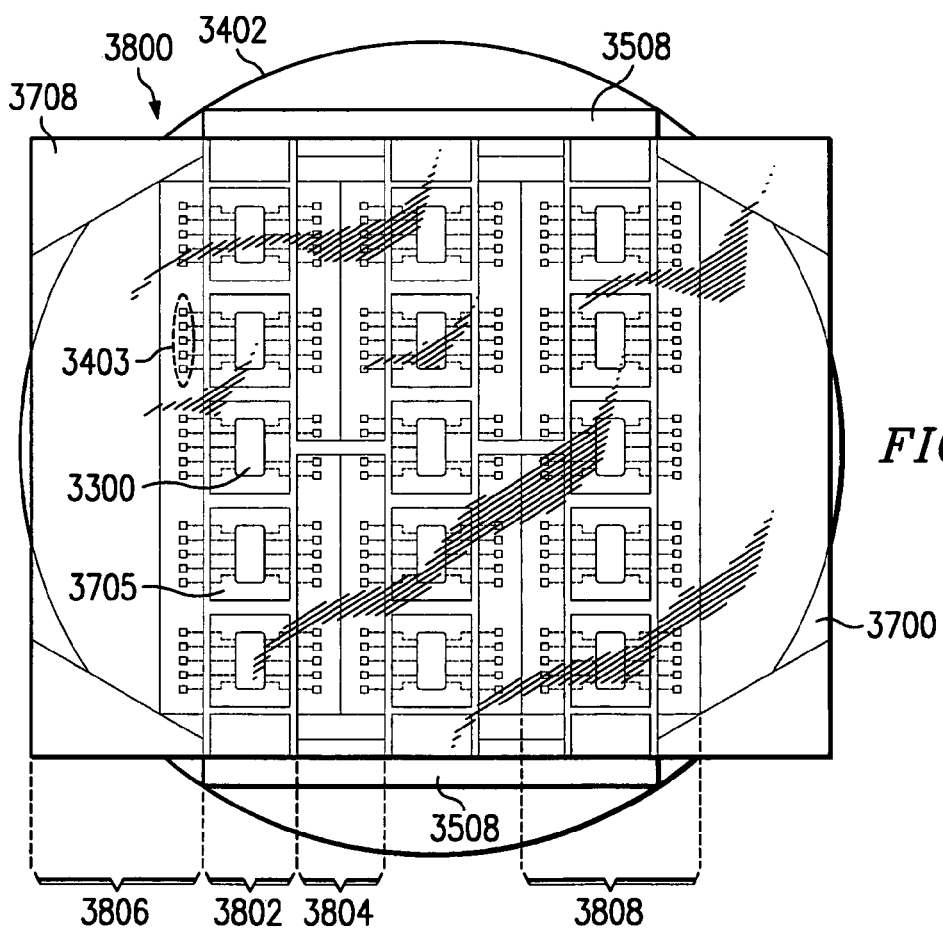
FIG. 38 shows a top view a complete multiple-package assembly.

Referring now to FIG. 38, there is illustrated a top view of a complete MS-WLP assembly 3800 including the wafer substrate 3402, frame/spacer 3602 and window sheet 3700 stacked on one another such that the ladder-shaped areas 3503, 3603 and 3703 of each respective component are substantially in register with one another, and such that each of the micro-devices 3300 is positioned beneath a window aperture area 3705 of the window sheet. It will be appreciated that in this embodiment, the configurations of the wafer 3402 and window sheet 3700 are complementary to facilitate the placement of ERH electrodes. Specifically, the portions of the wafer 3402 having the metallized buss strips 3508 project past the edges of the sheet 3700 (when viewed from above), allowing one set of ERH electrodes to make contact from vertically above, while the portions of the sheet having the metallized contact portions 3708 project past the edge of the wafer (when viewed from below), allowing another set of ERH electrodes to make contact from vertically below.

Of course, if the assembly 3800 is to be bonded using solder technology, then solder preforms (not shown) having a plan substantially corresponding with the frame-attachment areas are also positioned between the frame/spacer 3602 and the frame-attachment areas of the window sheet 3700 and substrate 3402 prior to bonding. Any of the previously described bonding technologies may be used to effectuate the bond between the components. If the assembly 3800 is to be bonded using diffusion bonding technology, then when using interlayer preforms (not shown), these preforms will have a plan substantially corresponding with the frame-attachment areas and are also positioned between the frame/spacer, 3602 and the frame-attachment areas of the window sheet 3700 and/or between the frame/spacer 3602 and substrate 3402 prior to bonding. The MS-WLP assembly 3800 will look essentially the same before bonding and after bonding (except for incorporation into the bond area of any solder preforms or interlayers for diffusion bonding).

After bonding, the window sheet 3700 of the assembly 3800 may be viewed as including primary strip portions 3802, which overlie the plurality of encapsulated micro-devices 3300, secondary strip portions 3804, which are interposed between the primary strips and overlie rows of non-encapsulated contact pads 3403, and end strip portions 3806, which are disposed at each end of the window sheet and also overlie rows of non-encapsulated contact pads 3403. During singulation of the assembly 3800, the secondary and end strip portions 3804 and 3806, respectively, of the window sheet are cut away and discarded, these parts being essentially "sacrificial." Further during singulation, the substrate 3402 is divided along cut lines (denoted by arrows 3808) between the columns of micro-devices 3300 and contact pads 3403 to form multi-unit strips. The separating of the window sheet may be performed using saws, lasers or other conventional means, while the dividing of the substrate may be performed using saws, lasers, or by snapping along a score line.

Figure 39:
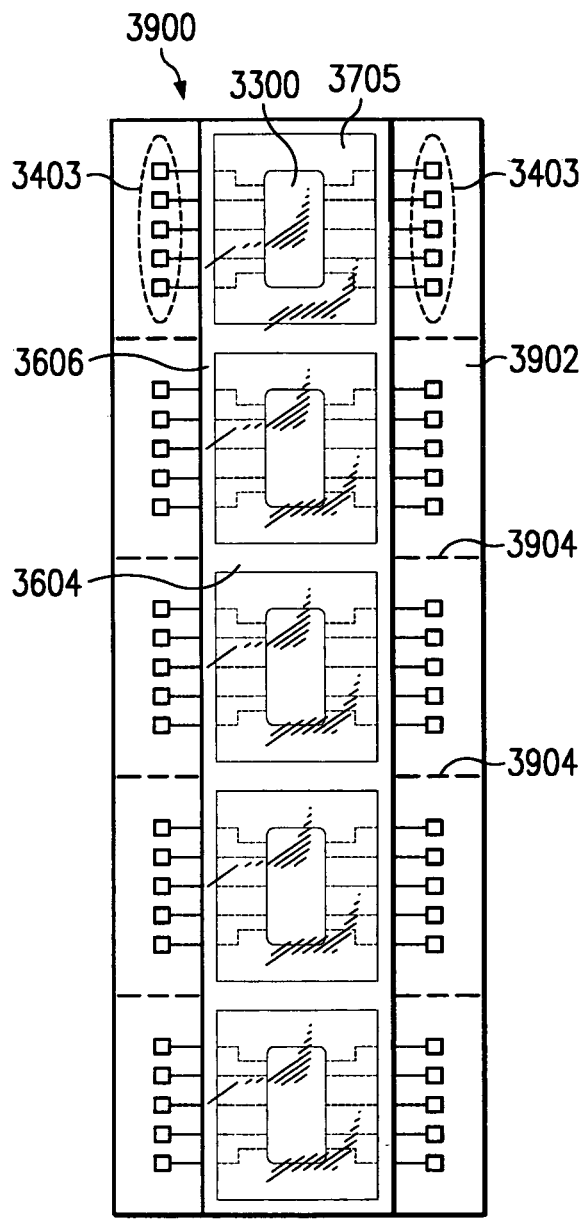
FIG. 39 illustrates a multi-package strip after column separation of the multiple-package assembly of FIG. 38.
Figure 40:
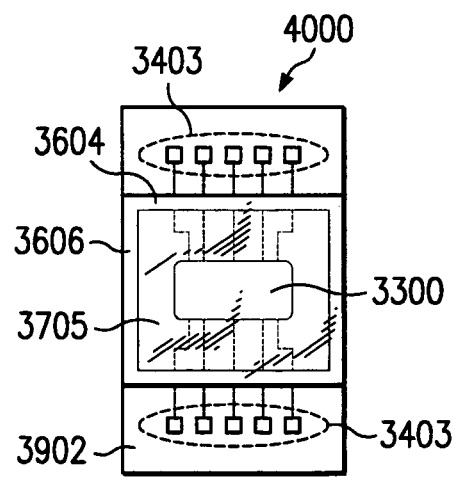
FIG. 40 illustrates a single packaged micro-device after singulation of the multiple-package strip of FIG. 39.

Referring now to FIGS. 39 and 40, singulation of the MS-WLP assembly 3800 is illustrated. Referring first to FIG. 39, there is illustrated a multi-unit strip 3900 which has been separated from the MS-WLP assembly 3800. The multi-unit strip 3900 includes a plurality of micro-devices 3300 on a portion 3902 of the original wafer substrate 3402, the micro-devices being encapsulated within adjacent hermetic envelopes having one or more micro-devices under each window portion 3705 of the original window sheet, but with their associated electrical contact pads 3403 being non-encapsulated. The multi-unit strip 3900 is further cut apart, or singulated, along cut lines 3904, which in this embodiment corresponds to the center of the frame members 3604 separating the adjacent hermetic envelopes. The result is a plurality of discrete hermetically sealed WLP packages containing one or more micro-devices under each window portion 3705. An example of an individual WLP package 4000 produced by this method is illustrated in FIG. 40.

During the singulation of multi-unit strips 3900, at least the window sheet 3700 or the wafer substrate portion 3902 must be cut. The remaining portion may then either be cut, or scribed and broken. It is believed that the best result will be obtained by cutting the wafer substrate portion 3902 using a wafer-dicing saw, and then either scribing-and-breaking the window sheet 3700, or cutting the window sheet using a similar dicing saw.

While the invention has been shown or described in a variety of its forms, it should be apparent to those skilled in the art that it is not limited to these embodiments, but is susceptible to various changes without departing from the scope of the invention.

What is claimed is:

1. A method for manufacturing a hermetically sealed micro-device package encapsulating a micro-device and including a transparent portion, the method comprising the following steps:
    preparing, on a semiconductor substrate having a micro-device operably disposed thereupon, a first frame-attachment area;
    preparing, on a sheet of transparent material, a second frame-attachment area;
    positioning, between the semiconductor substrate and the transparent sheet, a separate frame/spacer that is formed independently from both the semiconductor substrate and the sheet of transparent material, the frame/spacer including a sidewall having one side substantially in register with the first frame-attachment area and having the opposite side substantially in register with the second frame-attachment area; and
    bonding the substrate, frame/spacer and transparent sheet together to form a hermetically sealed package encapsulating the micro-device in a cavity below the sheet.

2. A method in accordance with claim 1, wherein the semiconductor substrate is substantially formed of a material selected from one of silicon (Si) and gallium arsenide (GaAs).

3. A method in accordance with claim 1, wherein the step of preparing the first frame-attachment area comprises depositing metallic layers onto the semiconductor substrate.

4. A method in accordance with claim 1, wherein during the step of bonding, the temperature of the window aperture portion of the sheet remains below the glass transition temperature ($T_G$) of the transparent material.

5. A method in accordance with claim 1, wherein the step of preparing the second frame-attachment area comprises depositing metallic layers onto the transparent sheet.

6. A method in accordance with claim 1, wherein the step of bonding further comprises:
    forming a bond between the frame/spacer and the semiconductor substrate;
    forming another bond between the frame/spacer and the transparent sheet; and
    wherein at least one of the bonds is formed by soldering.

7. A method in accordance with claim 6, wherein the step of soldering is performed using a solder formed of a material selected from one of a metal alloy and a solder glass.

8. A method in accordance with claim 1, wherein the step of bonding further comprises:
    forming a bond between the frame/spacer and the semiconductor substrate;
    forming another bond between the frame/spacer and the transparent sheet; and
    wherein at least one of the bonds is formed by diffusion bonding.

9. A method for manufacturing a hermetically sealed micro-device package encapsulating a micro-device and including a transparent portion, the method comprising the following steps:
    preparing on a semiconductor substrate having a micro-device operably disposed thereupon, a first frame-attachment area;
    preparing on a sheet of transparent material, a second frame-attachment area;

positioning, between the semiconductor substrate and the transparent sheet, a frame/spacer including a sidewall having one side substantially in register with the first frame-attachment area and having the opposite side substantially in register with the second frame-attachment area; and bonding the substrate, frame/spacer and transparent sheet together to form a hermetically sealed package encapsulating the micro-device in a cavity below the sheet;

wherein the step of bonding further comprises pressing the substrate and the sheet against the frame/spacer with sufficient force to produce a first predetermined contact pressure along a first junction region between the frame/spacer and the first frame-attachment area of the substrate and a second predetermined contact pressure along a second junction region between the frame/spacer and the second frame-attachment area of the sheet;

heating the first junction region to produce a first predetermined temperature along the first junction region;

heating the second junction region to produce a second predetermined temperature along the second junction region;

maintaining the first predetermined contact pressure and the first predetermined temperature until a diffusion bond is formed between the frame/spacer and the substrate along the first junction region; and maintaining the second predetermined contact pressure and the second predetermined temperature until a diffusion bond is formed between the frame/spacer and sheet along the second junction region.

10. A method for simultaneously manufacturing multiple sealed micro-device packages, each package encapsulating at least one micro-device and including a transparent portion, the method comprising the following steps:

preparing, on a semiconductor substrate having a plurality of micro-devices disposed thereupon, a first frame-attachment area that circumscribes a number of the micro-devices;

preparing, on a sheet of transparent material, a second frame-attachment area;

positioning, between the semiconductor substrate and the transparent sheet, a separate frame/spacer that is formed independently from both the semiconductor substrate and the sheet of transparent material, the frame/spacer including a plurality of sidewalls, the sidewalls collectively having one side substantially in register with the first frame-attachment area and an opposite side substantially in register with the second frame-attachment area;

bonding the semiconductor substrate, frame/spacer and transparent sheet together to form a multi-package assembly having a plurality of sealed cavities separated from one another by the frame/spacer sidewalls, each of the cavities containing at least one of the micro-devices positioned below the sheet; and dividing the multi-package assembly into individual packages by parting completely through the substrate, frame/spacer sidewall and transparent sheet at locations between adjacent cavities;

whereby each individual package will encapsulate at least one of the micro-devices in a sealed cavity.

11. A method in accordance with claim 10, wherein the semiconductor substrate is substantially formed of a material selected from one of silicon (Si) and gallium arsenide (GaAs).

12. A method in accordance with claim 10, wherein during the step of bonding, the temperature of the window aperture portions of the transparent sheet remains below the glass transition temperature ($T_G$) of the transparent material.

13. A method in accordance with claim 10, wherein the step of preparing the first frame-attachment area comprises depositing metallic layers onto the semiconductor substrate.

14. A method in accordance with claim 10, wherein the step of preparing the second frame-attachment area comprises depositing metallic layers onto the transparent sheet.

15. A method in accordance with claim 10, wherein the step of bonding further comprises:

forming a bond between the frame/spacer and the semiconductor substrate;

forming another bond between the frame/spacer and the transparent sheet; and wherein at least one of the bonds is formed by soldering.

16. A method in accordance with claim 15, wherein the step of soldering is performed using a solder formed of a material selected from one of a metal alloy and a solder glass.

17. A method in accordance with claim 10, wherein the step of bonding further comprises:

forming a bond between the frame/spacer and the semiconductor substrate;

forming another bond between the frame/spacer and the transparent sheet; and wherein at least one of the bonds is formed by diffusion bonding.

18. A method for simultaneously manufacturing multiple sealed micro-device packages, each package encapsulating at least one micro-device and including a transparent portion, the method comprising the following steps:

preparing, on a semiconductor substrate having a plurality of micro-devices disposed thereupon, a first frame-attachment area that circumscribes a number of the micro-devices;

preparing, on a sheet of transparent material, a second frame-attachment area;

positioning, between the semiconductor substrate and the transparent sheet, a frame/spacer including a plurality of sidewalls the sidewalls, collectively having one side substantially in register with the first frame-attachment area and an opposite side substantially in register with the second frame-attachment area;

bonding the semiconductor substrate, frame/spacer and transparent sheet together to form a multi-package assembly having a plurality of sealed cavities separated from one another by the frame/spacer sidewalls, each of the cavities containing at least one of the micro-devices positioned below the sheet; and dividing the multi-package assembly into individual packages by parting completely through the substrate, frame/spacer sidewall and transparent sheet at locations between adjacent cavities;

whereby each individual package will encapsulate at least one of the micro-devices in a sealed cavity wherein the step of bonding further comprises pressing the substrate and the sheet against the frame/spacer with sufficient force to produce a first predetermined contact pressure along a first junction region between the frame/spacer and the first frame-attachment area of the substrate and a second predetermined contact pressure along a second junction region between the frame/spacer and the second frame-attachment area of the sheet;

heating the first junction region to produce a first predetermined temperature along the first junction region;

heating the second junction region to produce a second predetermined temperature along the second junction region;

maintaining the first predetermined contact pressure and the first predetermined temperature until a diffusion bond is formed between the frame/spacer and the substrate along the first junction region; and maintaining the second predetermined contact pressure and the second predetermined temperature until a diffusion bond is formed between the frame/spacer and sheet along the second junction region.

19. A method for simultaneously manufacturing multiple sealed micro-device packages directly on an undiced semiconductor production wafer, each package encapsulating at least one micro-device and including a transparent window, the method comprising the following steps:

preparing, on an undiced semiconductor production wafer having a plurality of micro-devices disposed thereupon, a first frame-attachment area that circumscribes a number of the micro-devices;

preparing, on a sheet of transparent material, a second frame-attachment area;

positioning, between the wafer and the transparent sheet, a separate frame/spacer that is formed independently from both the semiconductor substrate and the sheet of transparent material, the frame/spacer including a plurality of sidewalls, the sidewalls collectively having one side substantially in register with the first frame-attachment area and an opposite side substantially in register with the second frame-attachment area;

bonding the wafer, frame/spacer and transparent sheet together to form a multi-package assembly having a plurality of sealed cavities separated from one another by the frame/spacer sidewalls, each of the cavities containing at least one of the micro-devices positioned below the sheet; and dividing the multi-package assembly into individual packages by parting completely through the wafer, frame/spacer sidewall and transparent sheet at locations between adjacent cavities;

whereby each individual package will encapsulate at least one of the micro-devices in a sealed cavity.

20. A method in accordance with claim 19, wherein the wafer is substantially formed of a material selected from one of silicon (Si) and gallium arsenide (GaAs).

* * * * *